US012588238B2

(12) United States Patent
More

(10) Patent No.: US 12,588,238 B2
(45) Date of Patent: Mar. 24, 2026

(54) SEMICONDUCTOR DEVICE AND MANUFACTURING METHODS THEREOF

(71) Applicant: Taiwan Semiconductor Manufacturing Company, Ltd., Hsinchu (TW)

(72) Inventor: Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 650 days.

(21) Appl. No.: 17/647,536

(22) Filed: Jan. 10, 2022

(65) Prior Publication Data

US 2023/0010146 A1 Jan. 12, 2023

Related U.S. Application Data

(60) Provisional application No. 63/220,247, filed on Jul. 9, 2021.

(51) Int. Cl.
H10D 30/62 (2025.01)
H01L 21/3065 (2006.01)
(Continued)

(52) U.S. Cl.
CPC ..... H10D 30/6211 (2025.01); H01L 21/3065 (2013.01); H10D 30/024 (2025.01);
(Continued)

(58) Field of Classification Search
CPC ............. H01L 29/7851; H01L 21/3065; H01L 21/823418; H01L 21/823431; H01L 21/823468; H01L 29/66795; H10D 30/6211; H10D 84/834; H10D 84/853; H10D 84/0188
See application file for complete search history.

(56) References Cited

U.S. PATENT DOCUMENTS 9,812,363 B1 * 11/2017 Liao ................... H10D 84/0151
10,312,145 B2 6/2019 Huang
(Continued)

FOREIGN PATENT DOCUMENTS

CN 108122768 A 6/2018
TW 201633541 A 9/2016
TW 201905983 A 2/2019

*Primary Examiner* — William B Partridge
*Assistant Examiner* — Felix B Andrews
(74) *Attorney, Agent, or Firm* — Harrity & Harrity, LLP

(57) ABSTRACT

Epitaxial regions may be formed in specific locations on a semiconductor wafer with specific asymmetric properties such as slope or tilt direction, slope or tilt angle, and/or other asymmetric properties. The asymmetric epitaxial regions may be formed using various plasma-based fin structure etching techniques described herein. The specific asymmetric properties may increase metal landing coverage areas in particular locations on the semiconductor wafer (e.g., that are optimized for particular locations on the semiconductor substrate) to reduce the contact resistance between the epitaxial regions and associated conductive structures that are formed to the epitaxial regions. This increases semiconductor device performance, decreases the rate and/or likelihood of defect formation, and/or increases semiconductor device yield, among other examples.

20 Claims, 37 Drawing Sheets

(51) Int. Cl.
　　*H10D 30/01*　　　　(2025.01)
　　*H10D 84/01*　　　　(2025.01)
　　*H10D 84/03*　　　　(2025.01)

(52) U.S. Cl.
　　CPC ....... *H10D 84/013* (2025.01); *H10D 84/0147*
　　　　　(2025.01); *H10D 84/0158* (2025.01); *H10D*
　　　　　　　　　　　　　　　*84/038* (2025.01)

(56)　　　　　　　　References Cited

U.S. PATENT DOCUMENTS

| | | |
|---|---|---|
| 11,056,578 B2 | 7/2021 | Lee et al. |
| 11,211,490 B2 | 12/2021 | Paak et al. |
| 2018/0138172 A1* | 5/2018 | Chen .................... H10D 84/013 |
| 2019/0148551 A1* | 5/2019 | More ................ H01L 21/02579 |
| | | 257/192 |
| 2019/0165171 A1 | 5/2019 | Huang et al. |
| 2019/0393315 A1 | 12/2019 | Noh et al. |
| 2020/0075421 A1 | 3/2020 | Wu et al. |
| 2021/0098577 A1* | 4/2021 | Cho .................. H01L 21/02532 |
| 2021/0104613 A1* | 4/2021 | Noh ................... H10D 30/6219 |
| 2022/0115375 A1* | 4/2022 | Xu .................... H10D 84/0193 |

* cited by examiner

1010 Form, in a device region of a semiconductor wafer, a plurality of fin structures in a substrate of the semiconductor wafer 1020 Form a merged epitaxial region on the plurality of fin structures

1000

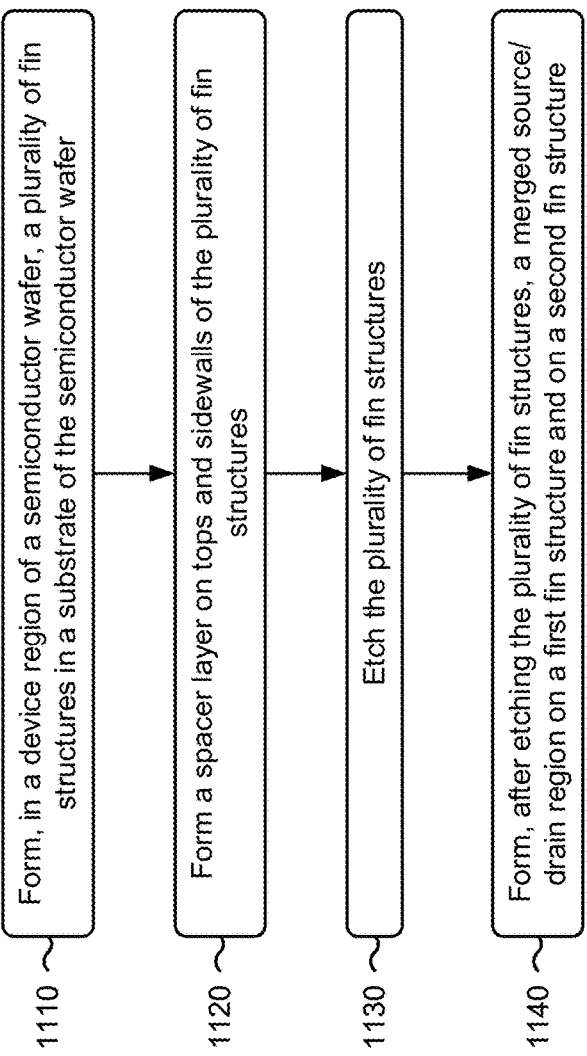

Form, in a device region of a semiconductor wafer, a plurality of fin structures in a substrate of the semiconductor wafer Form a spacer layer on tops and sidewalls of the plurality of fin structures Etch the plurality of fin structures Form, after etching the plurality of fin structures, a merged source/drain region on a first fin structure and on a second fin structure

1210 — Form, in a first quadrant of a semiconductor wafer, a first merged epitaxial region and a first non-merged epitaxial region 1220 — Form, in a second quadrant of the semiconductor wafer, a second merged epitaxial region and a second non-merged epitaxial region

SEMICONDUCTOR DEVICE AND MANUFACTURING METHODS THEREOF

CROSS-REFERENCE TO RELATED APPLICATION

This patent application claims priority to U.S. Provisional Patent Application No. 63/220,247, filed on Jul. 9, 2021, and entitled "SEMICONDUCTOR DEVICE AND MANUFAC-TURING METHODS THEREOF." The disclosure of the prior application is considered part of and is incorporated by reference into this patent application.

BACKGROUND

Fin-based transistors, such as fin field effect transistor (finFET) transistors and nanostructure transistors (e.g., nanowire transistors, nanosheet transistors, gate-all-around (GAA) transistors, multi-bridge channel transistors, nan-oribbon transistors), are three-dimensional structures that include a channel region in a fin (or a portion thereof) that extends above a semiconductor substrate as a three-dimen-sional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure tran-sistor, the gate structure wraps around a plurality of channel regions in a fin structure such that the gate structure sur-rounds each of the plurality of channel regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10-12 are flowcharts of example processes relating to forming a semiconductor device described herein.

DETAILED DESCRIPTION

Figure 1A:
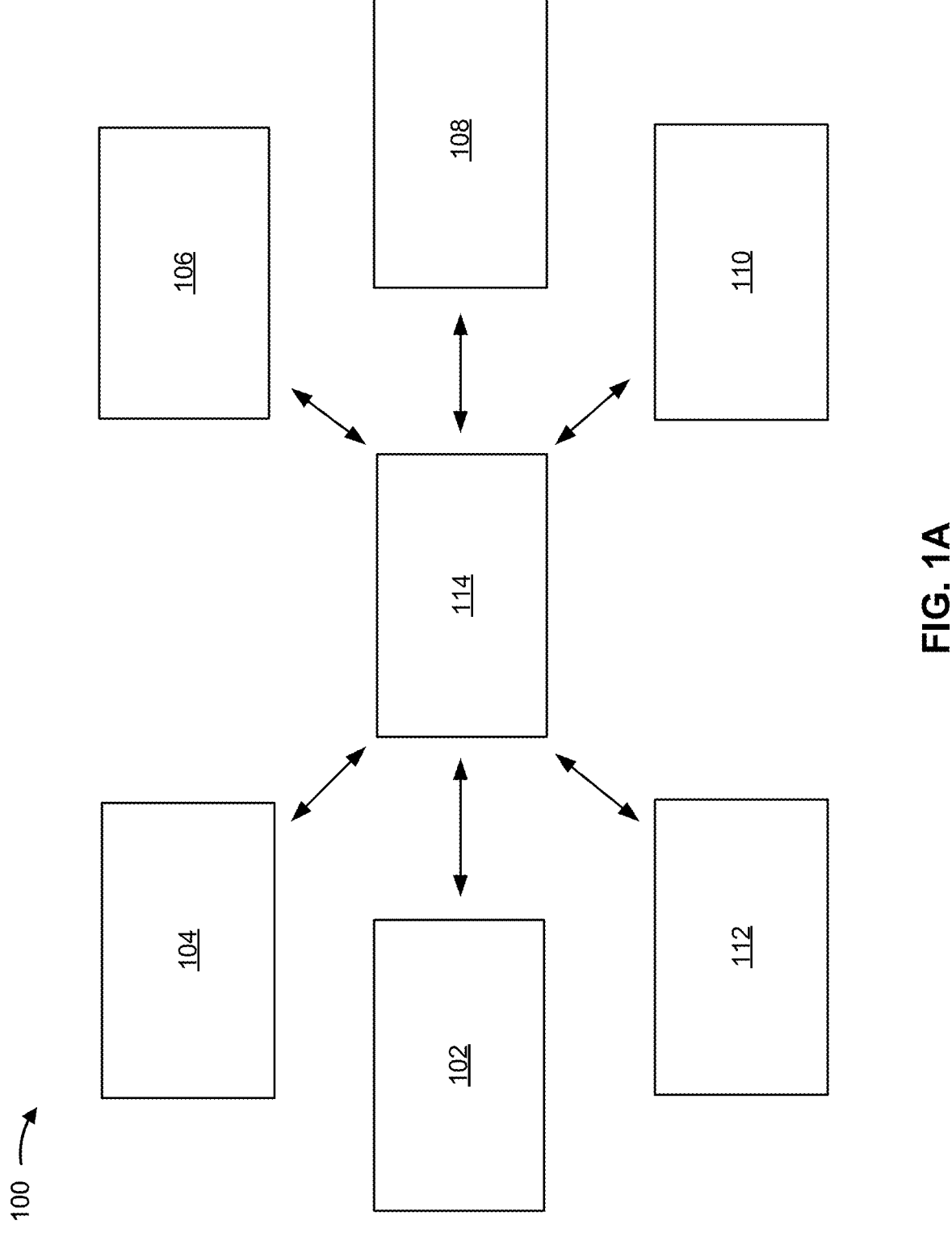
FIGS. 1A and 1B are diagrams of an example environ-ment in which systems and/or methods described herein may be implemented.

The following disclosure provides many different embodiments, or examples, for implementing different fea-tures of the provided subject matter. Specific examples of components and arrangements are described below to sim-plify the present disclosure. These are, of course, merely examples and are not intended to be limiting. For example, the formation of a first feature over or on a second feature in the description that follows may include embodiments in which the first and second features are formed in direct contact, and may also include embodiments in which addi-tional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accord-ingly.

As semiconductor manufacturing nodes advance (e.g., photolithography patterning linewidths reduce and the epi-taxial regions become smaller), achieving electrical contact to an epitaxial region in a semiconductor device becomes increasingly difficult because the available area for electrical contact to the epitaxial region by a conductive structure (e.g., a source/drain contact or MD) is reduced. The reduced area for electrical contact may result in increased contact resistance and reduced device performance. Moreover, voids and/or other types of discontinuities may result between the conductive structure and the epitaxial region due to the reduced area for electrical contact, which increases defects and reduces semiconductor device yield.

Some implementations described herein provide tech-niques and apparatuses for forming asymmetric epitaxial regions in specific locations on a semiconductor wafer. As described herein, epitaxial regions may be formed in specific locations on a semiconductor wafer with specific asymmet-ric properties such as slope or tilt direction, slope or tilt angle, and/or other asymmetric properties. The asymmetric epitaxial regions may be formed using various plasma-based fin structure etching techniques described herein. The spe-cific asymmetric properties may increase metal landing coverage areas in particular locations on the semiconductor wafer (e.g., that are optimized for particular locations on the semiconductor substrate) to reduce the contact resistance between the epitaxial regions and associated conductive structures that are formed to the epitaxial regions. This increases semiconductor device performance, decreases the rate and/or likelihood of defect formation, and/or increases semiconductor device yield, among other examples.

Figure 1B:
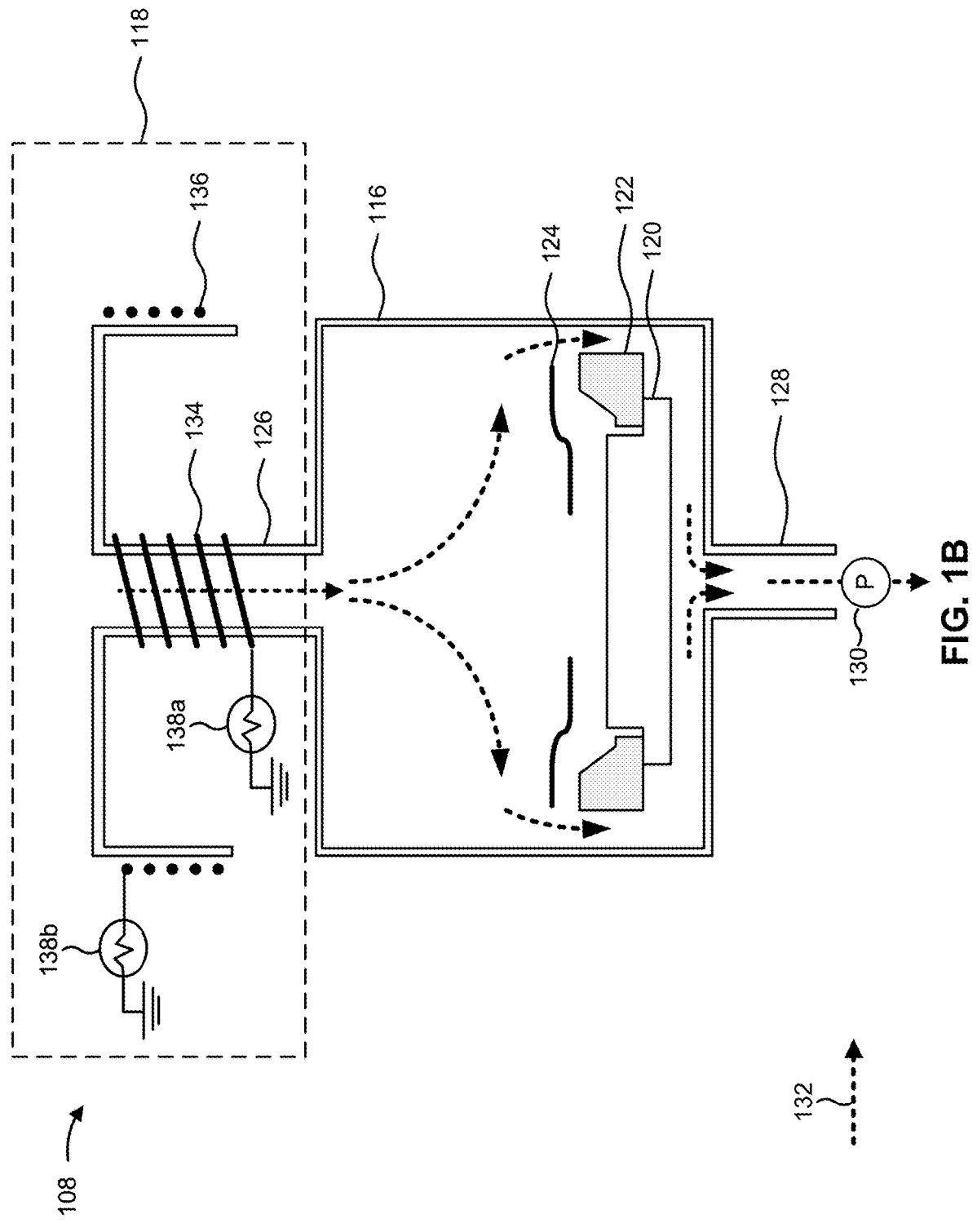

FIGS. 1A and 1B are diagrams of an example environ-ment 100 in which systems and/or methods described herein may be implemented. As shown in FIG. 1A, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the semiconductor processing environment 100 includes a plurality of wafer/die transport tools 114.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

FIG. 1B is a cross-sectional view of a plasma-based etch tool 108. The plasma-based etch tool 108 includes a type of dry etch tool that uses plasma ions to etch or remove portions of a semiconductor wafer or layers/structures formed thereon. In some implementations, the plasma-based etch tool 108 is a plasma etch tool for etching metals on a semiconductor wafer. In some implementations, the plasma-based etch tool 108 is a decoupled plasma source (DPS) tool, an inductively coupled plasma (ICP) tool, a transformer coupled plasma (TCP) tool, or another type of plasma etch tool.

As shown in FIG. 1B the plasma-based etch tool 108 includes a processing chamber 116. The processing chamber 116 includes a chamber that is capable of being hermetically sealed so that the processing chamber 116 can be pressurized (e.g., to a vacuum or a partial vacuum). In some implementations, the processing chamber 116 is sized to accommodate a particular size of wafer such as a 200 millimeter wafer. In some implementations, the processing chamber 116 is sized to accommodate various sizes of semiconductor wafers, such as a 150 millimeter semiconductor wafer, a 200 millimeter semiconductor wafer, a 300 millimeter wafer, and/or another sized semiconductor wafer. The plasma-based etch tool 108 includes a plasma supply system 118 that is configured to generate a plasma and provide or supply the plasma to the processing chamber 116.

A chuck 120 is included in the processing chamber 116. The chuck 120 is configured to support and secure a semiconductor wafer in the processing chamber 116. The chuck 120 includes an electrostatic chuck (e-chuck or ESC) or another type of chuck (e.g., a vacuum chuck) that is configured to hold and/or secure a semiconductor wafer in the processing chamber 116 during processing (e.g., plasma etching) of the semiconductor wafer. In implementations in which the chuck 120 includes an electrostatic chuck, the chuck 120 is configured to generate an electrostatic attracting force between the chuck 120 and the semiconductor wafer based on a voltage applied to the chuck 120. Moreover, a voltage may be provided to the chuck 120 from a power supply. The voltage may generate the electrostatic attracting force that secures the semiconductor wafer to the chuck 120.

The chuck 120 may be sized and shaped depending on a size and a shape of semiconductor wafer to be processed in the plasma-based etch tool 108. For example, the chuck 120 may be circular shaped and may support all or a portion of a circular shaped semiconductor wafer. In some implementations, the chuck 120 is constructed of a material or materials that are resistant to abrasion and/or corrosion caused by materials used to generate the plasma, and that can generate the attractive force between the chuck 120 and a semiconductor wafer. For example, the chuck 120 may be constructed of a metal, such as aluminum, stainless steel, or another suitable material.

A focus ring 122 is included in the processing chamber 116. The focus ring 122 (also referred to as an edge ring or a single ring) includes a ring-shaped structure that is positioned around a portion of the chuck 120. The focus ring 122 is configured to focus the plasma in the processing chamber 116 toward a semiconductor wafer on the chuck 120 by directing (or redirecting) at least a portion of the plasma toward the semiconductor wafer. In this way, the focus ring 122 may increase electrical and plasma fluid uniformity in the processing chamber 116. In some implementations, a voltage is applied to the focus ring 122 (e.g., from a power supply) so that the focus ring 122 provides the electrical and plasma uniformity. The focus ring 122 may be sized and shaped depending on a size and a shape of semiconductor wafer to be processed in the plasma-based etch tool 108. For example, the focus ring 122 may be circular shaped and may include an opening to enable the focus ring 122 to surround a semiconductor wafer on the chuck 120. In some implementations, the focus ring 122 is constructed of a material or materials that are resistant to abrasion and/or corrosion caused by materials used to generate the plasma, and that can provide the electrical and plasma uniformity for a semiconductor wafer. For example, the focus ring 122 may be constructed of a metal, such as aluminum, stainless steel, and/or another suitable material.

During a plasma operation of a semiconductor wafer in the plasma-based etch tool 108, a bias voltage may be applied to the chuck 120 such that an electric field is generated between the semiconductor wafer and the plasma in the processing chamber 116. The bias voltage may include a negative bias voltage, which results in an excess of positively charged ions in a layer of the plasma above the semiconductor wafer. This dense layer of positively charged ions is referred to as a sheath 124, which may also be referred to as a plasma sheath, an electrostatic sheath, or a Debye sheath. The bias voltage may be used to control the flow rate and direction of ions in the plasma processing chamber 116 to adjust the etching properties of the plasma.

The plasma supply system 118 may include a process gas source to provide a gas flow (e.g., argon or another type of gas flow) to the processing chamber 116. The plasma supply system 118 may provide the plasma and the gas flow to the processing chamber 116 through an inlet port 126 in a first side (e.g., a top side) of the processing chamber 116. The plasma and the gas flow are removed from the processing chamber 116 through an exhaust port 128 (or outlet port) at an opposing side (e.g., a bottom side) of the processing chamber 116. The plasma-based etch tool 108 includes a vacuum pump 130 to facilitate the generation of a flow path 132 of the plasma and the gas flow between the inlet port 126 and the exhaust port 128. For example, and as shown in the example in FIG. 1B, the flow path 132 originates at the inlet port 126, the flow path 132 expands outward in the processing chamber 116 and flows around the chuck 120 and the focus ring 122, and downward under the chuck 120 toward the exhaust port 128. The vacuum pump 130 may be further configured to control the pressure in the processing chamber 116 and to generate a vacuum (or partial vacuum) in the processing chamber 116.

As further shown in FIG. 1B, the plasma supply system 118 includes an inner plasma source 134 and an outer plasma source 136. The inner plasma source 134 and the outer plasma source 136 include independently controllable plasma sources that, in combination, are configured to control and shape the plasma in the processing chamber 116. For example, the power, voltage, and/or other parameters may be independently configurable for inner plasma source 134 and the outer plasma source 136 to provide a plasma to the processing chamber 116 such that the plasma includes a particular electric field distribution, a particular ion composition and/or distribution, and/or a particular ion bombardment direction or angle, among other examples such that the intensity of the plasma is greater in particular areas in the processing chamber 116 relative to other areas of the processing chamber 116.

The inner plasma source 134 and the outer plasma source 136 are respectively connected to radio frequency (RF)

sources 138a and 138b. The RF source 138a and the RF source 138b may be referred to as a bias RF sources in that the RF source 138a and the RF source 138b are configured to provide or supply an RF or alternating current to the inner plasma source 134 and the outer plasma source 136, respectively, to bias the inner plasma source 134 and the outer plasma source 136. The inner plasma source 134 and/or the outer plasma source 136 may be biased to increase or decrease the strength of attraction of the ions in the plasma, which may be used to increase or decrease the etch rate (or etch rate distribution) for a semiconductor wafer. The RF source 138a and the RF source 138b may each be connected to an electrical ground and may each include RF power supply or another type of device that is capable of generating and providing/supplying an RF current in a suitable frequency range such as approximately 10 MHz to approximately 30 MHz or approximately 300 MHz to approximately 300 GHz, among other examples.

To generate the plasma, the RF sources 138a and 138b may provide RF or alternating current to the inner plasma source 134 and the outer plasma source 136, respectively. The RF or alternating current may traverse through and/or along the coiled conductors of the inner plasma source 134 and the outer plasma source 136, which generates a time-varying electromagnetic field through electromagnetic induction. The time-varying electromagnetic field may create an electromotive force, which energizes a gas flow into the processing chamber 116 with electrons, thereby forming the plasma.

The number and arrangement of devices shown in FIGS. 1A and 1B are provided as one or more examples. In practice, there may be additional devices, fewer devices, different devices, or differently arranged devices than those shown in FIGS. 1A and/or 1B. Furthermore, two or more devices shown in FIGS. 1A and/or 1B may be implemented within a single device, or a single device shown in FIGS. 1A and/or 1B may be implemented as multiple, distributed devices. Additionally, or alternatively, a set of devices (e.g., one or more devices) of environment 100 may perform one or more functions described as being performed by another set of devices of environment 100.

Figure 2:
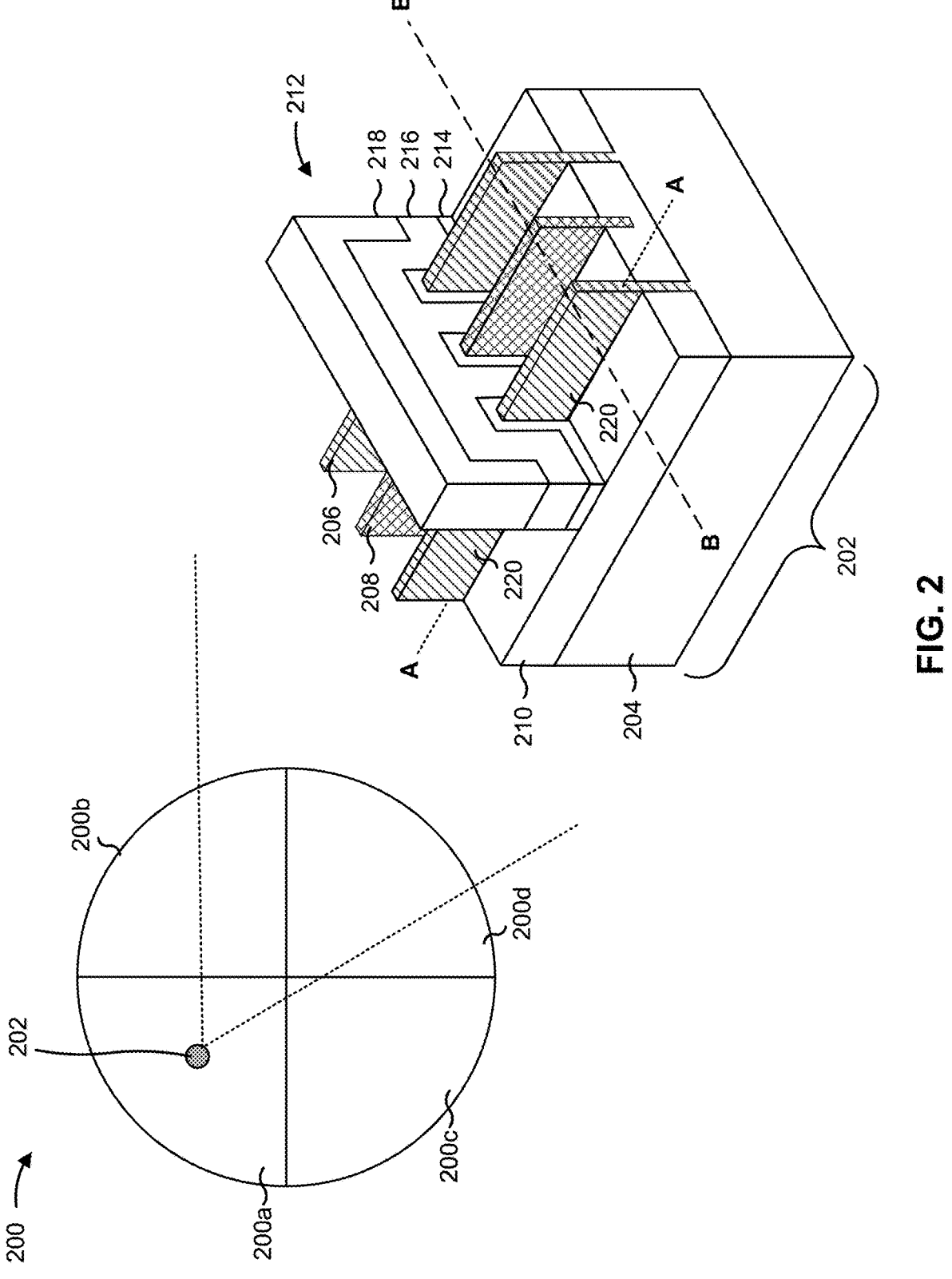
FIG. 2 is a diagram of an example semiconductor wafer and an example device region of the semiconductor wafer described herein.

FIG. 2 is a diagram of an example semiconductor wafer 200 and an example device region 202 of the semiconductor wafer 200 described herein. The semiconductor wafer 200 may include a round/circular semiconductor wafer having an approximately 200 mm diameter, an approximately 300 mm diameter, or another diameter, such as 450 mm, among other examples. The semiconductor wafer 200 may alternatively be any polygonal, square, rectangular, curved, or otherwise non-circular workpiece, such as a polygonal substrate.

The semiconductor wafer 200 may be logically divided or separated into a plurality of quadrants, including a quadrant 200a, a quadrant 200b, a quadrant 200c, and a quadrant 200d. Each quadrant includes a portion of the surface area of the top surface of the semiconductor wafer 200. Moreover, each quadrant extends between an approximate center of the semiconductor wafer 200 and an edge (e.g., an outer edge) of the semiconductor wafer 200. In other implementations, the semiconductor wafer 200 is divided or separated into other configurations of subsets.

One or more of the quadrants of the semiconductor wafer 200 may include one or more device regions 202. The example device region 202 illustrated in FIG. 2 is located in the quadrant 200a. The device region 202 may include or may be included in one or more semiconductor devices, integrated circuits, system on chips (SoCs), and/or other semiconductor-based electronic devices. The semiconductor devices may include, for example, memory devices, processors, logic devices, diodes, semiconductor lasers, and/or ring oscillators (ROs), among other examples. A ring oscillator includes a plurality of logic devices (e.g., NOT gates) and may be included on the semiconductor wafer 200, for example, for testing at various stages of manufacturing of other semiconductor devices on the semiconductor wafer 200.

A semiconductor device in the device region 202 may include one or more transistors or other devices. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region.

The device region 202 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate.

Fin structures 206 are included above (and/or extend above) the substrate 204 for the device region 202. A fin structure 206 may provide an active region where one or more devices (e.g., fin-based transistors) are formed, and may therefore be referred to as active fin structures. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back.

In some implementations, hybrid fin structures 208 are included between the fin structures 206 in an alternating arrangement. The hybrid fin structures 208 may also be referred to as h-fins, dummy fins, and/or non-active fins, among other examples. A hybrid fin structure 208 includes a fin structure that extends in the first direction approximately parallel to the fin structures 206. In some implementations, a hybrid fin structure 208 is included between two fin structures 206 and extends approximately the same length as the two fin structures 206.

A hybrid fin structure 208 is configured to provide electrical isolation between one or more structures and/or components included in the device region 202. In some implementations, a hybrid fin structure 208 is configured to provide electrical isolation between two or more fin structures 206 (e.g., two or more active fin structures). In some implementations, a hybrid fin structure 208 is configured to provide electrical isolation between two or more source/drain regions in the device region 202. In some implementations, a hybrid fin structure 208 is configured to provide electrical isolation between two or more gates structures or two or more portions of a gate structure. In some implementations, a hybrid fin structure 208 is configured to provide electrical isolation between a source/drain region and a gate structure.

A hybrid fin structure 208 described herein includes a plurality of types of dielectric materials. A hybrid fin structure 208 may include a combination of one or more low dielectric constant (low-k) dielectric materials (e.g., a silicon oxide ($SiO_x$) and/or a silicon nitride ($Si_xN_y$), among other examples) and a one or more high dielectric constant (high-k) dielectric materials (e.g., a hafnium oxide ($HfO_x$) and/or other high-k dielectric material).

Shallow trench isolation (STI) regions 210 are included above the substrate 204 and between the fin structures 206 and the hybrid fin structures 208. The STI regions 210 may be formed by etching back an insulating layer formed on the fin structures 206 and on the substrate 204. However, other fabrication techniques for the STI regions 210 may be used. The STI regions 210 may electrically isolate adjacent active areas in the fin structures 206 and/or adjacent portions of the fin structures 206 and the hybrid fin structures 208. The STI regions 210 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 210 may include a multi-layer structure, for example, having one or more liner layers.

A dummy gate structure 212 (or a plurality of dummy gate structures 212) is included in the device region 202 over the fin structures 206 (e.g., approximately perpendicular to the fin structures 206). The dummy gate structure 212 engages the fin structures 206 on three or more sides of the fin structures 206. Moreover, the dummy gate structure 212 may be included over the hybrid fin structures 208 and may engage the hybrid fin structures 208 on three or more sides of the hybrid fin structures 208. In the example depicted in FIG. 2, the dummy gate structure 212 includes a gate dielectric layer 214, a gate electrode layer 216, and a hard mask layer 218. In some implementations, the dummy gate structure 212 further includes a capping layer, one or more spacer layers, and/or another suitable layer. The various layers of the dummy gate structure 212 may be formed by suitable deposition techniques and patterned by suitable photolithography and etching techniques.

The term "dummy," as described herein, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. Accordingly, the configuration of the device region 202 illustrated in FIG. 2 may include an intermediate configuration, and additional semiconductor processing operations may be performed for the device region 202 to further process the device region 202.

The gate dielectric layer 214 may include a dielectric oxide layer. The dielectric oxide layer may be formed by chemical oxidation, thermal oxidation, ALD, CVD, and/or other suitable methods. The gate electrode layer 216 may include a poly-silicon material or another suitable material. The gate electrode layer 216 may be formed by suitable deposition processes such as LPCVD or PECVD, among other examples. The hard mask layer 218 may include any material suitable to pattern the gate electrode layer 216 with particular features/dimensions on the substrate 204.

In some implementations, the various layers of the dummy gate structure 212 are first deposited as blanket layers. Then, the blanket layers are patterned through a process including photolithography and etching processes, removing portions of the blanket layers and keeping the remaining portions over the STI regions 210, over the fin structures 206, and/or over the hybrid fin structures 208 to form the dummy gate structure 212.

Source/drain areas 220 are disposed in opposing regions of the fin structures 206 (e.g., in opposing regions of the active fin structures) with respect to the dummy gate structure 212. The source/drain areas 220 include areas in the device region 202 in which source/drain regions are to be formed in one or more epitaxial growth operations, and therefore the source/drain regions may be referred to as epitaxial regions. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the source/drain regions by epitaxial growth (e.g., neighboring source/drain regions, as opposed to on opposing sides of the dummy gate structure 212, being coalesced), two functional transistors may be implemented. Coalesced neighboring source/drain regions are referred to herein as merged epitaxial regions and merged source/drain regions. Other configurations in other examples may implement other numbers of functional transistors.

FIG. 2 further illustrates reference cross-sections that are used in later figures, including FIGS. 3A-7D. FIGS. 3A-7D are schematic cross-sectional views of various portions of the device region 202 and/or another device region of the semiconductor wafer 200 illustrated in FIG. 2, and correspond to various processing stages of forming fin-based transistors in the device region 202 and/or another device region of the semiconductor wafer 200. Cross-section A-A is in a plane along a channel in a fin structure 206 between opposing source/drain areas 220. Cross-section B-B is in a plane perpendicular to cross-section A-A, and is across a plurality of fin structures 206 and across a plurality of hybrid fin structures 208 in a plurality of source/drain areas 220. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

FIGS. 3A-3H are diagrams of an example implementation 300 described herein. The example implementation 300 includes an example of forming fin structures 206 and hybrid fin structures 208 for transistors in the device region 202 (and/or another device region) of the semiconductor wafer 200. FIGS. 3A-3H are illustrated from the perspective of the cross-sectional plane B-B in FIG. 2 for the device region 202.

Figure 3A:
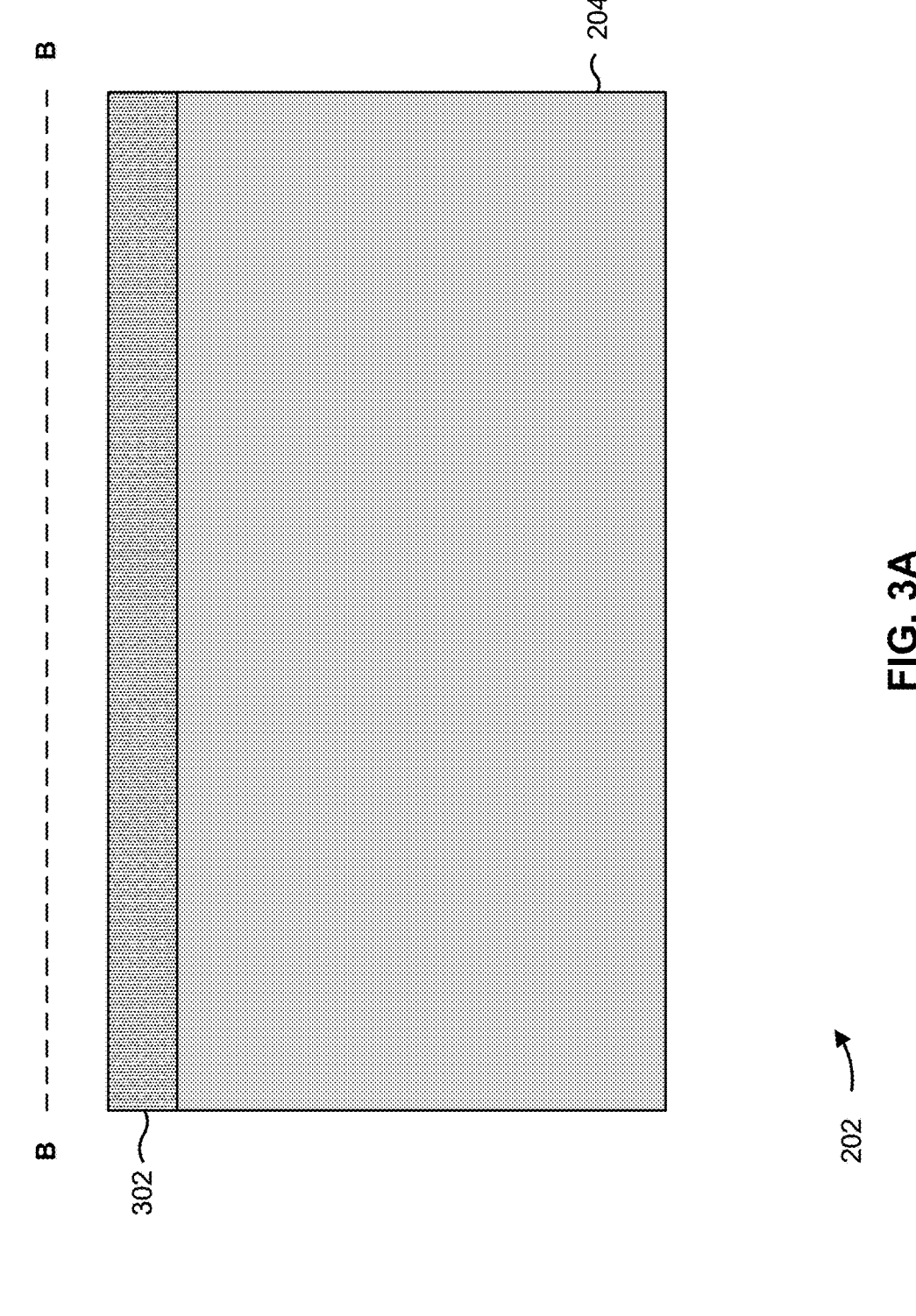
FIGS. 3A-3H and 4A-4K are diagrams of example imple-mentations described herein.

Turning to FIG. 3A, the example implementation 300 includes semiconductor processing operations relating to the substrate 204 in and/or on which transistors are formed in the device region 202. The deposition tool 102 forms a hard mask layer 302 on the substrate 204 using a CVD technique, a PVD technique, a spin-coating technique, and/or another deposition technique described above in connection with FIG. 1. The hard mask layer 302 includes a material having an etch selectivity to particular types of etchants that is different relative to the material of the substrate 204 to facilitate etching of the substrate 204. For example, the hard mask layer 302 may include a silicon nitride ($Si_xN_y$) or another suitable material, and the substrate 204 may include a silicon oxide ($SiO_x$) or another suitable material.

Figure 3B:
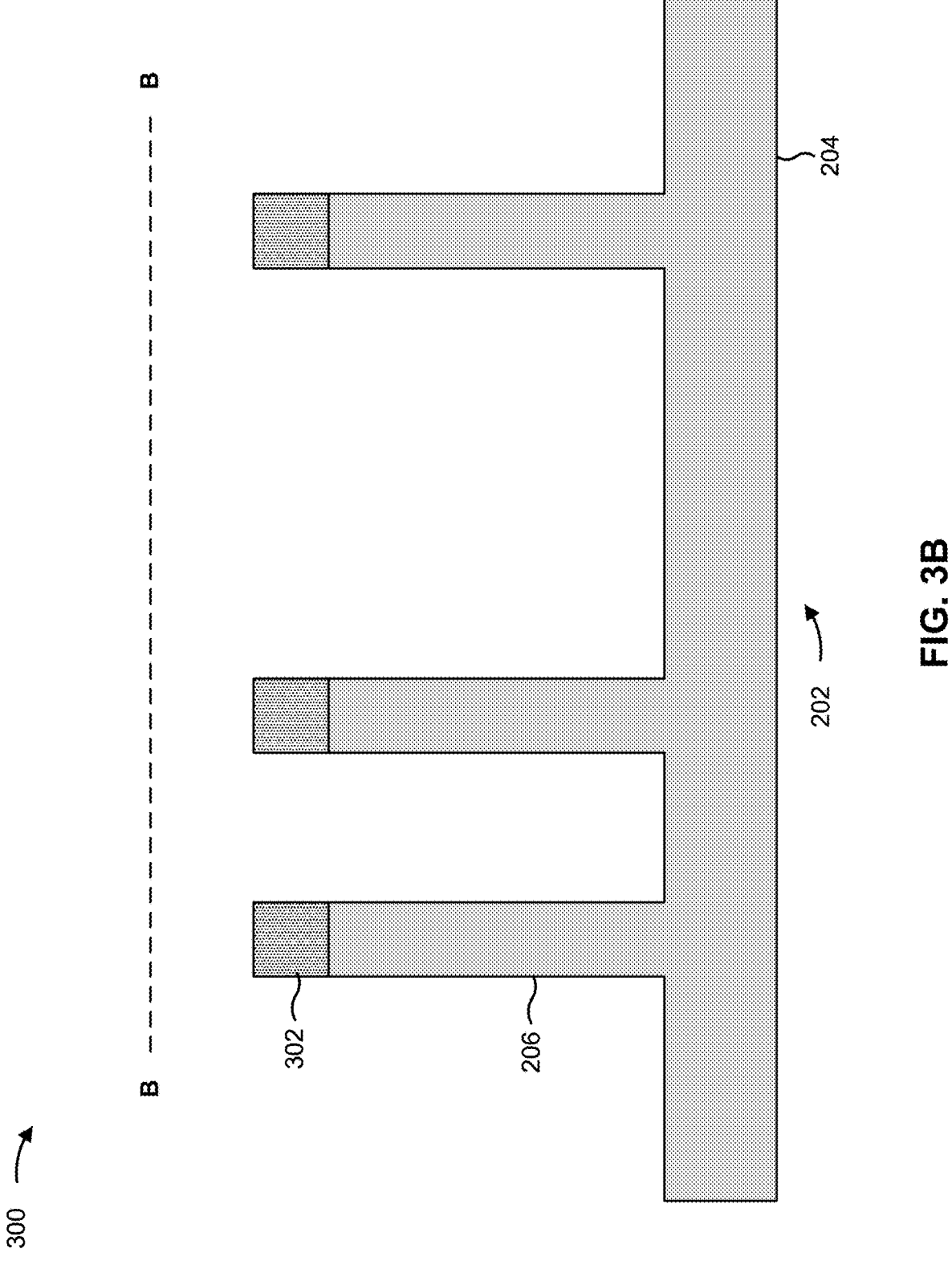

As shown in FIG. 3B, the fin structures 206 are formed in the substrate 204 in the device region 202. In some implementations, a pattern in a photoresist layer is used to form the fin structures 206. In these implementations, the deposition tool 102 forms the photoresist layer on the hard mask layer 302. The exposure tool 104 exposes the photoresist layer to a radiation source to pattern the photoresist layer. The developer tool 106 develops and removes portions of the photoresist layer to expose the pattern. The etch tool 108 etches into the hard mask layer 302 to form a pattern in the hard mask layer 302. The substrate 204 is then etched based on the pattern in the hard mask layer 302 to form the fin structures 206 in a portion of the substrate 204. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 3C:
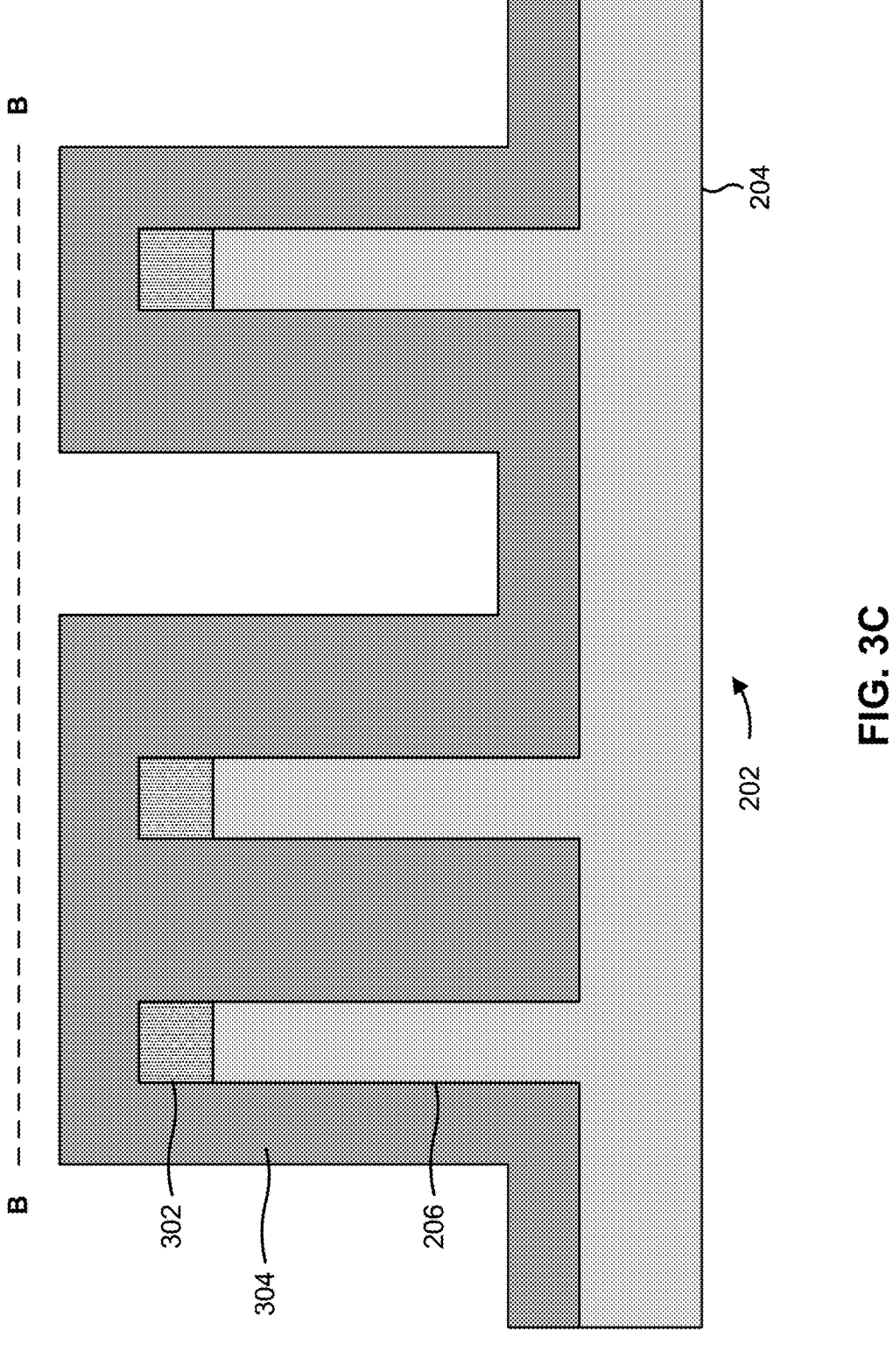

As shown in FIG. 3C, a dielectric layer 304 is formed over and/or on substrate 204 and over and/or on the fin structures 206. The deposition tool 102 deposits the dielectric layer 304 using a CVD technique, a PVD technique, an ALD technique, or another type of deposition technique described above in connection with FIG. 1. In some implementations, the dielectric layer 304 is conformally deposited on the fin structures 206 such that the dielectric layer 304 is formed on the tops and sidewalls of the fin structures 206.

Figure 3D:
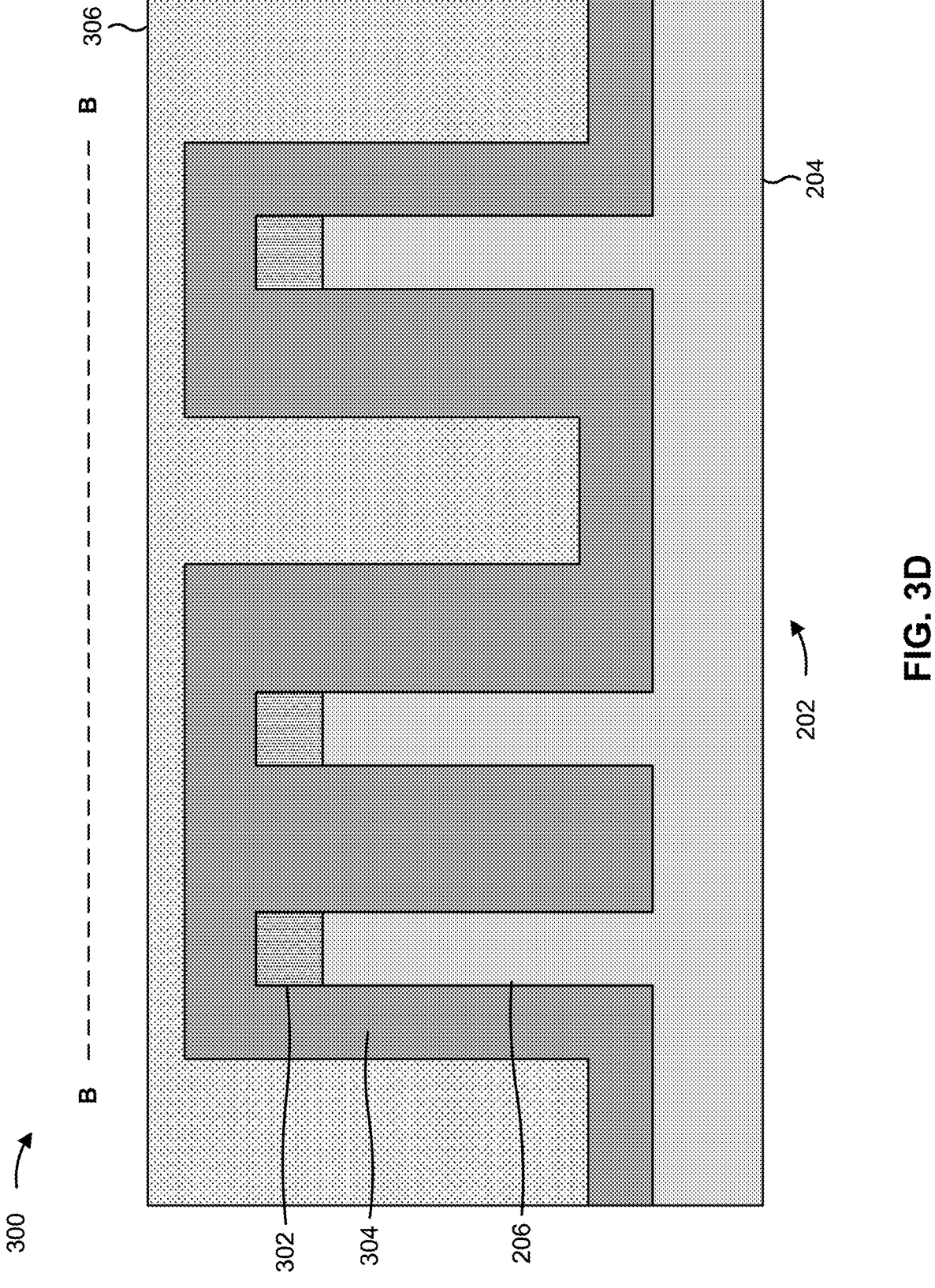

As shown in FIG. 3D, a low-k dielectric material layer 306 is formed in recesses in the dielectric layer 304 between the fin structures 206. The deposition tool 102 deposits the low-k dielectric material layer 306 using a CVD technique, a PVD technique, an ALD technique, or another type of deposition technique described above in connection with FIG. 1. In some implementations, the low-k dielectric material layer 306 is formed in a dielectric merge operation in which separate portions of the low-k dielectric material layer 306 are merged together.

Figure 3E:
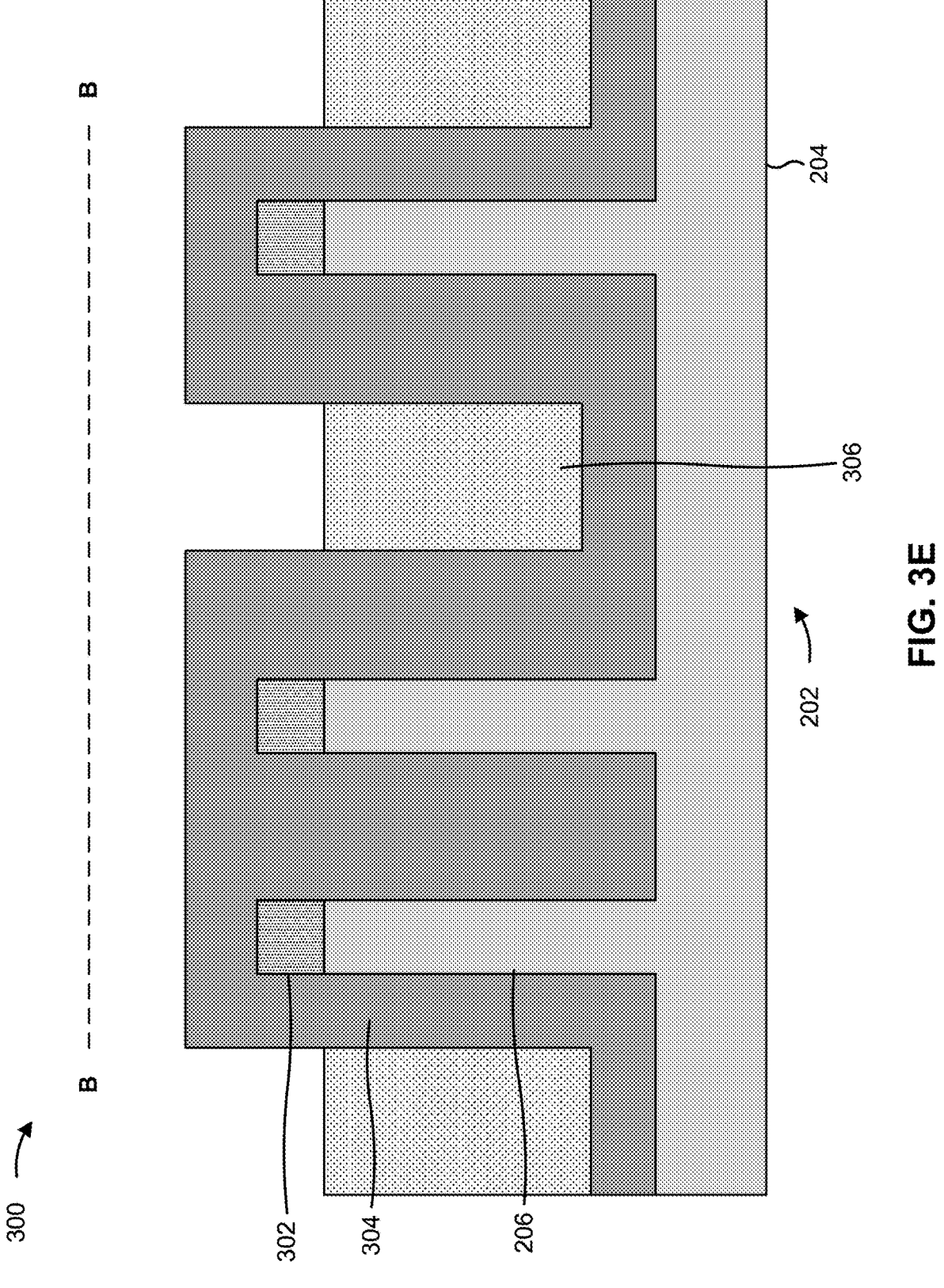

As shown in FIG. 3E, the low-k dielectric material layer 306 is etched back such that a height of a top surface of the low-k dielectric material layer 306 is lesser relative to a height of a top surface of the dielectric layer 304. The etch tool 108 etches the low-k dielectric material layer 306 using a plasma etch technique, a wet chemical etch technique, and/or another type of etch technique. In some implementations, the low-k dielectric material layer 306 is etched back such that a height of a top surface of the low-k dielectric material layer 306 is greater relative to a height of a top surface of the hard mask layer 302, and is greater relative to a height of a top surface of the fin structures 206. In some implementations, the low-k dielectric material layer 306 is etched back such that a height of a top surface of the low-k dielectric material layer 306 is lesser relative to the height of a top surface of the hard mask layer 302, and is greater relative to the height of a top surface of the fin structures 206. In some implementations, the low-k dielectric material layer 306 is etched back such that a height of a top surface of the low-k dielectric material layer 306 is lesser relative to the height of a top surface of the hard mask layer 302, and is lesser relative to the height of a top surface of the fin structures 206.

Figure 3F:
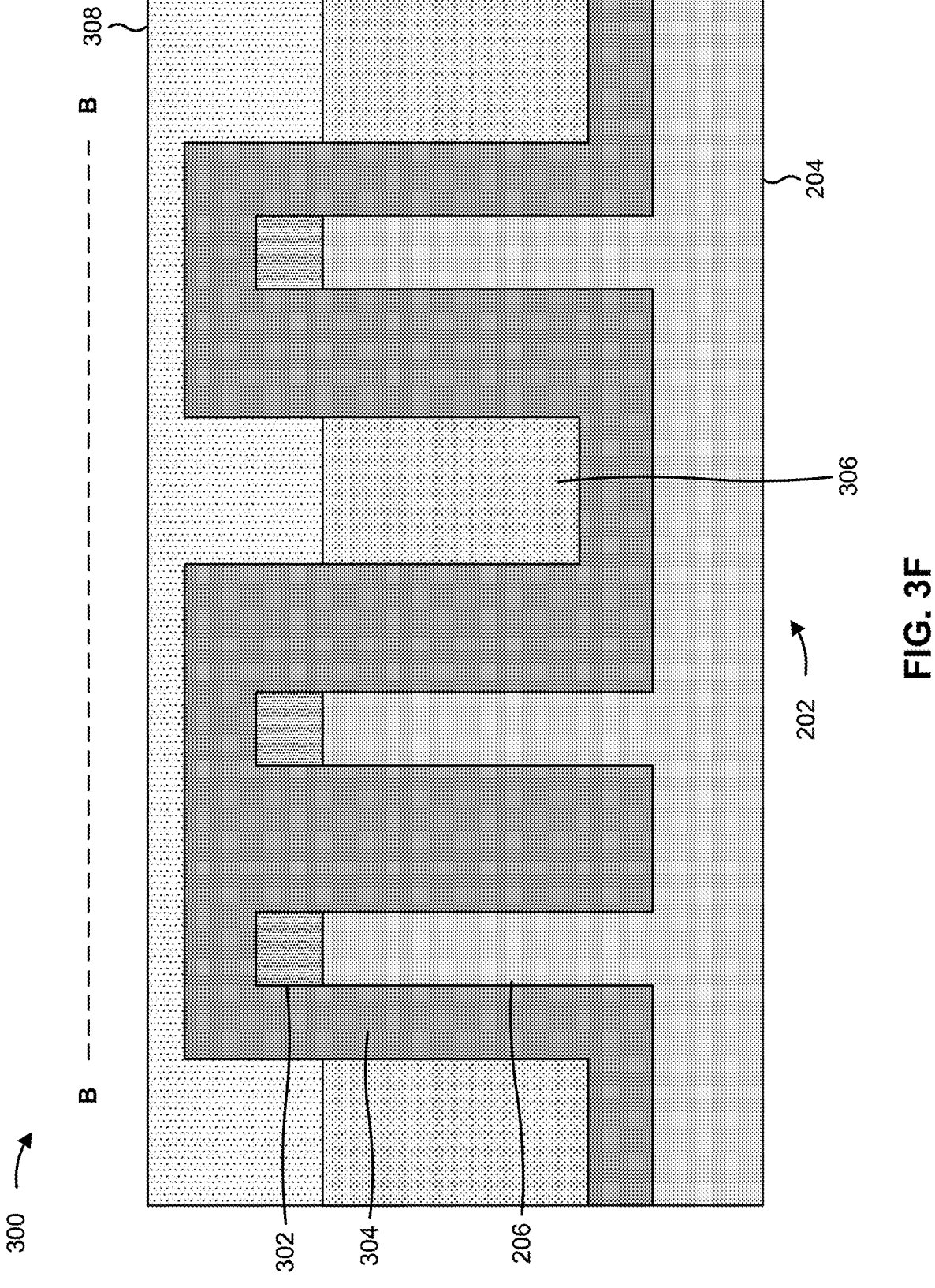

As shown in FIG. 3F, a high-k dielectric material layer 308 is formed in recesses in the dielectric layer 304 between the fin structures 206. Moreover, the high-k dielectric material layer 308 is formed on the low-k dielectric material layer 306. The deposition tool 102 deposits the high-k dielectric material layer 308 using a CVD technique, a PVD technique, an ALD technique, or another type of deposition technique described above in connection with FIG. 1. In some implementations, the high-k dielectric material layer 308 is formed in a dielectric merge operation in which separate portions of the high-k dielectric material layer 308 are merged together.

Figure 3G:
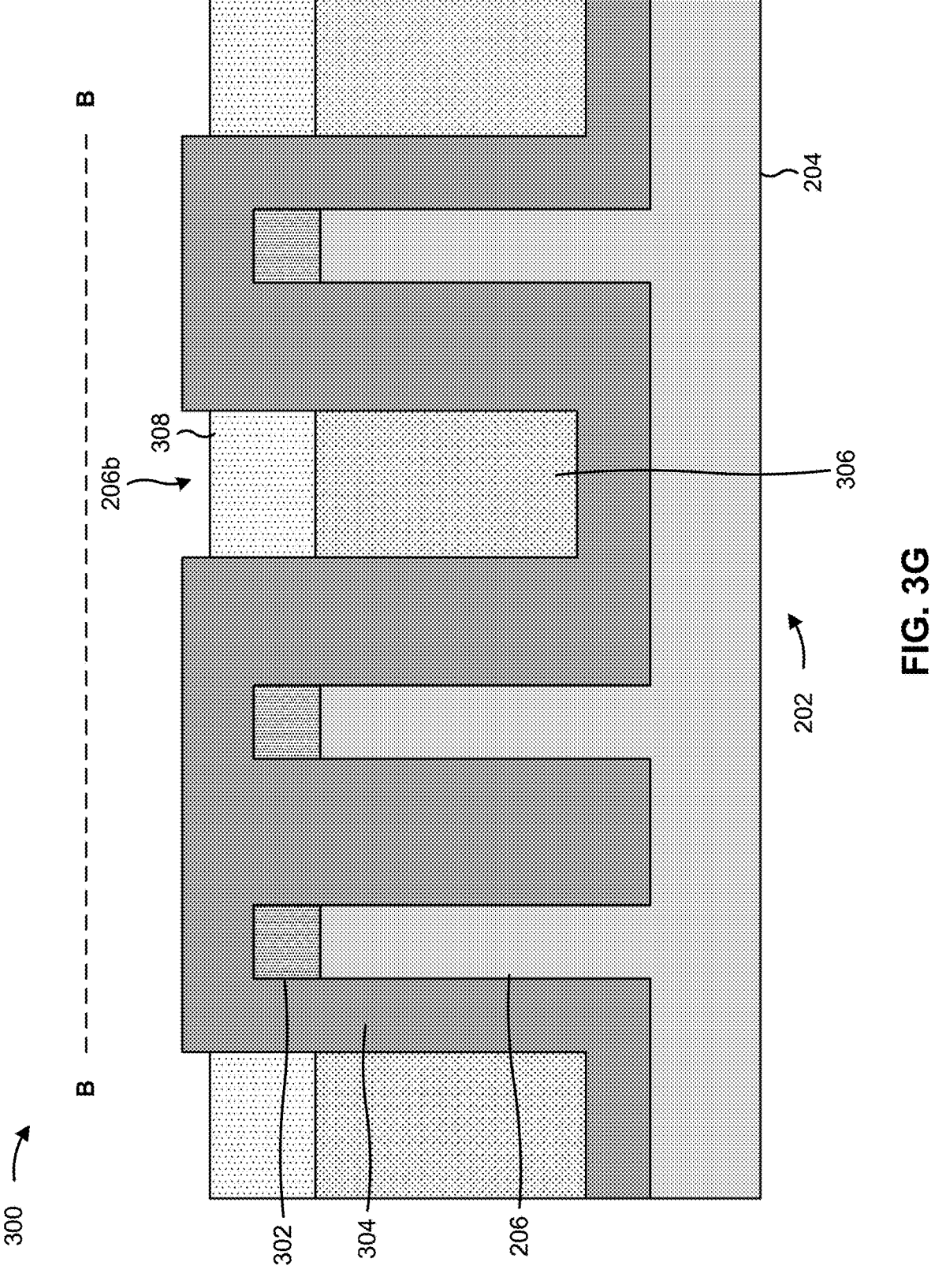

As shown in FIG. 3G, the high-k dielectric material layer 308 is etched to form the hybrid fin structures 208. The hybrid fin structures 208 each include a portion of the low-k dielectric material layer 306 and a portion of the high-k dielectric material layer 308. The high-k dielectric material layer 308 is etched such that a height of a top surface of the high-k dielectric material layer 308 is lesser relative to a height of a top surface of the dielectric layer 304. The etch tool 108 etches the high-k dielectric material layer 308 using a plasma etch technique, a wet chemical etch technique, and/or another type of etch technique.

In some implementations, the high-k dielectric material layer 308 is etched back such that a height of a top surface of the high-k dielectric material layer 308 is greater relative to a height of a top surface of the hard mask layer 302, and is greater relative to a height of a top surface of the fin structures 206. In some implementations, the high-k dielectric material layer 308 is etched back such that a height of a top surface of the high-k dielectric material layer 308 is lesser relative to the height of a top surface of the hard mask layer 302, and is greater relative to the height of a top surface of the fin structures 206. In some implementations, the high-k dielectric material layer 308 is etched back such that a height of a top surface of the high-k dielectric material layer 308 is lesser relative to the height of a top surface of the hard mask layer 302, and is lesser relative to the height of a top surface of the fin structures 206.

Figure 3H:
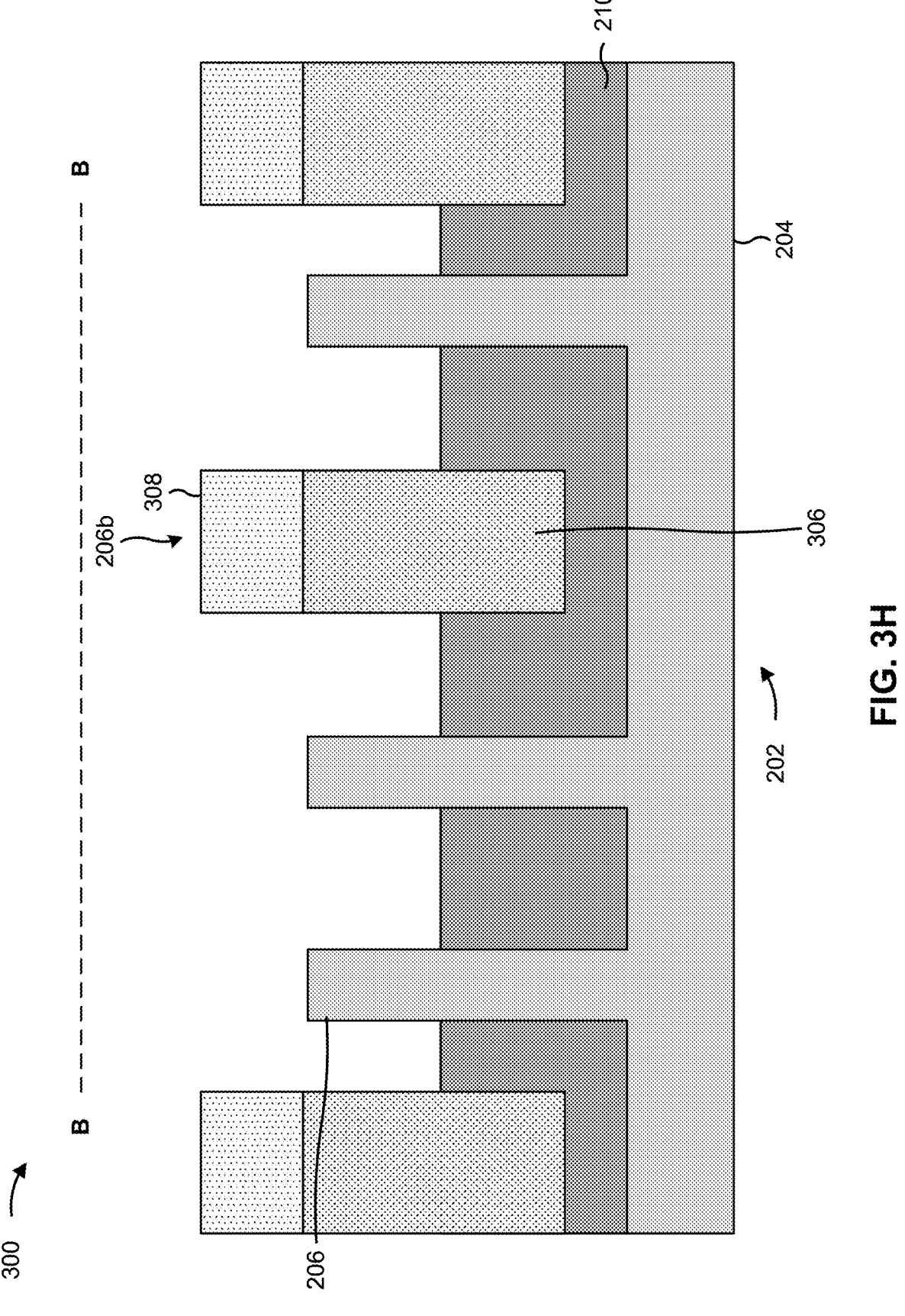

As shown in FIG. 3H, the dielectric layer 304 is etched to form the STI regions 210 between adjacent fin structures 206 and/or between adjacent pairs of a fin structure 206 and a hybrid fin structure 208. In this way, portions of the fin structures 206 are exposed so that the epitaxial regions (or source/drain regions) can be formed on the exposed portion of the fin structures 206 above the STI regions 210.

In some implementations, a pattern in a photoresist layer is used to etch the dielectric layer 304 to form the STI regions 210. In these implementations, the deposition tool 102 forms the photoresist layer on the dielectric layer 304 and on the high-k dielectric material layer 308. The exposure tool 104 exposes the photoresist layer to a radiation source to pattern the photoresist layer. The developer tool 106 develops and removes portions of the photoresist layer to expose the pattern. The etch tool 108 etches the dielectric layer 304 based on the pattern to form the STI regions 210.

In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the STI regions 210 based on a pattern. In some implementations, the dielectric layer 304 is etched based on the etch selectivity between the material of the dielectric layer 304 and the material of the high-k dielectric material layer 308 (e.g., without a hard mask or a photoresist layer on the high-k dielectric material layer 308).

As indicated above, FIGS. 3A-3H are provided as an example. Other examples may differ from what is described with regard to FIGS. 3A-3H.

FIGS. 4A-4K are diagrams of an example implementation 400 described herein. The example implementation 400 includes an example of forming asymmetric epitaxial regions (or asymmetric source/drain regions) in the source/drain areas 220 of the device region 202 (and/or in another device region) of the semiconductor wafer 200. FIGS. 4A-4K are illustrated from one or more perspectives illustrated in FIG. 2, including the perspective of the cross-sectional plane A-A in FIG. 2 for the device region 202 and the perspective of the cross-sectional plate B-B in FIG. 2 for the device region 202. In some implementations, the operations described in connection with the example implementation 400 are performed after the fin formation process described in connection with FIGS. 3A-3D.

Figure 4A:
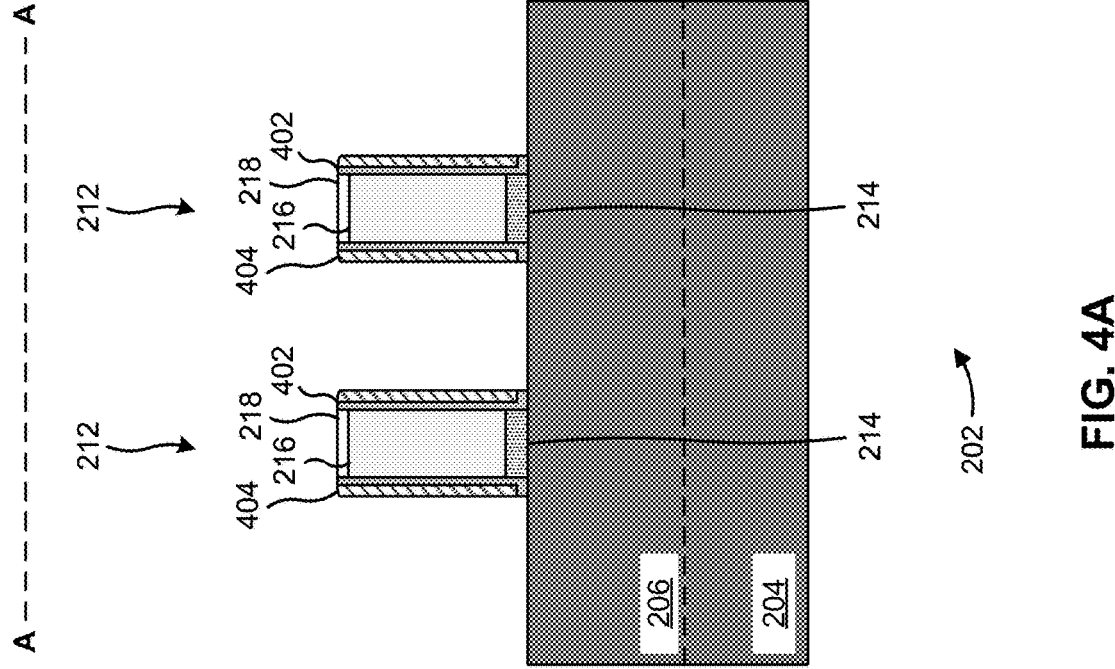

As shown in FIG. 4A, the dummy gate structures 212 are formed in the device region 202. The dummy gate structures 212 are formed and included over the fin structures 206, and around the sides of the fin structures 206 such that the dummy gate structures 212 surround the fin structure 206 on at least three sides of the fin structure 206. Similarly, the dummy gate structures 212 are formed and included over the hybrid fin structures 208, and around the sides of the hybrid fin structures 208 such that the dummy gate structures 212 surround the hybrid fin structures 208 on at least three sides of the hybrid fin structures 208.

The dummy gate structures 212 are formed as placeholders for the actual gate structures (e.g., replacement high-k gate structures or metal gate structures) that are to be formed for the transistors included in the device region 202. The dummy gate structures 212 may be formed as part of a replacement gate process, which enables other layers and/or structures to be formed prior to formation of the replacement gate structures.

The dummy gate structures 212 include gate dielectric layers 214, gate electrode layers 216, and hard mask layers 218. The gate dielectric layers 214 may each include dielectric oxide layers. As an example, the gate dielectric layers 214 may each be formed (e.g., by the deposition tool 102) by chemical oxidation, thermal oxidation, ALD, CVD, and/or one or more other suitable methods. The gate electrode layers 216 may each include a poly-silicon layer or one or more other suitable layers. For example, the gate electrode layers 216 may be formed (e.g., by the deposition tool 102) by suitable deposition processes such as LPCVD or PECVD, among other examples. The hard mask layers 218 may each include any material suitable to pattern the gate electrode layers 216 with particular dimensions and/or attributes. Examples include silicon nitride, silicon oxynitride, silicon carbon nitride, or a combination thereof, among other examples. The hard mask layers 218 may be deposited (e.g., by the deposition tool 102) by CVD, PVD, ALD, or another deposition technique.

As further shown in FIG. 4A, seal spacer layers 402 are included on the sidewalls of the dummy gate structures 212. The seal spacer layers 402 may be conformally deposited (e.g., by the deposition tool 102) and may include a silicon oxycarbide (SiOC), a nitrogen free SiOC, or another suitable material. The seal spacer layers 402 may be formed using an ALD operation in which various types of precursor gasses including silicon (Si) and carbon (C) are sequentially supplied in a plurality of alternating cycles to form the seal spacer layers 402, among other example deposition techniques.

As further shown in FIG. 4A, bulk spacer layers 404 may be formed on the seal spacer layers 402. The bulk spacer layers 404 may be formed of similar materials as the seal spacer layers 402. However, the bulk spacer layers 404 may be formed without plasma surface treatment that is used for the seal spacer layers 402. Moreover, the bulk spacer layers 404 may be formed to a greater thickness relative to the thickness of the seal spacer layers 402.

In some implementations, the seal spacer layers 402 and the bulk spacer layers 404 are conformally deposited (e.g., by the deposition tool 102) on the dummy gate structures 212, and on the fin structures 206. The seal spacer layers 402 and the bulk spacer layers 404 are then patterned (e.g., by the deposition tool 102, the exposure tool 104, and the developer tool 106) and etched (e.g., by the etch tool 108) to remove the seal spacer layers 402 and the bulk spacer layers 404 from the tops of the dummy gate structures 212, from the fin structures 206, and from the hybrid fin structures 208.

Figure 4B:
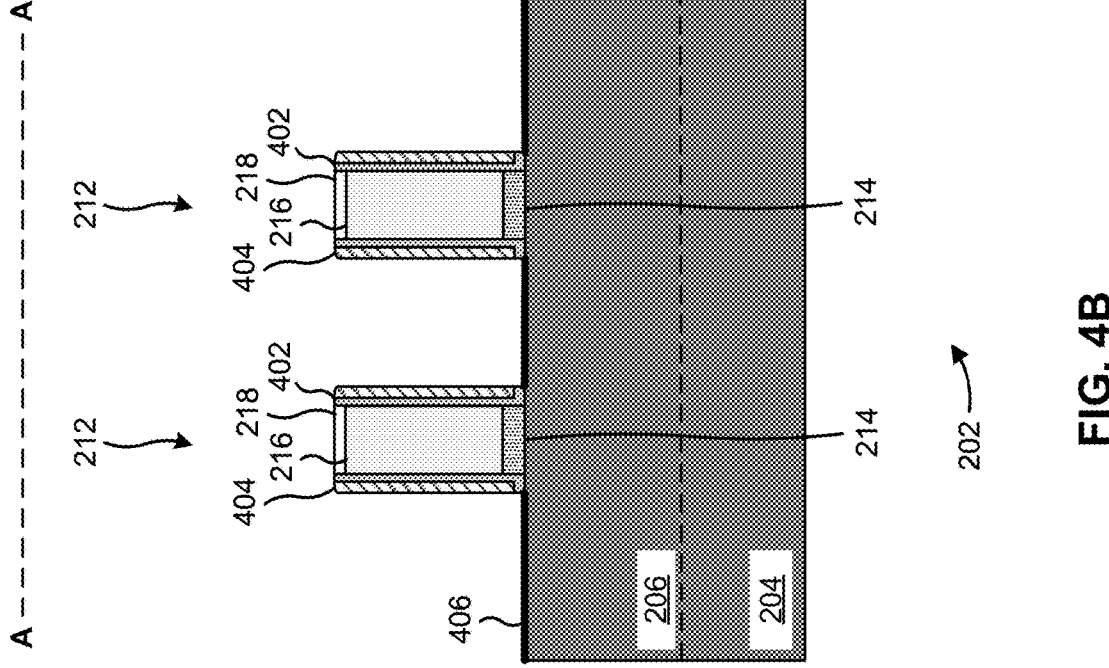
Figure 4C:
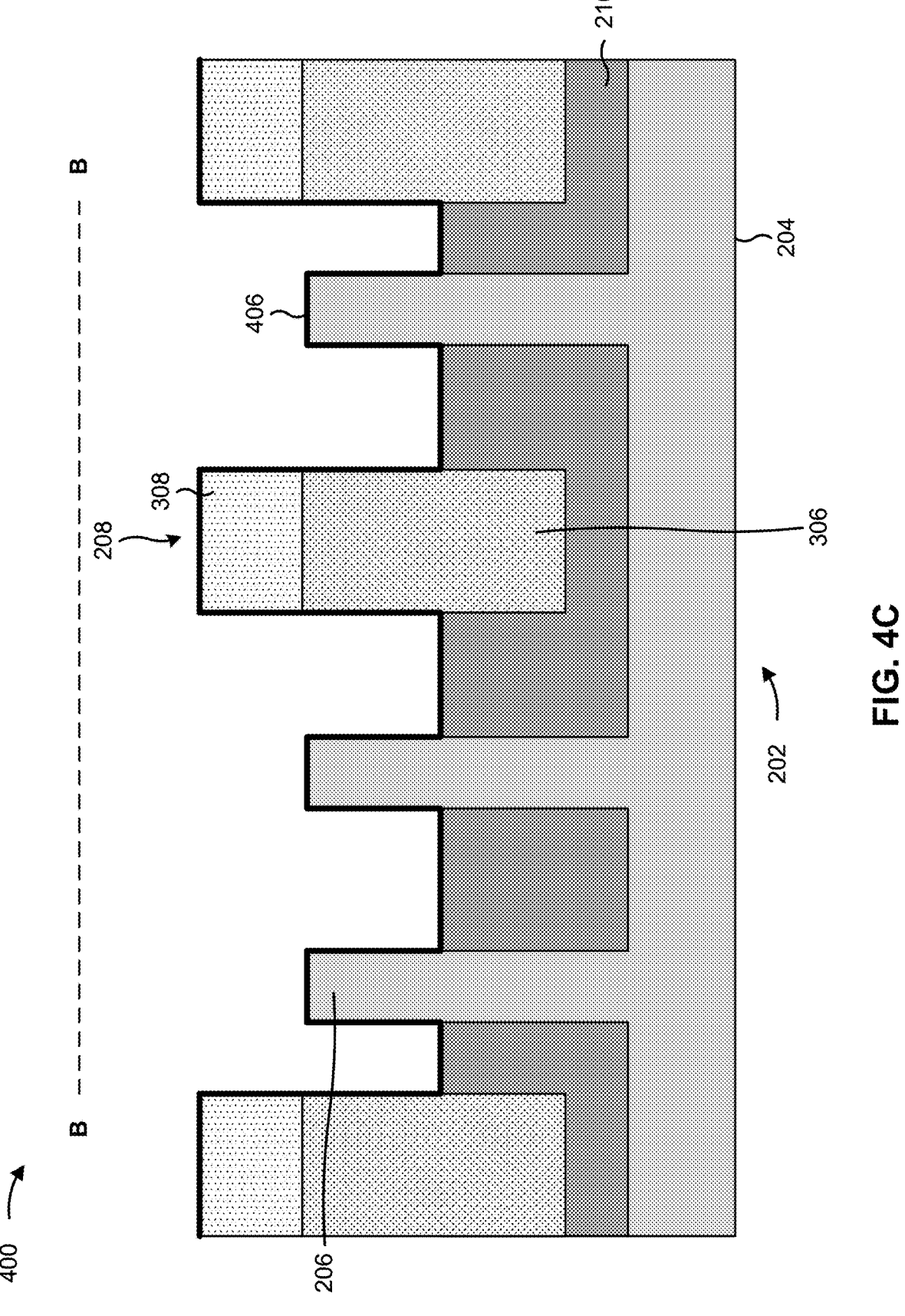

As shown in FIGS. 4B and 4C, a spacer layer 406 is formed on the fin structures 206, on the hybrid fin structures 208, and on the STI regions 210. The spacer layer 406 includes a silicon oxycarbide (SiOC), a nitrogen free SiOC, a silicon nitride ($Si_xN_y$), and/or another suitable material. In some implementations, the spacer layer 406 includes a plurality of spacer layers. In some implementations, the spacer layer 406 and one or more of the seal spacer layers 402 and/or the bulk spacer layers 404 are the same spacer layer(s). The deposition tool 102 deposits the spacer layer 406 using a CVD technique, a PVD technique, an ALD technique, or another type of deposition technique described above in connection with FIG. 1. As shown in FIGS. 4B and 4C, the spacer layer 406 is conformally deposited on the top surfaces and the sidewalls of the fin structures 206, on the top surfaces and the sidewalls of the hybrid fin structures 208, and on the top surfaces of the STI regions 210.

Figure 4D:
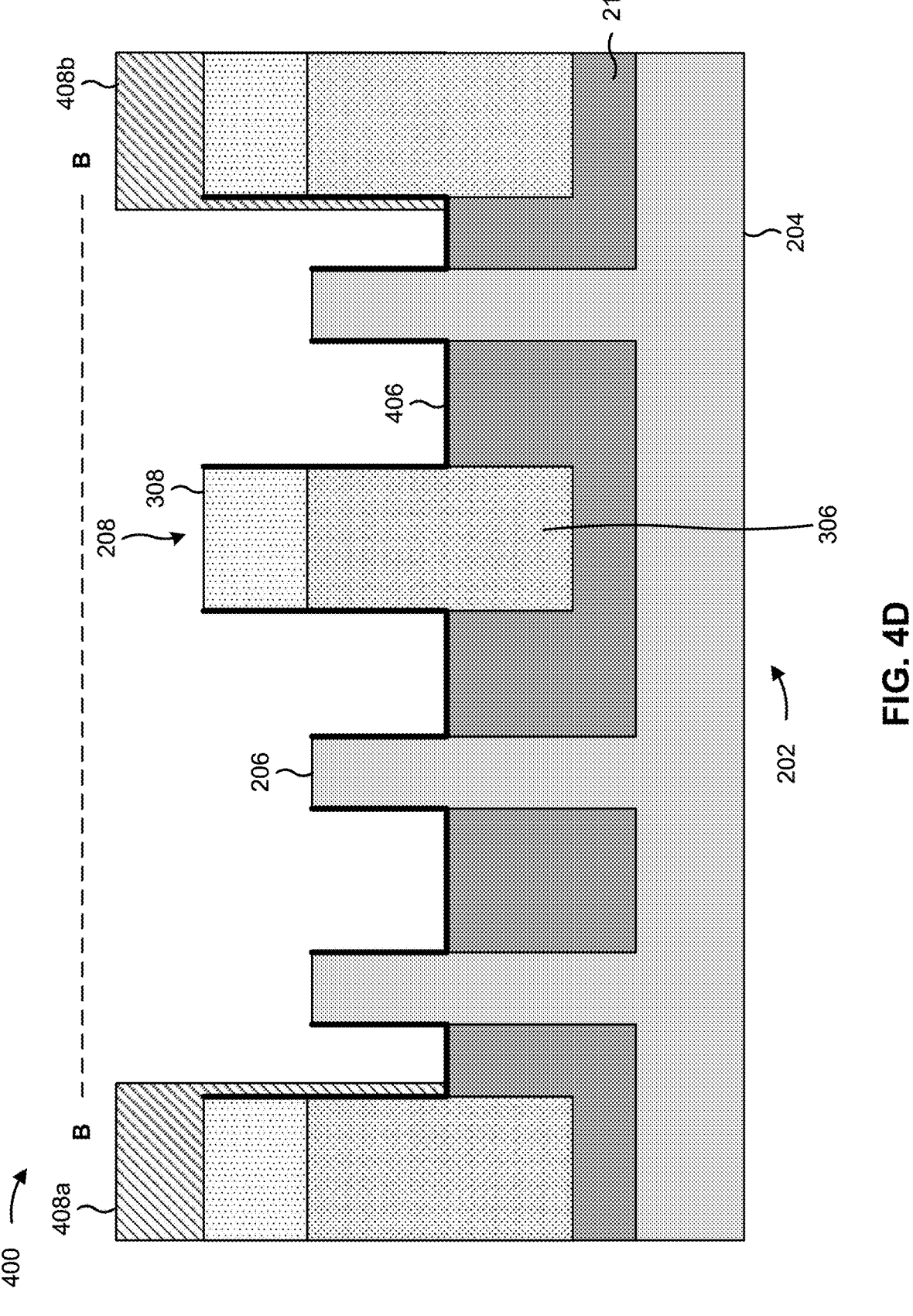

As shown in FIG. 4D, portions of the spacer layer 406 are removed from the top surfaces of the fin structures 206 and from the top surfaces of the hybrid fin structures 208. The etch tool 108 may remove the portions of the spacer layer 406. The etch operation to remove the portions of the spacer layer 406 may be referred to as a fin top opening operation, and may be performed to facilitate etching of the fin structures 206.

Subsequently, a photoresist layer is formed over and/or on portions of the device region 202 to mask or protect the portions of the device region 202 during etching of the fin structures 206. The deposition tool 102 may form the photoresist layer using a spin-coating technique or another suitable deposition technique. The photoresist layer may be formed such that a plurality of fin structures 206 are located between a first portion 408a of the photoresist layer and a second portion 408b of the photoresist layer. Accordingly, the fin structures 206 between the first portion 408a and the second portion 408b of the photoresist layer are exposed to facilitate etching of the fin structures 206.

Figure 4E:
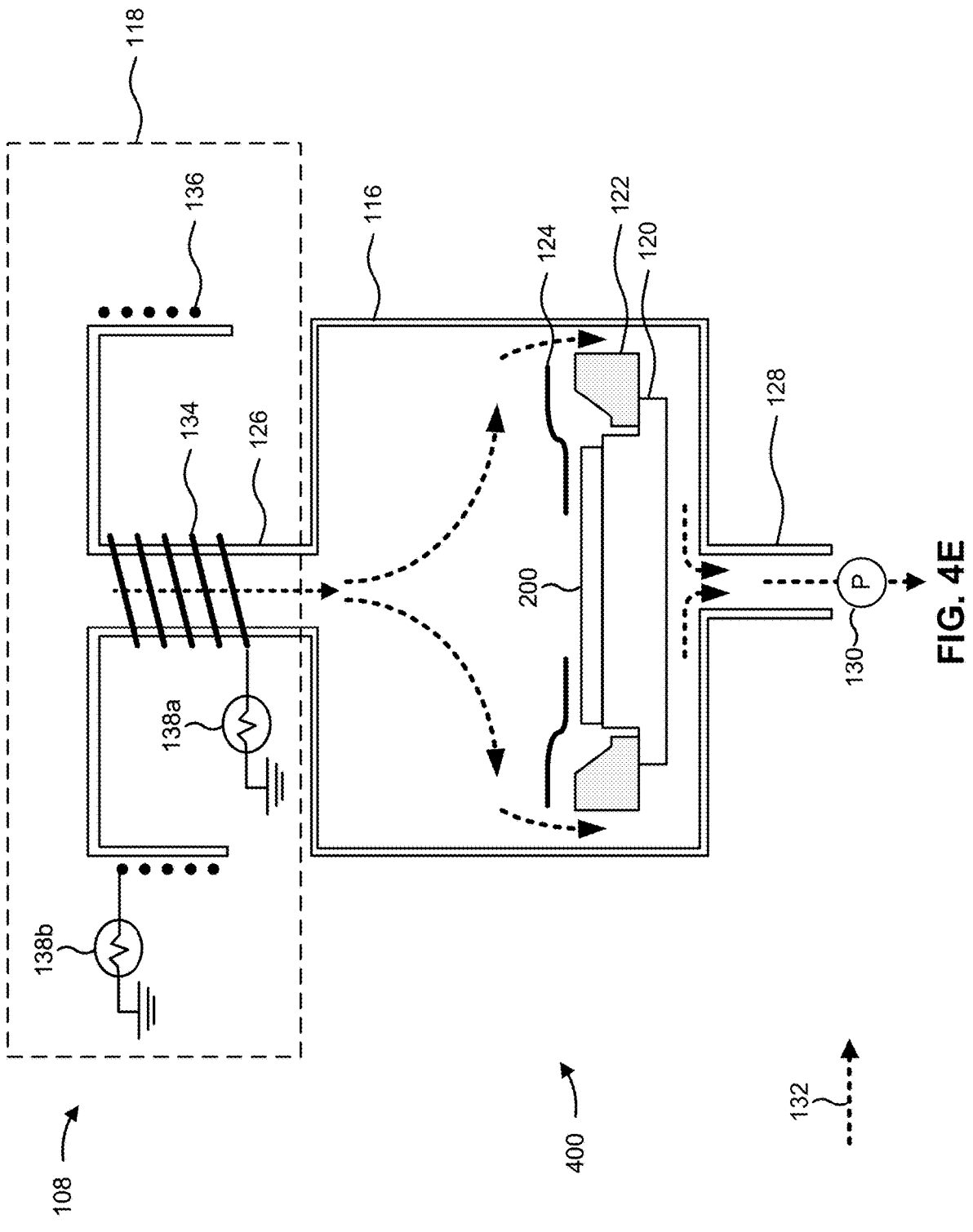

As shown in FIG. 4E, the semiconductor wafer 200 may be positioned in the processing chamber 116 of the plasma-based etch tool 108 for etching of the fin structures 206 between the first portion 408a and the second portion 408b of the photoresist layer. The semiconductor wafer 200 is positioned above and/or on the chuck 120 such that the focus ring 122 is positioned around the semiconductor wafer 200. The plasma-based etch tool 108 performs a plasma-based etch operation to etch the fin structures 206 with the semiconductor wafer 200 positioned in the processing chamber 116. The plasma-based etch operation may also be referred to as a strained source/drain (SSD) etch operation.

To perform the plasma-based etch operation, the plasma supply system 118 generates and provides a plasma to the processing chamber 116 through the inlet port 126. The plasma in the processing chamber 116 is provided to the semiconductor wafer 200 in the flow path 132, which is facilitated through the use of a bias voltage on the chuck 120. The bias voltage on the chuck 120 causes ions in the sheath 124 of the plasma to bombard the fin structures 206, which results in the ions etching the fin structures 206.

Figure 4F:
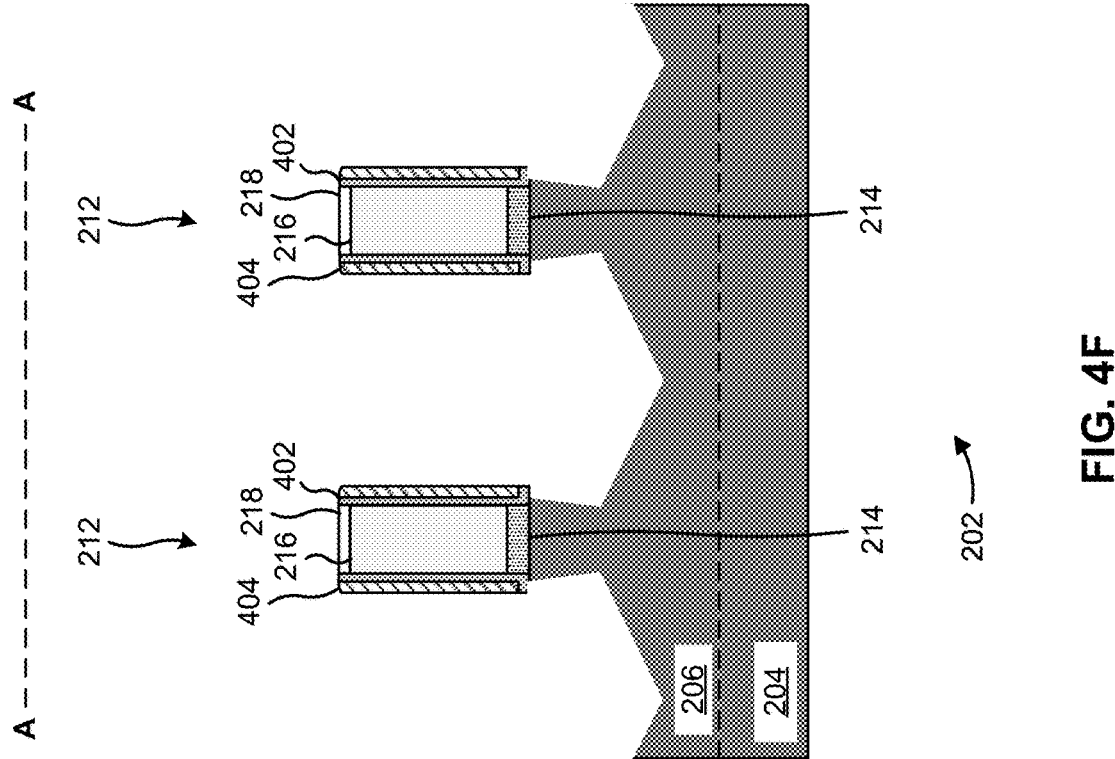
Figure 4G:
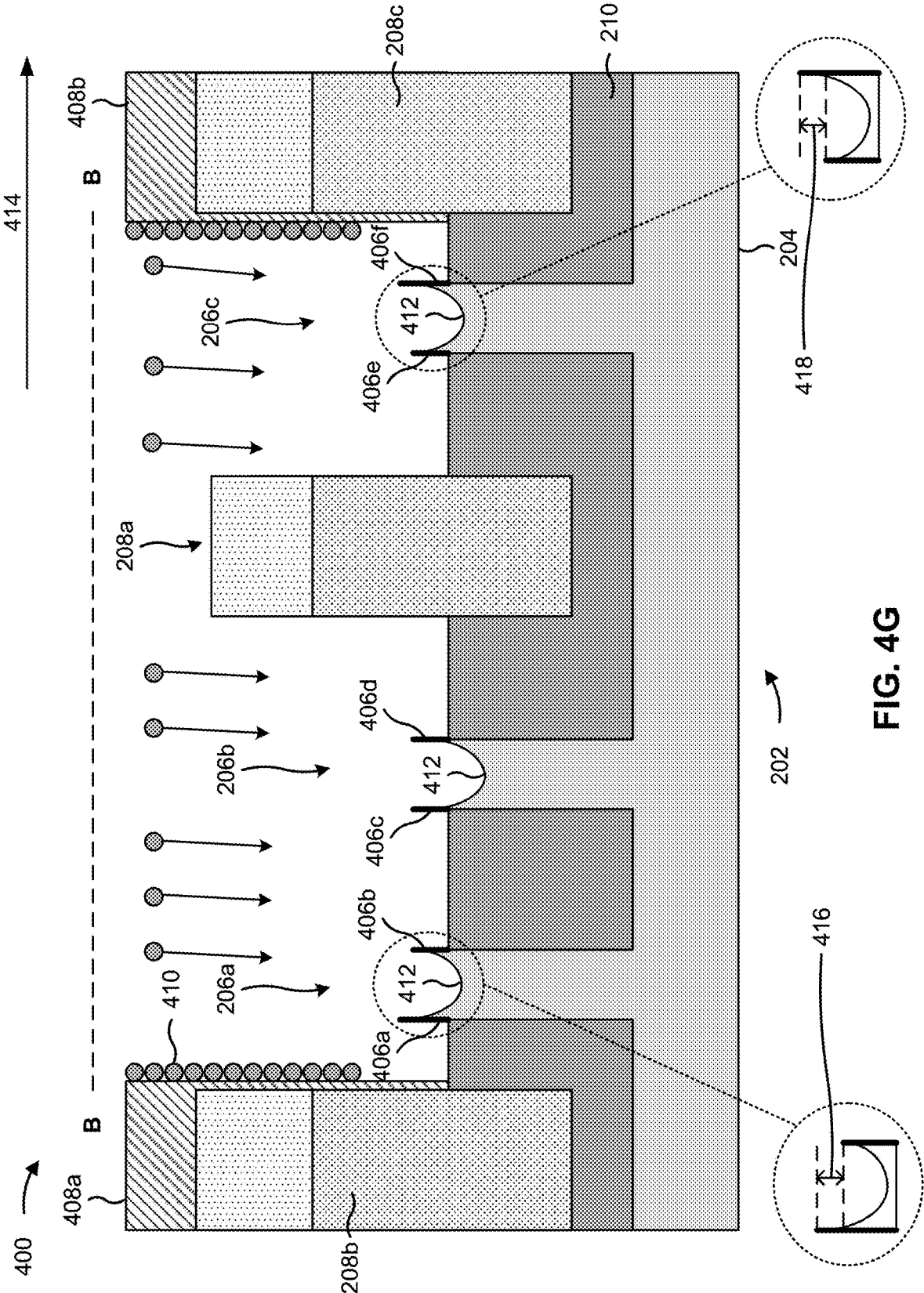

As shown in FIGS. 4F and 4G, the ions 410 in the plasma etch the fin structures 206. In some implementations, the fin structures 206 are etched such that the top surfaces of the fin structures 206 are approximately a same height as a height of the top of the STI regions 210. In some implementations, the fin structures 206 are etched such that the top surfaces of the fin structures 206 are recessed, where recesses 412 in the fin structures 206 extend below the height of the top of the STI regions 210.

The ions 410 also etch the spacer layer 406. The remaining portions of the spacer layer 406 on the sidewalls of the fin structures 206 form fin sidewall spacers. For example, a fin sidewall spacer 406a is formed on a first side of a fin structure 206a and a fin sidewall spacer 406b is formed on a second (opposing) side of the fin structure 206a. As another example, a fin sidewall spacer 406c is formed on a first side of a fin structure 206b and a fin sidewall spacer 406d is formed on a second (opposing) side of the fin structure 206b. As another example, a fin sidewall spacer 406e is formed on a first side of a fin structure 206c and a fin sidewall spacer 406f is formed on a second (opposing) side of the fin structure 206c.

The fin structure 206a and the fin structure 206b include adjacent fin structures. The fin structure 206a and the fin structure 206b are adjacent to a side of a hybrid fin structure 208 that is opposite of a side of the hybrid fin structure 208 to which the fin structure 206c is adjacent. The fin structure 206a and the fin structure 206b are located closer to an edge of the semiconductor wafer 200 relative to the fin structure 206c. The fin structure 206a is located closer to the edge of the semiconductor wafer 200 relative to the fin structure 206b. Accordingly, the fin structure 206c is located closer to the center of the semiconductor wafer 200 relative to the fin structure 206a and the fin structure 206b, and the fin structure 206b is located closer to the center of the semiconductor wafer 200 relative to the fin structure 206a. The location or direction of the center of the semiconductor wafer 200 relative to the structures illustrated in the device region 202 in FIG. 4F is indicated by reference number 414.

As further shown in FIG. 4G, the ions 410 of the plasma polymerize on the sidewalls of the portion 408a of the photoresist layer, which passivates the portion 408a of the photoresist layer. The passivation reduces the etch rate of the ions 410 of the plasma at and/or near the sidewall of the portion 408a of the photoresist layer (e.g., relative to the etch rate further away from the sidewall of the portion 408a of the photoresist layer). The reduced etch rate of the ions 410 of the plasma at and/or near the sidewall of the portion 408a of the photoresist layer results in uneven etching of the fin structure 206a, which in turn results in an uneven height of (or uneven recess 412 in the top surface) of the fin structure 206a. In particular, the height of the fin structure 206a is greater on the side of the fin structure 206a facing or orientated toward the sidewall of the portion 408a of the photoresist layer as a result of the reduced etch rate.

Accordingly, the height of the fin sidewall spacer 406a is greater relative to the height of the fin sidewall spacer 406b. An example dimension 416 includes a difference between the height of the fin sidewall spacer 406a and the height of the fin sidewall spacer 406b. In some implementations, the difference between the height of the fin sidewall spacer 406a and the height of the fin sidewall spacer 406b is in a range of approximately 2 nanometers to approximately 5 nanometers to facilitate and/or enable the formation of asymmetrical epitaxial regions described herein. However, other values for the difference between the height of the fin sidewall spacer 406a and the height of the fin sidewall spacer 406b are within the scope of the present disclosure. Moreover, the height of the fin sidewall spacer 406a may be greater relative to the height of the fin sidewall spacer 406c and the height of the fin sidewall spacer 406d because the etch rate at or near the fin structure 206b is greater relative to at or near the sidewall of the portion 408a of the photoresist layer.

As further shown in FIG. 4G, the ions 410 of the plasma polymerize on the sidewalls of the portion 408b of the photoresist layer, which passivates the portion 408b of the photoresist layer. The passivation reduces the etch rate of the ions 410 of the plasma at and/or near the sidewall of the portion 408b of the photoresist layer (e.g., relative to the etch rate further away from the sidewall of the portion 408b of the photoresist layer). The reduced etch rate of the ions 410 of the plasma at and/or near the sidewall of the portion 408b of the photoresist layer results in uneven etching of the fin structure 206c, which in turn results in an uneven height of (or uneven recess 412 in the top surface) of the fin structure 206c. In particular, the height of the fin structure 206c is greater on the side of the fin structure 206c facing or orientated toward the sidewall of the portion 408b of the photoresist layer as a result of the reduced etch rate.

Accordingly, the height of the fin sidewall spacer 406f is greater relative to the height of the fin sidewall spacer 406e. An example dimension 418 includes a difference between the height of the fin sidewall spacer 406f and the height of the fin sidewall spacer 406e. In some implementations, the difference between the height of the fin sidewall spacer 406f and the height of the fin sidewall spacer 406e is in a range of approximately 2 nanometers to approximately 5 nanometers to facilitate and/or enable the formation of asymmetrical epitaxial regions described herein. However, other values for the difference between the height of the fin sidewall spacer 406f and the height of the fin sidewall spacer 406e are within the scope of the present disclosure.

In some implementations, a hybrid fin structure 208a (the hybrid fin structure 208 between the merged epitaxial region 422 (and the fin structures 206a and 206b) and the epitaxial region 420c (and the fin structure 206c) may be slightly etched in the etch operation to etch the fin structures 206a-206c. This may result in a reduction in height of the hybrid fin structure 208a. The portion 408a of the photoresist layer is formed over and/or on a hybrid fin structure 208b, which is adjacent to an opposing side of the merged epitaxial region 422 (and an opposing side of the fin structures 206a and 206b) as the hybrid fin structure 208a. Similarly, the portion 408b of the photoresist layer is formed over and/or on a hybrid fin structure 208c, which is adjacent to an opposing side of the epitaxial region 420c (and an opposing side of the fin structure 206c) as the hybrid fin structure 208a. The height of the hybrid fin structures 208b and 208c may be greater relative to a height of the hybrid fin structure 208a after the etch operation as a result of the photoresist layer protecting the hybrid fin structures 208b and 208c during the etch operation to etch the fin structures 206a-206c.

Figure 4H:
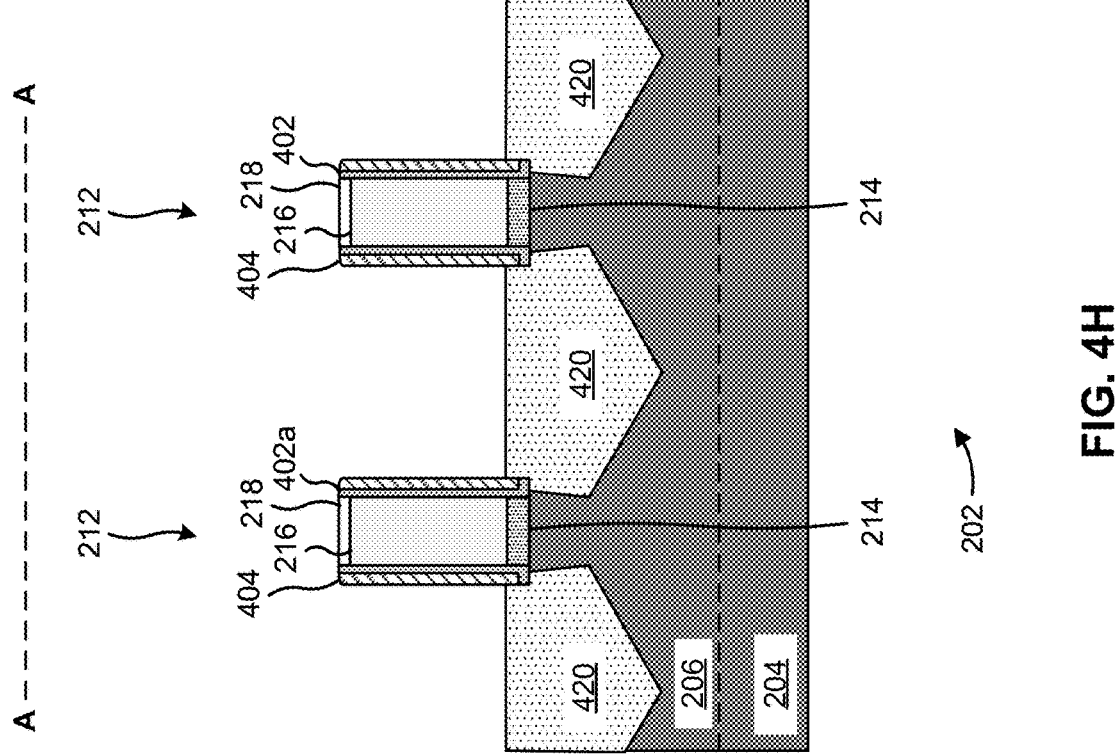
Figure 4I:
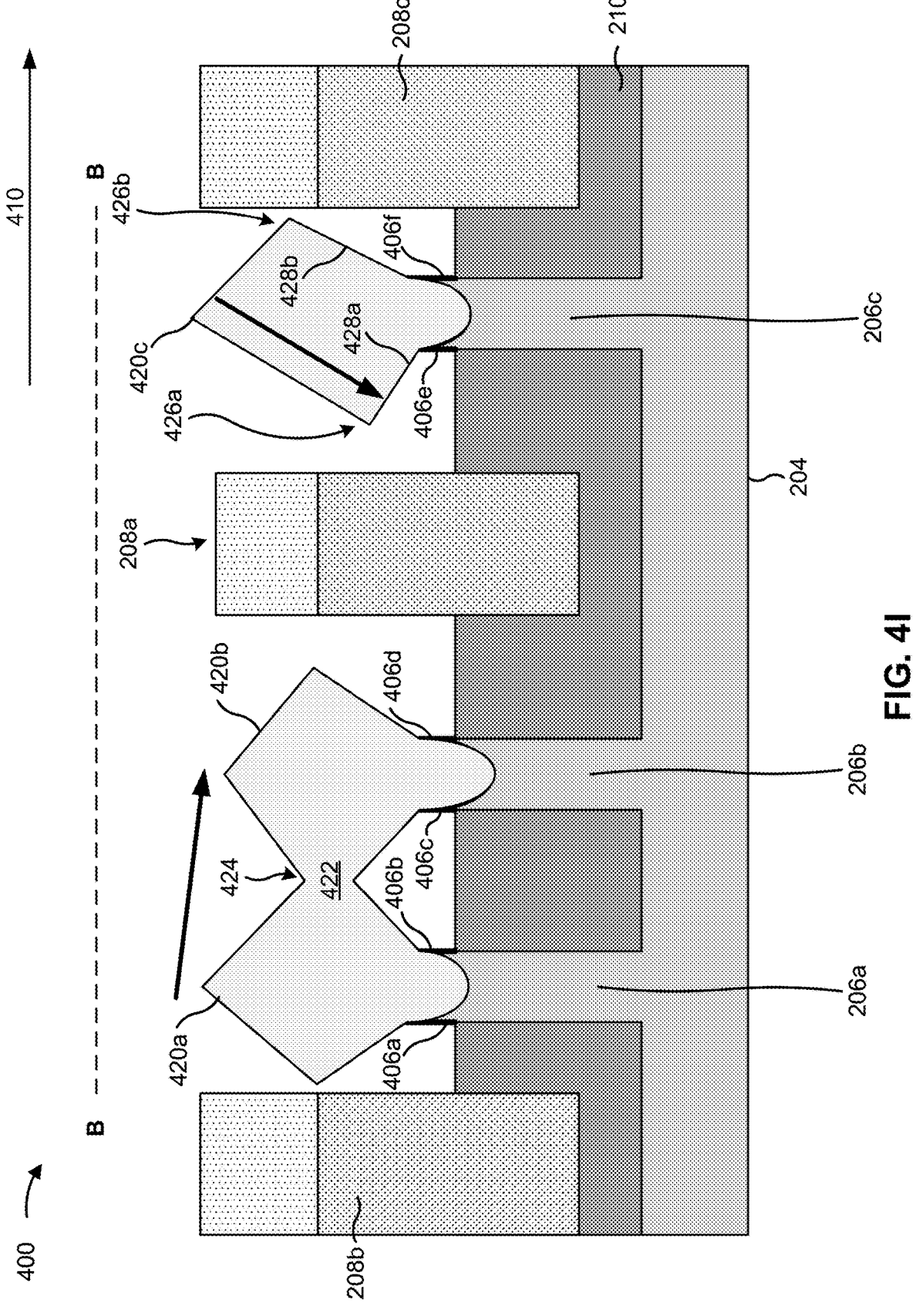

As shown in FIGS. 4H and 4I, epitaxial regions 420 are formed in the recesses in the device region 202 of the semiconductor wafer 200 over and/or on the fin structures 206 (e.g., over and/or on the fin structures 206a-206c). The deposition tool 102 forms the epitaxial regions 420 in an epitaxial operation, in which layers of the epitaxial material are deposited on the fin structures 206a-206c such that the layers of the epitaxial regions 420 are formed by epitaxial growth in a particular crystalline orientation. The epitaxial regions 420 are included adjacent to one or more dummy gate structures 212 and at least partially below and/or lower than a top surface of the dummy gate structures 212. Moreover, the epitaxial regions 420 at least partially extend above the top surface of the fin structures 206. The epitaxial regions 420 correspond to the source/drain regions of the transistors included in the device region 202.

As shown in FIG. 41, an epitaxial region 420a is formed on the fin structure 206a, an epitaxial region 420b is formed on the fin structure 206b, and an epitaxial region 420c is formed on the fin structure 206c. The epitaxial region 420a extends into the recess 412 in the top surface of the fin structure 206a, the epitaxial region 420a extends above the fin sidewall spacers 406a and 406b, and the epitaxial region 420a extends laterally outward past the sidewalls of the fin structure 206a. The epitaxial region 420b extends into the recess 412 in the top surface of the fin structure 206b, the epitaxial region 420b extends above the fin sidewall spacers 406c and 406d, and the epitaxial region 420b extends laterally outward past the sidewalls of the fin structure 206b. The epitaxial region 420c extends into the recess 412 in the top surface of the fin structure 206c, the epitaxial region 420c extends above the fin sidewall spacers 406e and 406f, and the epitaxial region 420c extends laterally outward past the sidewalls of the fin structure 206c.

As further shown in FIG. 41, the epitaxial region 420a and the epitaxial region 420b coalesce and/or connect in a merged area 424 in a portion of the epitaxial region 420a and a portion of the epitaxial region 420b. This results in the formation of a merged epitaxial region 422 over and/or on the fin structures 206a and 206b. The merged epitaxial region 422 may also be referred to as a two-fin (2F) epitaxial region. The epitaxial region 420c is not merged with another epitaxial region, and is referred to as a non-merged epitaxial region, a single epitaxial region, a one fin (1F) epitaxial region, or a standalone epitaxial region.

As further shown in FIG. 41, the merged epitaxial region 422 is slanted or tilted toward the epitaxial region 420c (e.g., the non-merged epitaxial region). Moreover, the merged epitaxial region 422 is slanted or tilted toward the center of the semiconductor wafer 200 and away from the edge of the semiconductor wafer 200. The slant or tilt occurs as a result of a difference between a height of the epitaxial regions 420a and 420b that coalesce to form the merged epitaxial region 422. In particular, the merged epitaxial region 422 is slanted or tilted toward the epitaxial region 420c (and toward the center of the semiconductor wafer 200) as a result of the height of the epitaxial region 420a being greater relative to the height of the epitaxial region 420b. The height of the epitaxial region 420a is greater relative to the height of the epitaxial region 420b as a result of the uneven etching of the fin structure 206a, as well as the greater height of the fin sidewall spacer 406a relative to the heights of the fin sidewall spacers 406b-406d.

As further shown in FIG. 41, the epitaxial region 420c (e.g., the non-merged epitaxial region) is slanted or tilted toward the merged epitaxial region 422. Moreover, the epitaxial region 420c is slanted or tilted toward the edge of the semiconductor wafer 200 and away from the center of the semiconductor wafer 200. The slant or tilt occurs as a result of the uneven etching of the fin structure 206c, as well as the greater height of the fin sidewall spacer 406f relative to the height of the fin sidewall spacer 406e. In some implementations, the epitaxial region 420c is slanted or tilted toward the merged epitaxial region 422 (and toward the edge of the semiconductor wafer 200) in that an end (or edge) 426a of the epitaxial region 420c, that is orientated toward the merged epitaxial region 422, is positioned lower relative to an opposing end (or edge) 426b of the epitaxial region 420c that is orientated toward the center of the semiconductor wafer 200. In some implementations, the epitaxial region 420c is slanted or tilted toward the merged epitaxial region 422 (and toward the edge of the semiconductor wafer 200) in that a side 428a of the epitaxial region 420c, that is orientated toward the merged epitaxial region 422 and adjacent to the fin sidewall spacer 406e, is positioned lower relative to an opposing side 428b of the epitaxial region 420c that is orientated toward the center of the semiconductor wafer 200 and adjacent to the fin sidewall spacer 406f.

The material (e.g., silicon (Si), gallium (Ga), or another type of semiconductor material) that is used to form the epitaxial regions 420 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

In some implementations, a hybrid fin structure 208a (the hybrid fin structure 208 between the merged epitaxial region 422 (and the fin structures 206a and 206b) and the epitaxial region 420c (and the fin structure 206c) may be slightly etched in the etch operation to etch the fin structures 206a-206c. This may result in a reduction in height of the hybrid fin structure 208a. The portion 408a of the photoresist layer is formed over and/or on a hybrid fin structure 208b, which is adjacent to an opposing side of the merged epitaxial region 422 (and an opposing side of the fin structures 206a and 206b) as the hybrid fin structure 208a. Similarly, the portion 408b of the photoresist layer is formed over and/or on a hybrid fin structure 208c, which is adjacent to an opposing side of the epitaxial region 420c (and an opposing side of the fin structure 206c) as the hybrid fin structure 208a. The height of the hybrid fin structures 208b and 208c may be greater relative to a height of the hybrid fin structure 208a after the etch operation as a result of the photoresist layer protecting the hybrid fin structures 208b and 208c during the etch operation to etch the fin structures 206a-206c.

In some implementations, the operations and/or techniques described in connection with FIGS. 4E-4I may be performed to form p-type epitaxial regions and n-type epitaxial regions in the device region 202 in a plurality of epitaxial operations. In these implementations, the p-type epitaxial regions and the n-type epitaxial regions may be formed using different deposition chambers of the same deposition tool 102 (e.g., a cluster tool) or using different deposition tools 102. The sub-region of the device region 202 in which the p-type epitaxial regions are to be formed may be masked by a photoresist, the operations and/or techniques described in connection with FIGS. 4E-4I may be performed to form the n-type epitaxial regions in another sub-region of the device region 202, the photoresist may be removed, the sub-region in which the n-type epitaxial regions were formed is masked by a photoresist, and the operations and/or techniques described in connection with FIGS. 4E-4I may be performed to form the p-type epitaxial regions in the sub-region of the device region 202. Alternatively, the p-type epitaxial regions may be formed prior to formation of the n-type epitaxial regions.

The p-type epitaxial regions and the n-type epitaxial regions may be formed using different precursors and different dopants. For p-type epitaxial regions, precursors such as a germanium (Ge) precursor (e.g., $GeH_4$ or another germanium precursor) and a silicon precursor (e.g., silane ($SiH_4$), dichlorosilane (DCS), or another silicon precursor) may be used along with an etchant (e.g., hydrogen chloride (HCL) or another etchant), a carrier gas (e.g., hydrogen ($H_2$) or another carrier gas), and a p-type dopant source (e.g., a boron dopant source (e.g., $B_xH_y$ or another boron dopant source)). For n-type epitaxial regions, precursors such as a silicon precursor (e.g., silane ($SiH_4$), dichlorosilane (DCS), or another silicon precursor) may be used along with an etchant (e.g., hydrogen chloride (HCL) or another etchant), a carrier gas (e.g., hydrogen ($H_2$) or another carrier gas), and an n-type dopant source (e.g., a phosphorous dopant source (e.g., $PH_x$ or another phosphorous dopant source), an arsenic dopant source (e.g., $AsH_x$ or another arsenic dopant source)).

Figure 4J:
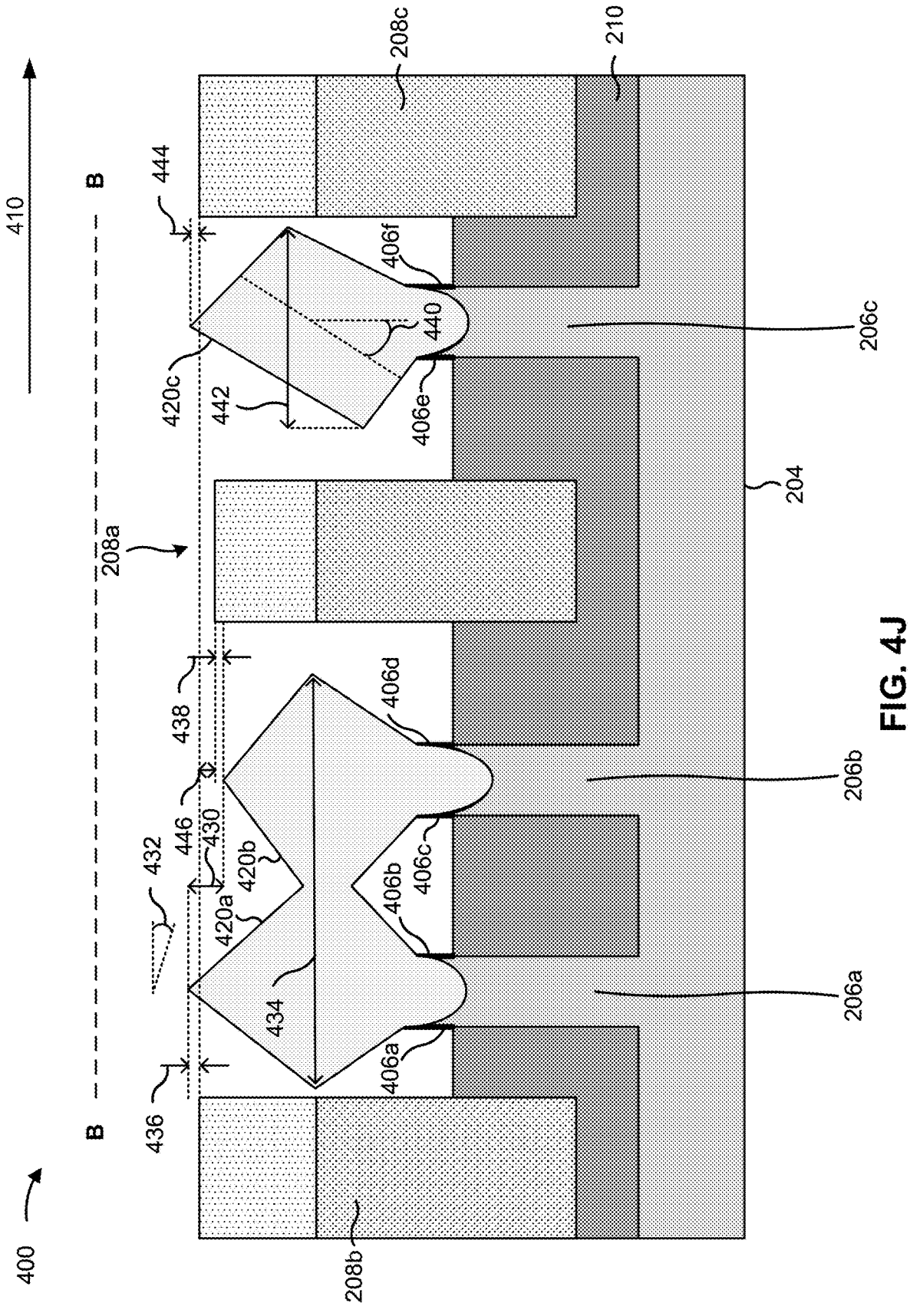

FIG. 4J illustrates various dimensions of the epitaxial regions 420 and various dimensions of the fin sidewall spacers 406a-406f. As shown in FIG. 4J, an example dimension 430 includes a difference between a height of a top surface of the epitaxial region 420a of the merged epitaxial region 422 and a height of a top surface of the epitaxial region 420b of the merged epitaxial region 422. In some implementations, the difference is in a range of approximately 2 nanometers to approximately 10 nanometers to facilitate tilting of the merged epitaxial region 422. However, other values for the difference are included in the scope of the present disclosure. As shown in FIG. 4J, an example dimension 432 includes an angle of the slant or tilt of the merged epitaxial region 422. In some implementations, the angle is in a range of approximately 1 degree to approximately 30 degrees to facilitate tilting of the merged epitaxial region 422. However, other values for the difference are included in the scope of the present disclosure.

As shown in FIG. 4J, an example dimension 434 includes a width of the merged epitaxial region 422. In some implementations, the width of the merged epitaxial region 422 is in a range of approximately 40 nanometers to approximately 70 nanometers to provide sufficient landing area for a conductive structure that is to be formed to the merged epitaxial region 422. However, other values for the difference are included in the scope of the present disclosure. As shown in FIG. 4J, an example dimension 436 includes a difference between the height of the top surface of the epitaxial region 420a and a height of a top surface of an adjacent hybrid fin structure 208. In some implementations, the height of the top surface of the epitaxial region 420a is greater relative to the height of the top surface of the adjacent hybrid fin structure 208. In some implementations, the difference is in a range of approximately 0.5 nanometers to approximately 5 nanometers. However, other values for the difference are included in the scope of the present disclosure.

As shown in FIG. 4J, an example dimension 438 includes a difference between the height of the top surface of the epitaxial region 420b and a height of a top surface of an adjacent hybrid fin structure 208. In some implementations, the height of the top surface of the epitaxial region 420b is lesser relative to the height of the top surface of the adjacent hybrid fin structure 208. In some implementations, the difference is in a range of approximately 2.5 nanometers to approximately 15 nanometers. However, other values for the difference are included in the scope of the present disclosure.

As shown in FIG. 4J, an example dimension 440 includes an angle of the slant or tilt of the epitaxial region 420c. In some implementations, the angle is in a range of approximately 1 degree to approximately 18 degrees to facilitate tilting of the epitaxial region 420c. However, other values for the difference are included in the scope of the present disclosure. As shown in FIG. 4J, an example dimension 442 includes a width of the epitaxial region 420c. In some implementations, the width of the epitaxial region 420c is in a range of approximately 20 nanometers to approximately 45 nanometers to provide sufficient landing area for a conductive structure that is to be formed to the epitaxial region 420c. However, other values for the difference are included in the scope of the present disclosure. In some implementations, a ratio of the width of the merged epitaxial region 422 to the width of the epitaxial region 420c is in a range of approximately 9:8 to approximately 3.5:1. However, other values for the ratio are within the scope of the present disclosure.

As shown in FIG. 4J, a height of a top surface of the epitaxial region 420c may be greater relative to a height of a top surface of an adjacent hybrid fin structure 208. An example dimension 444 includes a difference between the height of a top surface of the epitaxial region 420c and the height of the top surface of the adjacent hybrid fin structure 208. In some implementations, the difference is in range of approximately 1 nanometer to approximately 10 nanometers. However, other values for the difference are within the scope of the present disclosure. Moreover, the height of the top surface of the epitaxial region 420c may be greater relative to the height of the top surface of the epitaxial region 420a, and may be greater relative to the height of the top surface of the epitaxial region 420b.

As shown in FIG. 4J, an example dimension 446 includes a difference in height between a height of the hybrid fin structure 208a between the merged epitaxial region 422 (and the fin structures 206a and 206b) and the epitaxial region 420c (and the fin structure 206c) and a height of the hybrid fin structures 208b and 208c. The height of the hybrid fin structures 208b and 208c may be greater relative to the height of the hybrid fin structure 208a. The height difference may result due to a small amount of etching of the hybrid fin structure 208a that may occur in the etch operation to etch the fin structures 206a-206c.

Figure 4K:
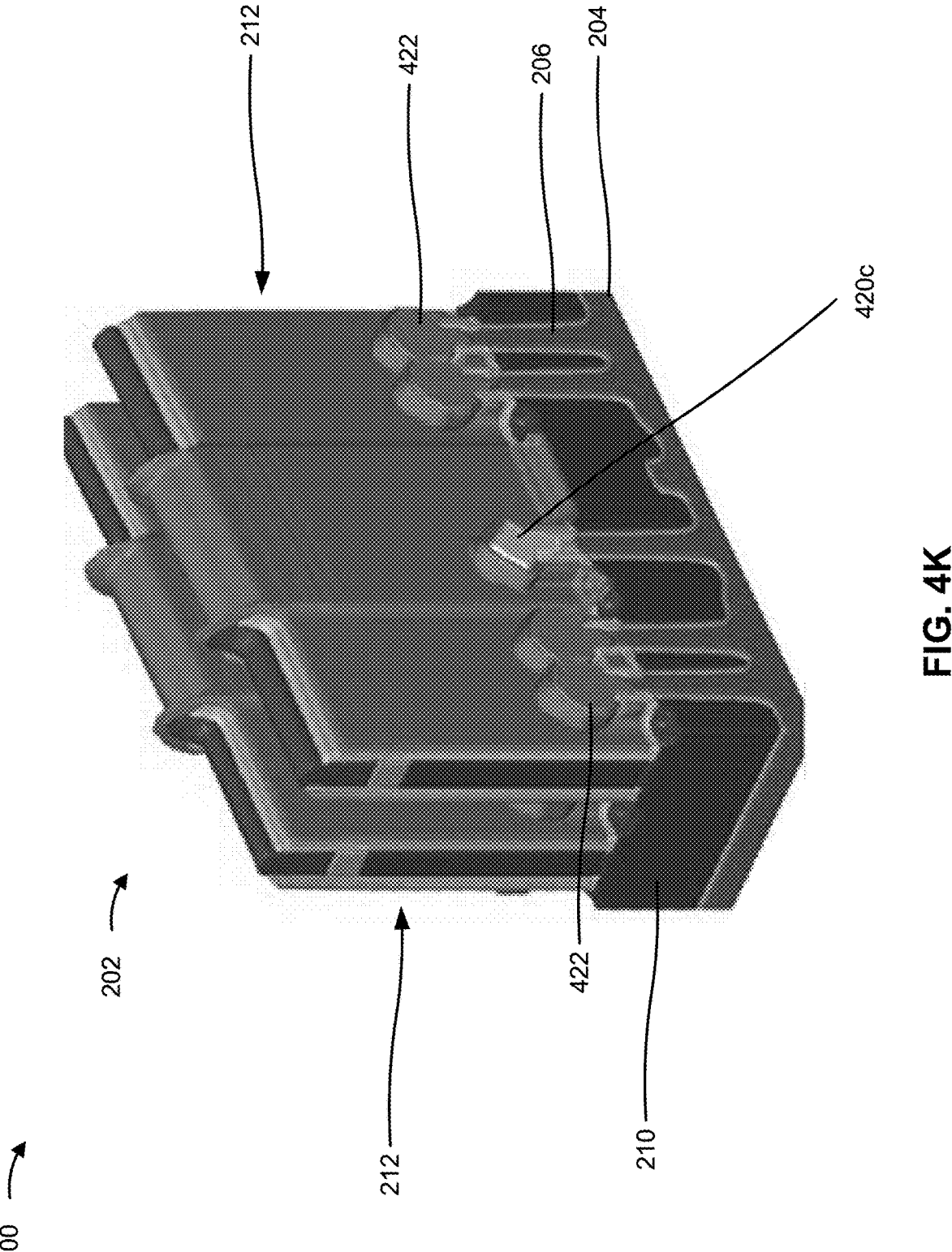

FIG. 4K illustrates a three-dimensional perspective view of the device region 202 of the semiconductor wafer 200 after formation of the epitaxial regions 420. As shown in FIG. 4K, the merged epitaxial region 422 is included on a plurality of fin structures 206. The epitaxial region 420c (e.g., a non-merged epitaxial region) is included on a single fin structure 206c. The epitaxial regions 420 are formed on one or more sides of the dummy gate structures 212.

As indicated above, FIGS. 4A-4K are provided as an example. Other examples may differ from what is described with regard to FIGS. 4A-4K.

Figure 5:
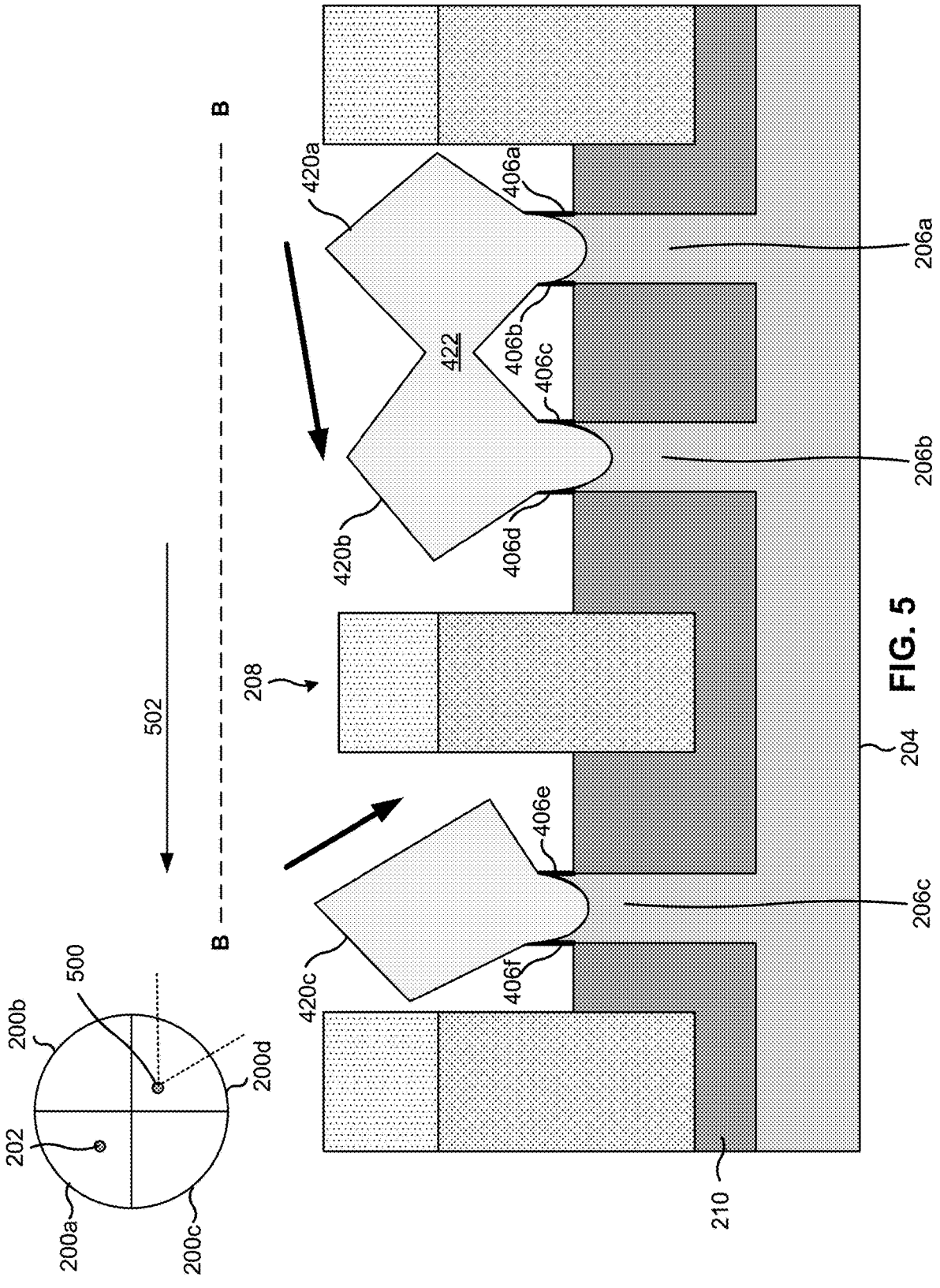
FIG. 5 is a diagram of another example device region of a semiconductor wafer described herein.

FIG. 5 is a diagram of another example device region 500 of the semiconductor wafer 200 described herein. The device region 500 may be similar to the device region 202 and may include similar structures and/or layers. However, the device region 202 and the device region 500 are included in different quadrants of the semiconductor wafer 200. For example, the device region 202 is included in the quadrant 200a and the device region 500 is included in the quadrant 200d. The device region 500 may include or may be included in one or more semiconductor devices, integrated circuits, SoCs, and/or other semiconductor-based electronic devices. The semiconductor devices may include, for example, memory devices, processors, logic devices, diodes, semiconductor lasers, and/or ring oscillators, among other examples.

The quadrant 200d is a diagonally opposing quadrant from the quadrant 200a. Accordingly, the slant or tilt of one or more epitaxial regions included in a first semiconductor device (e.g., a first ring oscillator) in the device region 500 may be opposite of the slant or tilt of one or more epitaxial regions included in a second semiconductor device (e.g., a second ring oscillator) in the device region 202.

As an example, a height of a first epitaxial region 420a in the device region 500 may be greater relative to a height of a first epitaxial region 420b in the device region 500 such that a first merged epitaxial region 422 in the device region 500 is slanted or tilted toward the center of the semiconductor wafer 200 and away from the edge of the semiconductor wafer 200 in the quadrant 200d. The location or direction of the center of the semiconductor wafer 200 relative to the structures illustrated in the device region 500 in FIG. 5 is indicated by reference number 502. Conversely, a height of a second epitaxial region 420a in the device region 202 may be greater relative to a height of a second epitaxial region 420b in the device region 202 such that a second merged epitaxial region 422 in the device region 202 is slanted or tilted toward the center of the semiconductor wafer 200 and away from the edge of the semiconductor wafer 200 in the quadrant 200a. Accordingly, the first merged epitaxial region 422 is tilted toward the second merged epitaxial region 422, and the second merged epitaxial region 422 is tilted toward the first merged epitaxial region 422.

As another example, the asymmetric shape of a first epitaxial region 420c in the device region 500 results in the first epitaxial region 420c being slanted or tilted away from the center of the semiconductor wafer 200 and toward the edge of the semiconductor wafer 200 in the quadrant 200d. Conversely, the asymmetric shape of a second epitaxial region 420c in the device region 202 results in the second epitaxial region 420c being slanted or tilted away from the center of the semiconductor wafer 200 and toward the edge of the semiconductor wafer 200 in the quadrant 200a. Accordingly, the first epitaxial region 420c is tilted away from the second epitaxial region 420c and toward the first merged epitaxial region 422, and the second epitaxial region 420c is tilted away from the first epitaxial region 420c and toward the second merged epitaxial region 422.

The shapes, slants, tilts, heights, and/or other parameters result in asymmetric epitaxial regions with specific configurations in each of the quadrants of the semiconductor wafer 200 such that the landing area (e.g., the contact surface area) for contact structures that are to be formed to the asymmetric epitaxial regions is increased. This reduces the contact resistance in the quadrants of the semiconductor wafer 200 while enabling increased semiconductor device density on the semiconductor wafer 200.

As indicated above, FIG. 5 is provided as an example. Other examples may differ from what is described with regard to FIG. 5.

FIGS. 6A-6D are diagrams of an example implementation 600 described herein. The example implementation 600 includes an example dummy gate replacement process, in which the dummy gate structures 212 are replaced with high-k gate structures and/or metal gate structures. FIGS. 6A-6D are illustrated from the perspective of the cross-sectional plane A-A in FIG. 2 for the device region 202 (or for another device region such as the device region 500) of the semiconductor wafer 200. In some implementations, the dummy gate replacement process described in connection with FIGS. 6A-6D is performed after the epitaxial region formation process described in connection with FIGS. 4A-4K.

Figure 6A:
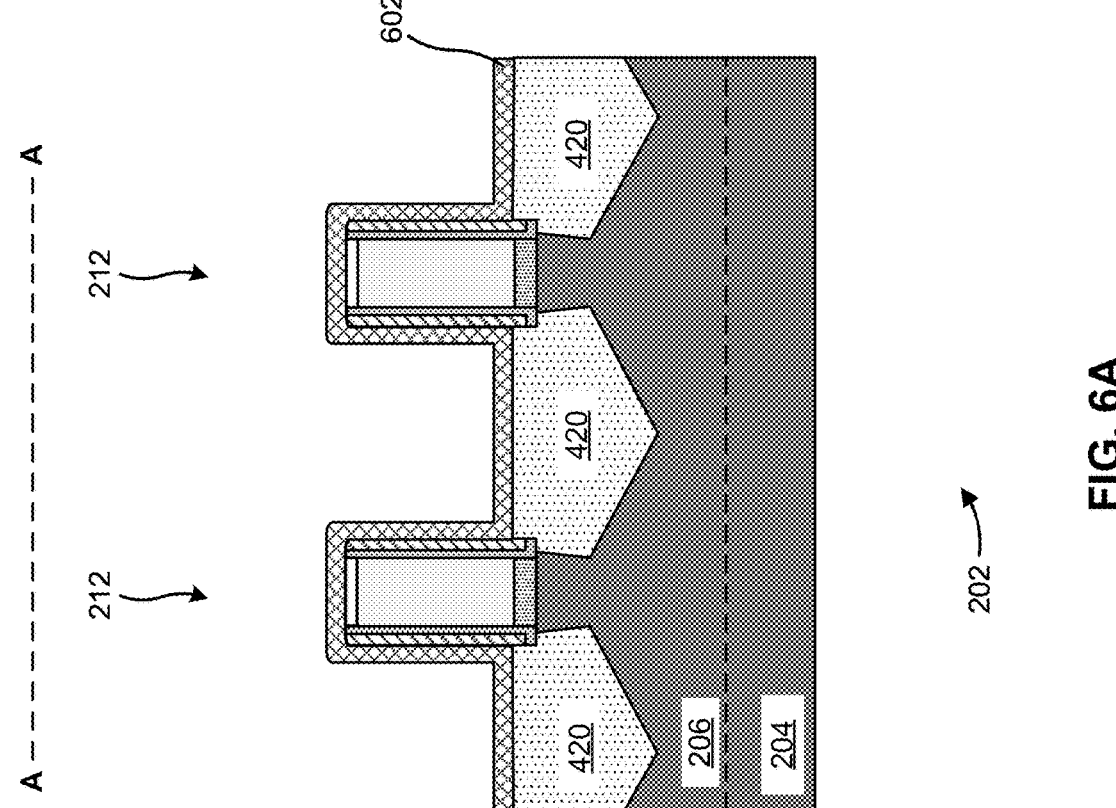
FIGS. 6A-6D, 7A-7D, and 8A-8C are diagrams of example implementations described herein.

As shown in FIG. 6A, a contact etch stop layer (CESL) 602 is conformally deposited (e.g., by the deposition tool 102) over the epitaxial regions 420, over the dummy gate structures 212, and on the sidewalls of the bulk spacer layers 404. The CESL 602 may provide a mechanism to stop an etch process when forming contacts or vias for the device region 202. The CESL 602 may be formed of a dielectric material having a different etch selectivity from adjacent layers or components. The CESL 602 may include or may be a nitrogen containing material, a silicon containing material, and/or a carbon containing material. Furthermore, the CESL 602 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL 602 may be deposited using a deposition process, such as ALD, CVD, or another deposition technique.

Figure 6B:
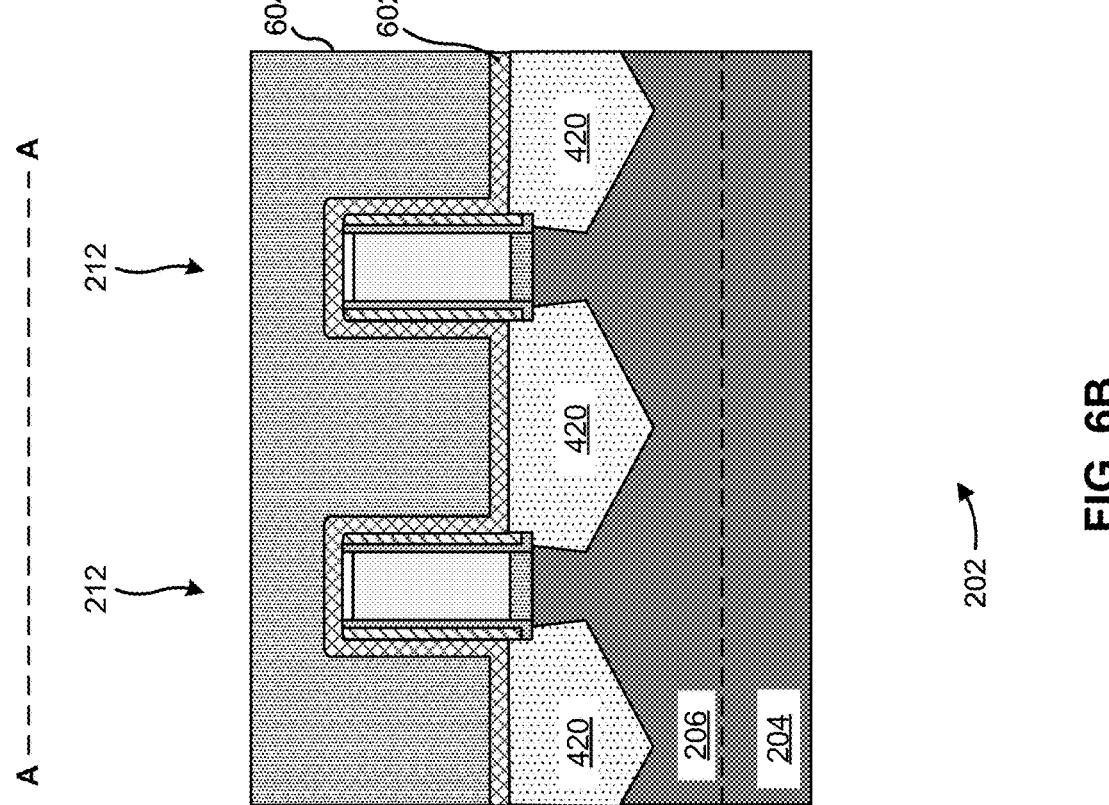

As shown in FIG. 6B, an interlayer dielectric (ILD) layer 604 is formed (e.g., by the deposition tool 102) over and/or on the CESL 602. The ILD layer 604 fills in the areas between the dummy gate structures 212 over the epitaxial regions 420. The ILD layer 604 is formed to permit a replacement gate structure process to be performed in the device region 202, in which metal gate structures are formed to replace the dummy gate structures 212. The ILD layer 604 may be referred to as an ILD zero (ILD0) layer.

In some implementations, the ILD layer 604 is formed to a height (or thickness) such that the ILD layer 604 covers the dummy gate structures 212. In these implementations, a subsequent CMP operation (e.g., performed by the planarization tool 110) is performed to planarize the ILD layer 604 such that the top surfaces of the ILD layer 604 are approximately at a same height as the top surfaces of the dummy gate structures 212. The increases the uniformity of the ILD layer 604.

Figure 6C:
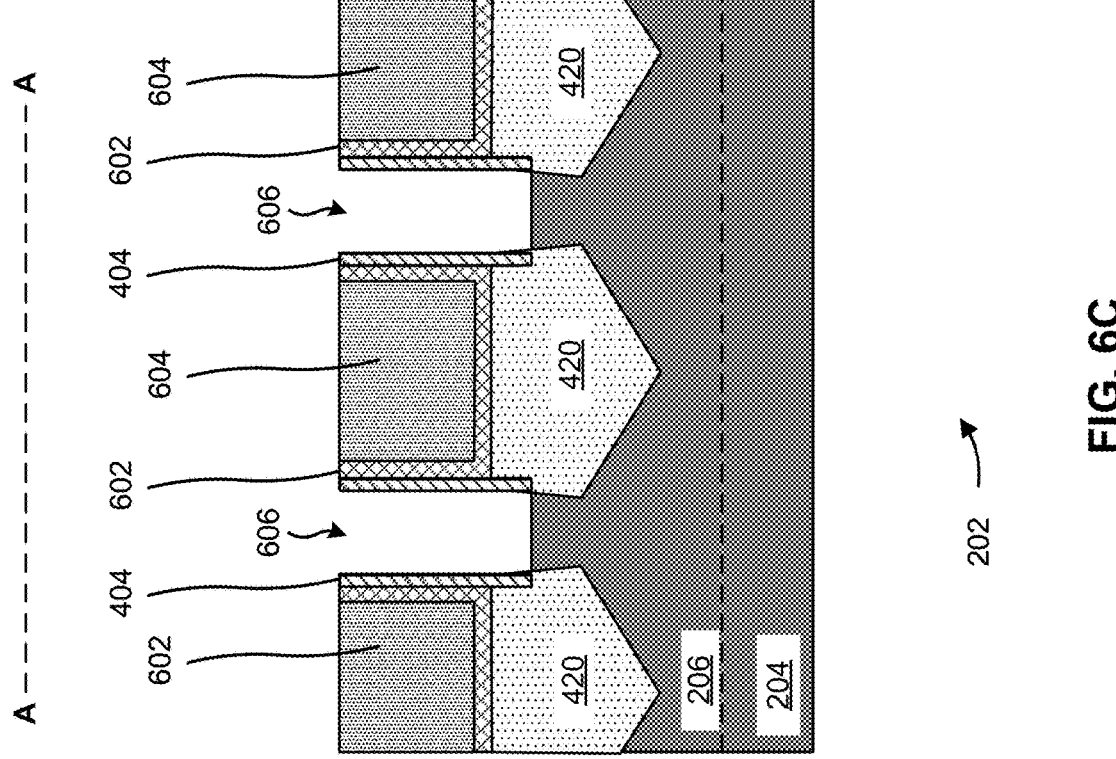

As shown in FIG. 6C, the replacement gate operation is performed (e.g., by one or more of the semiconductor processing tools 102-112) to remove the dummy gate structures 212 from the device region 202. The removal of the dummy gate structures 212 leaves behind openings (or recesses) 606 between the bulk spacer layers 404 and between the epitaxial regions 420. The dummy gate structures 212 may be removed in one or more etch operations includes a plasma etch technique, which may include a wet chemical etch technique, and/or another type of etch technique.

Figure 6D:
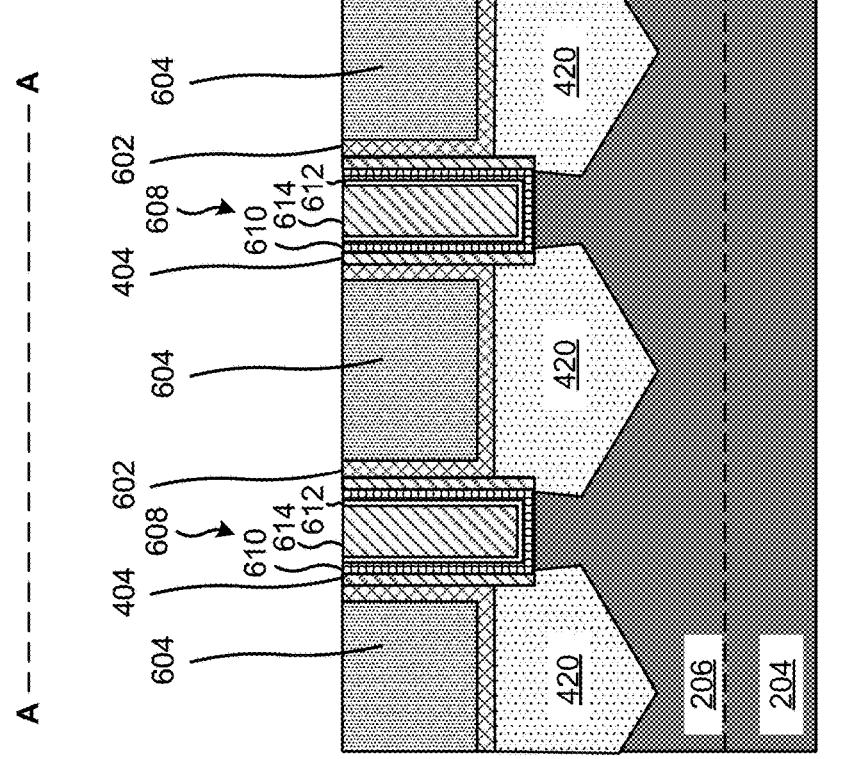

As shown in FIG. 6D, the replacement gate operation continues where deposition tool 102 and/or the plating tool 112 forms the gate structures (e.g., replacement gate structures) 608 in the openings 606 between the bulk spacer layers 404 and between the epitaxial regions 420. The gate structures 608 may include metal gate structures, high-k gate structures, or other types of gate structures. The gate structures 608 may include an interfacial layer (not shown), a high-k dielectric layer 610, a work function tuning layer 612, and a metal electrode structure 614 formed therein to form a gate structure 608. In some implementations, the gate structures 608 may include other compositions of materials and/or layers.

As indicated above, FIGS. 6A-6D are provided as an example. Other examples may differ from what is described with regard to FIGS. 6A-6D.

FIGS. 7A-7D are diagrams of an example implementation 700 described herein. The example implementation 700 includes an example of forming conductive structures in a device region 202 (or another device region such as the device region 500) of the semiconductor wafer 200. One or more of FIGS. 7A-7D are illustrated from the perspective of the cross-sectional plane A-A in FIG. 2 and/or from the perspective of the cross-sectional plate B-B in FIG. 2.

Figure 7A:
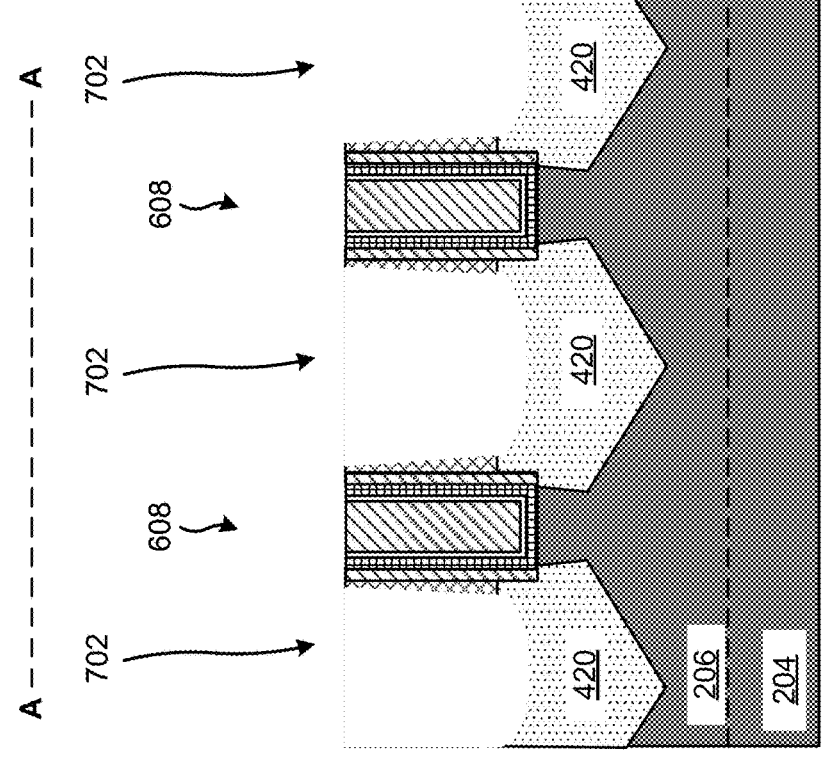
Figure 7B:
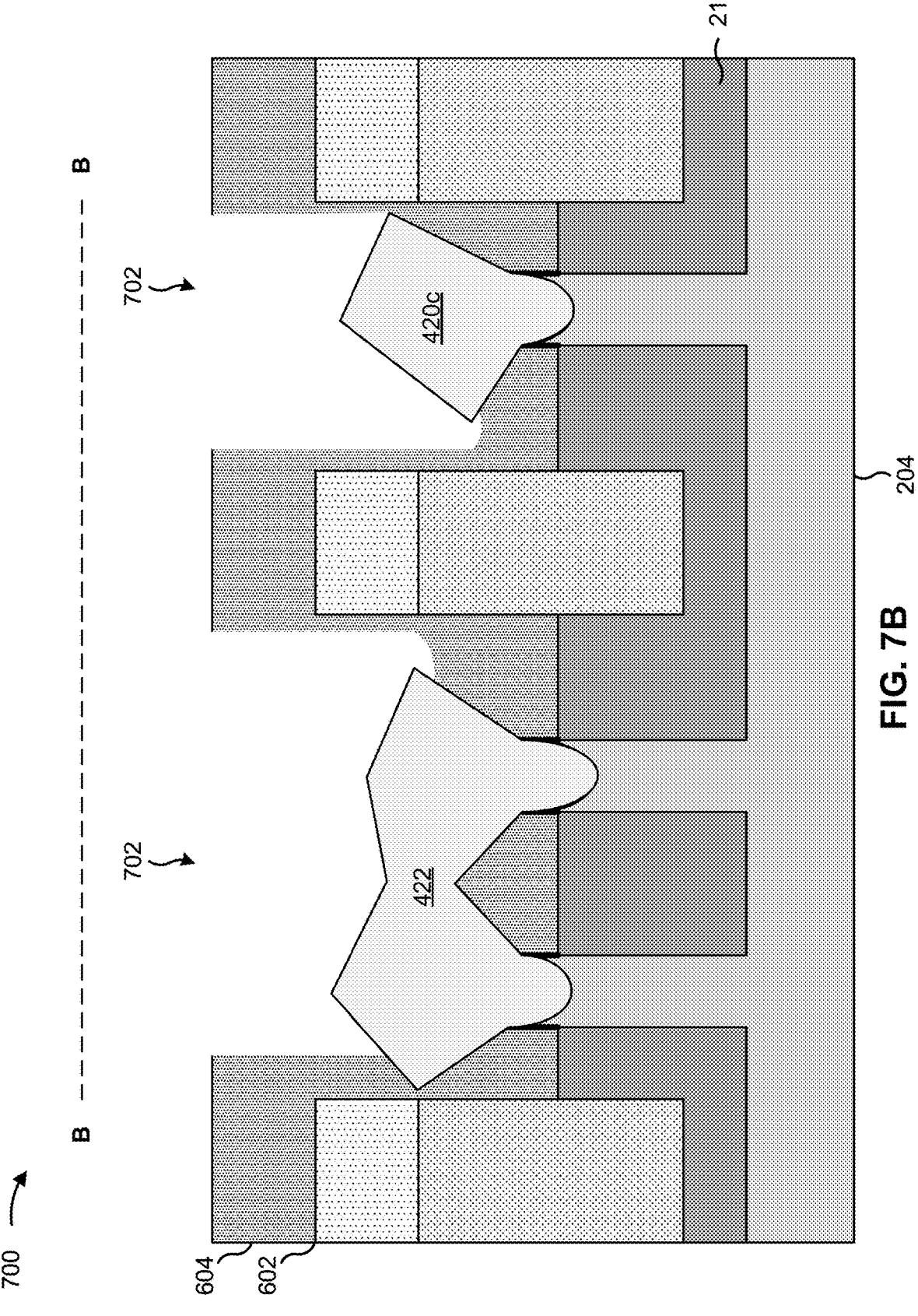

As shown in FIGS. 7A and 7B, openings (or recesses) 702 are formed through one or more dielectric layers and to the epitaxial regions 420. In particular, the CESL 602 and the ILD layer 604 between the gate structures 608 in the device region 202 are etched to form a first opening 702 to the merged epitaxial region 422 (e.g., a merged source/drain region) and a second opening to the epitaxial region 420c (e.g., a non-merged epitaxial region or a non-merged source/drain region). In some implementations, the openings 702 are formed in a portion of the source/drain regions 420 such that recesses extend into a portion of the source/drain regions 420.

In some implementations, a pattern in a photoresist layer is used to form the openings 702. In these implementations, the deposition tool 102 forms the photoresist layer on the ILD layer 604, and on the gate structures 608. The exposure tool 104 exposes the photoresist layer to a radiation source to pattern the photoresist layer. The developer tool 106 develops and removes portions of the photoresist layer to expose the pattern. The etch tool 108 etches into the ILD layer 604 and the CESL 602 to form the openings 702. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 702 based on a pattern.

Figure 7C:
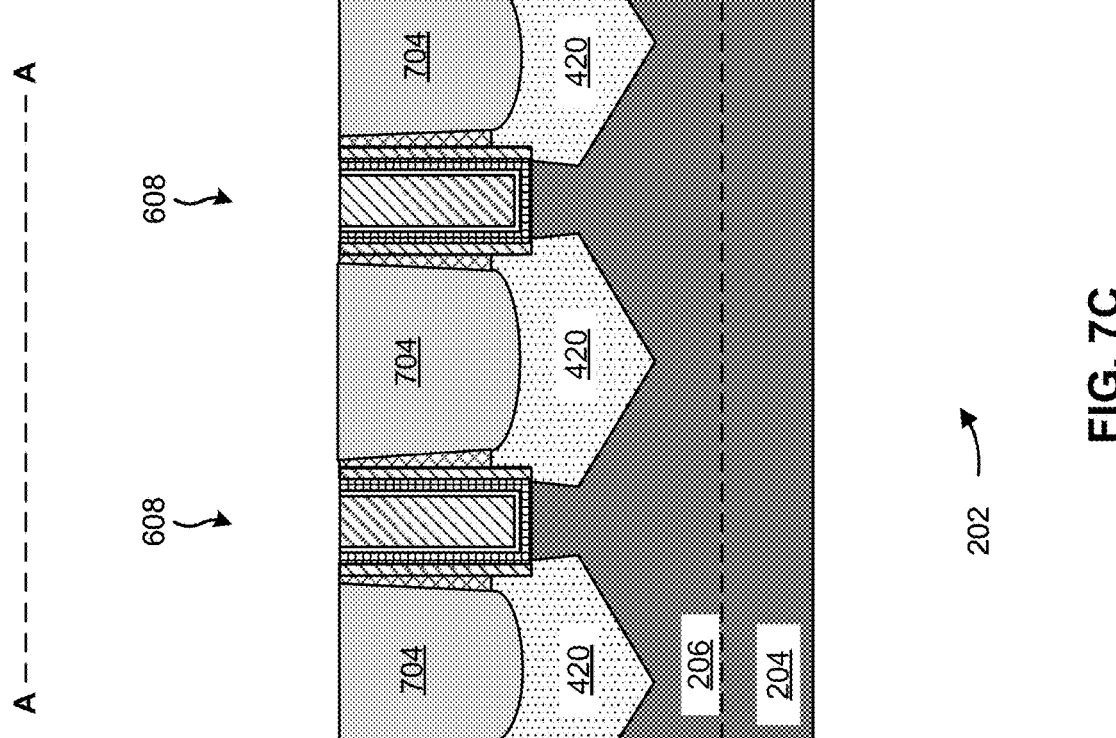
Figure 7D:
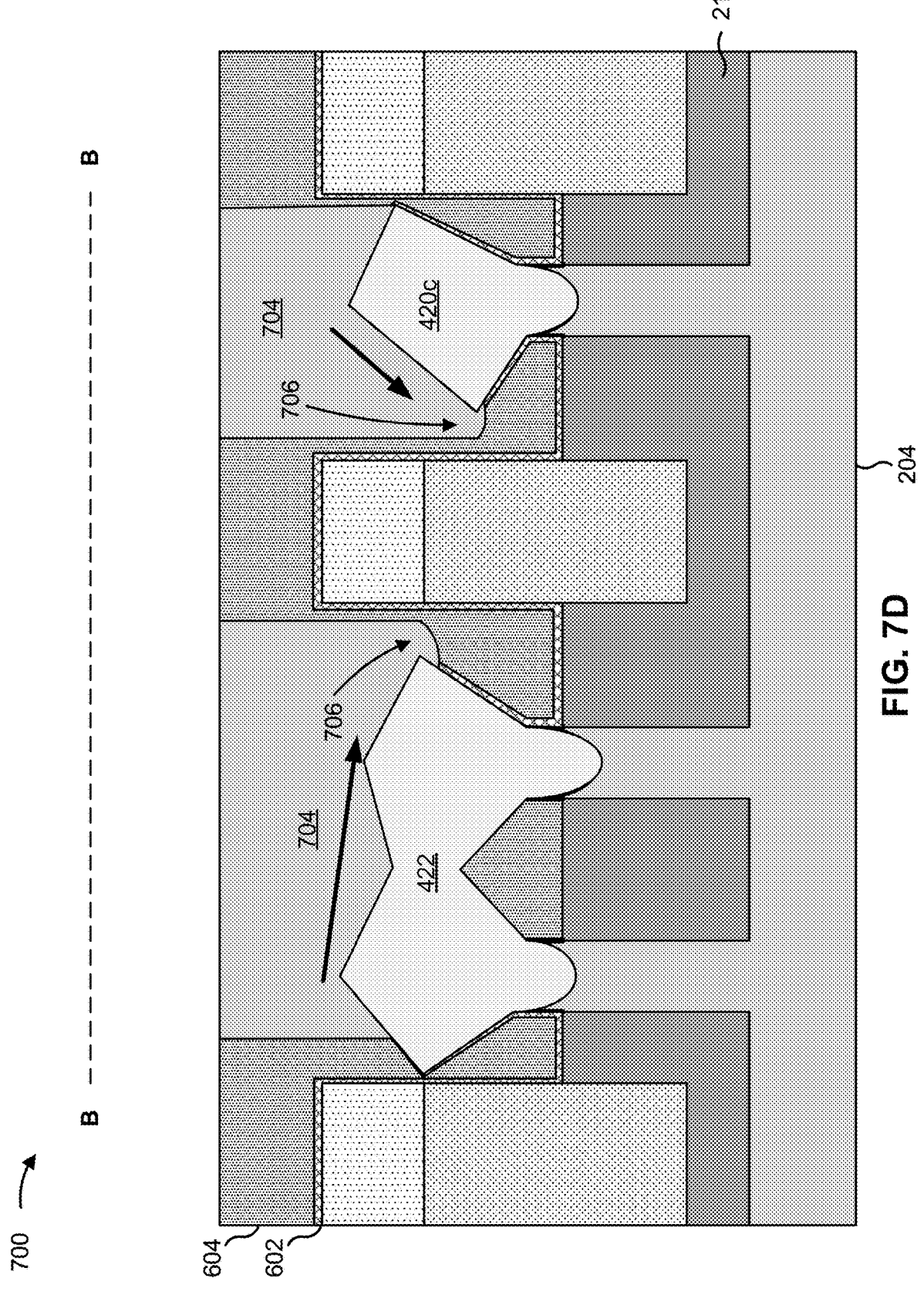

As shown in FIGS. 7C and 7D, conductive structures 704 (e.g., metal source/drain contacts (MDs)) are formed in the openings 702 in the device region 202. In particular, a conductive structure 704 is formed over and/or on the merged epitaxial region 422, and another conductive structure 704 is formed over and/or on the epitaxial region 420c. The deposition tool 102 and/or the plating tool 112 deposits the conductive structures 704 using a CVD technique, a PVD technique, an ALD technique, an electroplating technique, another deposition technique described above in connection with FIG. 1, and/or a deposition technique other than as described above in connection with FIG. 1. The deposition tool 102 and/or the plating tool 112 fills the openings 702 with a conductive material to form the conductive structures 704. The conductive structures 704 include ruthenium (Ru) metal source/drain contacts, tungsten (W) metal source/drain contacts, cobalt (Co) metal source/drain contacts, or metal source/drain contacts formed of another metal.

As further shown in FIG. 7D, the conductive structure 704 is formed on the merged epitaxial region 422 such that the conductive structure 704 laterally extends over the fin structures 206a and 206b, as well as over the epitaxial regions 420a and 420b. Moreover, the slant or tilt of the merged epitaxial region 422 toward the epitaxial region 420c provides an increased landing area on the merged epitaxial region 422 for the conductive structure 704 in that the slant or tilt of the merged epitaxial region 422 enables an overhang region 706 of the conductive structure 704 to be formed along a side of the merged epitaxial region 422 toward the epitaxial region 420c. The overhang region 706 increases the surface area or contact area between the conductive structure 704 and the merged epitaxial region 422, which decreases contact resistance between the conductive structure 704 and the merged epitaxial region 422.

As further shown in FIG. 7D, the slant or tilt of the epitaxial region 420c toward the merged epitaxial region 422 provides an increased landing area on the epitaxial region 420c for the conductive structure 704 on the epitaxial region 420c in that the slant or tilt of the epitaxial region 420c enables an overhang region 706 of the conductive structure 704 to be formed along a side of the epitaxial region 420c toward the merged epitaxial region 422. The overhang region 706 increases the surface area or contact area between the conductive structure 704 and the epitaxial region 420c, which decreases contact resistance between the conductive structure 704 and the epitaxial region 420c.

As indicated above, FIGS. 7A-7D are provided as an example. Other examples may differ from what is described with regard to FIGS. 7A-7D.

Figure 8A:
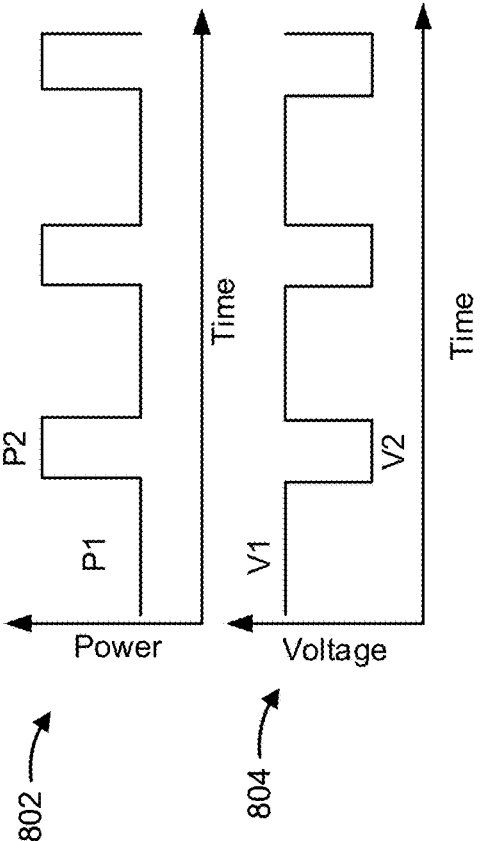
Figures 8B, 8C:
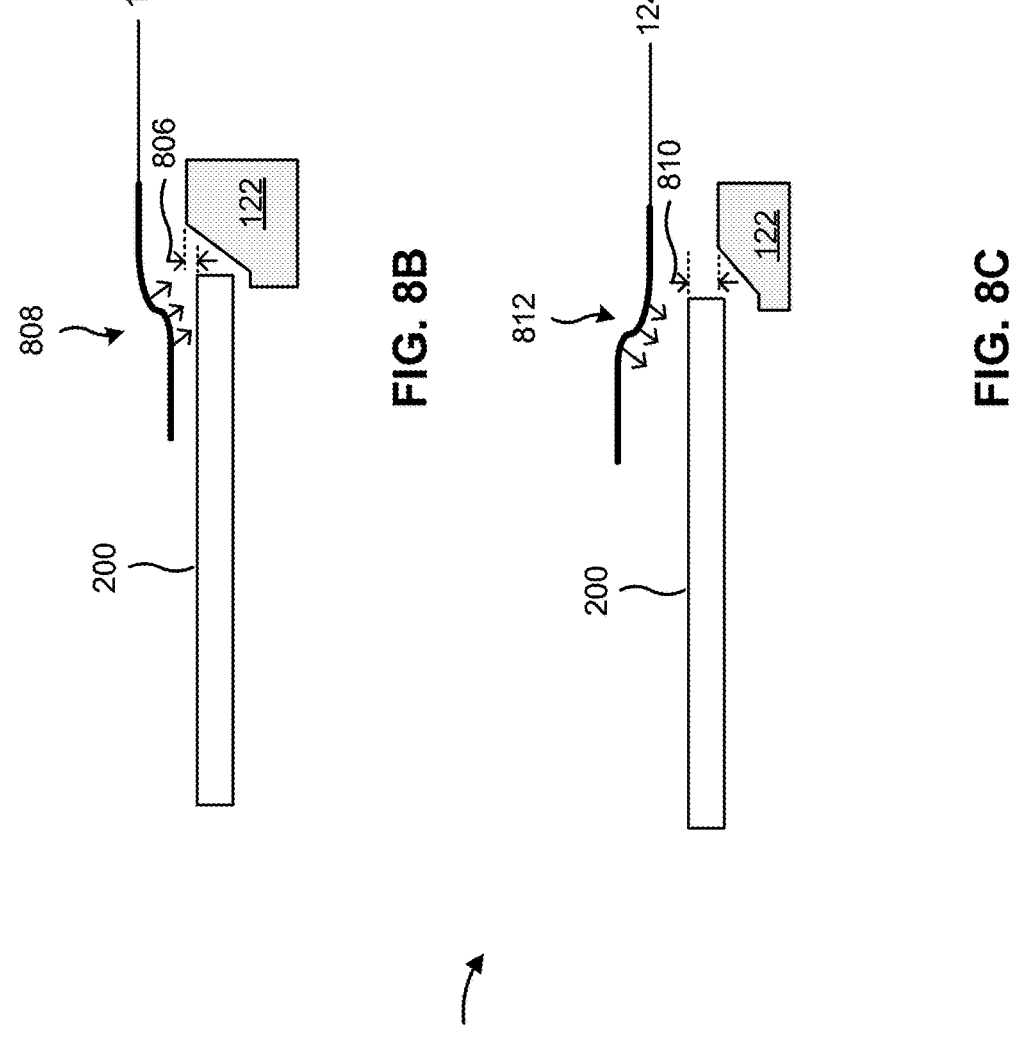

FIGS. 8A-8C are diagrams of example implementations 800 described herein. The example implementations 800 include examples of plasma-based etching techniques that may be used to etch fin structures 206 for forming asymmetric epitaxial regions described herein. The plasma-based etching techniques described in connection with FIGS. 8A-8C may be used in an etch tool 108, such as a plasma-based etch tool 108, along with one or more other etching techniques to etch the fin structures 206 for forming the asymmetric epitaxial regions. Moreover, the plasma-based etching techniques described in connection with FIGS. 8A-8C may be used in connection with the operations described in connection with FIGS. 4E-4G and/or described elsewhere herein.

FIG. 8A illustrates example power settings for a power 802 of a plasma, and example bias voltage settings for a bias voltage 804 that is applied to the chuck 120 of the plasma-based etch tool 108. As shown in FIG. 8A, the magnitude of the power 802 and the magnitude of the bias voltage 804 may be varied or adjusted at one or more times during the time duration of a plasma-based etch operation to etch the fin structures 206.

As shown in FIG. 8A, the power 802 of the plasma that is used in etching the fin structures 206 may be adjusted between a first power setting P1 and a second power setting P2. The power 802 may be adjusted between the first power setting P1 and the second power setting P2 in a periodic manner and/or in an aperiodic manner. In some implementations, the frequency of the adjustments or transitions between the first power setting P1 and the second power setting P2 is based on a radio frequency (RF) pulse duty cycle, which may include a duty cycle range of approximately 10% to approximately 30%, approximately 40% to approximately 60%, or approximately 70% to approximately 90%, among other examples.

As further shown in FIG. 8A, the magnitude of the second power setting P2 is greater relative to the magnitude of the first power setting P1. As an example, the power associated with the first power setting P1 may be in a range of approximately 300 watts to approximately 500 watts, whereas the power associated with the second power setting P2 may be in a range of approximately 1100 watts to approximately 1300 watts. However, other values for the power associated with the first power setting P1, and other values for the power associated with the second power setting P2, are within the scope of the present disclosure.

The power 802 may be adjusted to the second power setting P2 to increase the intensity of the plasma. This increases the quantity and/or rate of ions 410 provided to the semiconductor wafer 200. The power 802 may be adjusted to the first power setting P1 to decrease the intensity of the plasma. This decreases the quantity and/or rate of ions 410 provided to the semiconductor wafer 200.

As further shown in FIG. 8A, the bias voltage 804 that is applied to the chuck 120 in etching the fin structures 206 may be adjusted between a first non-zero bias voltage setting V1 and a second non-zero bias voltage setting V2 (e.g., as opposed to adjusting between an "on" bias voltage, which is a non-zero bias voltage, and an "off" bias voltage, which is a zero bias voltage). The bias voltage 804 may be adjusted between the first non-zero bias voltage setting V1 and the second non-zero bias voltage setting V2 in a periodic manner and/or in an aperiodic manner. In some implementations, the frequency of the adjustments or transitions between the first non-zero bias voltage setting V1 and the second non-zero bias voltage setting V2 is based on a radio frequency (RF) pulse duty cycle, which may include a duty cycle range of approximately 10% to approximately 30%, approximately 40% to approximately 60%, or approximately 70% to approximately 90%, among other examples.

As further shown in FIG. 8A, the magnitude of the first non-zero bias voltage setting V1 is greater relative to the magnitude of the second non-zero bias voltage setting V2. As an example, the voltage associated with the first non-zero bias voltage setting V1 may be in a range of approximately 200 volts to approximately 400 volts, whereas the voltage associated with the second non-zero bias voltage setting V2 may be in a range of approximately 100 volts to approximately 150 volts. However, other values for the voltage associated with the first non-zero voltage setting V1, and other values for the voltage associated with the second non-zero voltage setting V2, are within the scope of the present disclosure.

The bias voltage 804 may be adjusted to the first non-zero bias voltage V1 to increase the directionality of the movement of the ions 410 in the processing chamber 116. In particular, the bias voltage 804 may be adjusted to the first non-zero bias voltage V1 to increase the verticality of the movement of the ions 410 in the processing chamber 116, which results in a more anisotropic movement of the ions 410. This increases the etch rate of the fin structures 206 on the semiconductor wafer 200 and decreases polymerization of the ions 410 (and thus, passivation) on the sidewalls of the portions 408a and 408b of the photoresist layer. The bias voltage 804 may be adjusted to the second non-zero bias voltage V2 to decrease the directionality of the movement of the ions 410 in the processing chamber 116. In particular, the bias voltage 804 may be adjusted to the second non-zero bias voltage V2 to increase the isotropic movement of the ions 410 in the processing chamber 116. This decreases the etch rate of the fin structures 206 on the semiconductor wafer 200 and increases the polymerization of the ions 410 (and thus, passivation) on the sidewalls of the portions 408a and 408b of the photoresist layer.

While providing the plasma to the semiconductor wafer 200, the plasma-based etch tool 108 may alternate or transition between two or more combinations settings in the plasma-based etch operation to etch the fin structures 206. The two or more combinations may include, for example, a first combination including the first power setting P1 and the first non-zero bias voltage V1, and a second combination including the second power setting P2 and the second non-zero bias voltage V2. In some implementations, the time durations (or pulses) for which the first combination is used may be greater relative to the time durations (or pulses) for which the second combination is used, which may provide an increased etch rate and a reduced passivation. In some implementations, the time durations (or pulses) for which the second combination is used may be greater relative to the time durations (or pulses) for which the first combination is used, which may provide a reduced etch rate and an increased passivation. In some implementations, the time durations (or pulses) for which the second combination is used and the time durations (or pulses) for which the first combination is used may be approximately equal time durations.

Alternating between the first combination (including the first power setting P1 and the first non-zero bias voltage V1) and the second combination (including the second power setting P2 and the second non-zero bias voltage V2) results in uneven etching of the fin structures 206, which in turn results in the fin sidewalls spacers for one or more of the fin structures 206 having different heights. For example, alternating between the first combination and the second combination may result the difference (e.g., the example dimension 416) between the height of the fin sidewall spacer 406a and the height of the fin sidewall spacer 406b (e.g., may result in the height of the fin sidewall spacer 406a being greater relative to the height of the fin sidewall spacer 406b). As another example, alternating between the first combination and the second combination may result the difference (e.g., the example dimension 418) between the height of the fin sidewall spacer 406e and the height of the fin sidewall spacer 406f (e.g., may result in the height of the fin sidewall spacer 406f being greater relative to the height of the fin sidewall spacer 406e).

In particular, the second combination may increase passivation on the sidewall of the portion 408a of the photoresist layer. The passivation may decrease the etch rate of the ions 410 for the fin sidewall spacer 406a near the sidewall of the portion 408*a* of the photoresist layer relative to the etch rate of the ions 410 for the fin sidewall spacer 406*b*. The first combination may increase the directionality of the ions 410, which decreases the etch uniformity and ion coverage. The combination of the reduced etch rate due to the passivation, and the increased directionality of the ions 410, results in the fin sidewall spacer 406*b* being etched faster than the fin sidewall spacer 406*a*. This results in the height of the fin sidewall spacer 406*a* being greater relative to the height of the fin sidewall spacer 406*b*.

Similarly, the second combination may increase passivation on the sidewall of the portion 408*b* of the photoresist layer. The passivation may decrease the etch rate of the ions 410 for the fin sidewall spacer 406*f* near the sidewall of the portion 408*b* of the photoresist layer relative to the etch rate of the ions 410 for the fin sidewall spacer 406*e*. The first combination may increase the directionality of the ions 410, which decreases the etch uniformity and ion coverage. The combination of the reduced etch rate due to the passivation, and the increased directionality of the ions 410, results in the fin sidewall spacer 406*e* being etched faster than the fin sidewall spacer 406*f*. This results in the height of the fin sidewall spacer 406*f* being greater relative to the height of the fin sidewall spacer 406*e*.

FIGS. 8B and 8C illustrate example height settings for the focus ring 122 of the plasma-based etch tool 108. As shown in FIGS. 8B and 8C, the directionality or angle of the plasma that is used to etch the fin structures 206 may be adjusted by adjusting the height of the focus ring 122 relative to the top surface of the semiconductor wafer 200. This, alone or in combination with the combinations of settings of the plasma described above in FIG. 8A and/or other techniques, may be used to control the etch direction of the fin structures 206 to form sidewall spacers on the fin structures 206 that have different heights (e.g., uneven sidewall spacers).

As shown in FIG. 8B, the height of the top surface of the focus ring 122 may be greater relative to the height of the top surface of the semiconductor wafer 200. The height of the top surface of the focus ring 122 may be greater relative to the height of the top surface of the semiconductor wafer 200 by a distance 806. This may cause the plasma to be provided at an angle 808 (e.g., an outward angle) to the semiconductor wafer 200. The distance 806 may be increased to increase the outward direction of the plasma, whereas the distance 806 may be decreased to decrease the outward direction of the plasma. Moreover, the angle of the plasma may be greater at or near the edge of the semiconductor wafer 200, and may be lesser at or near the center of the semiconductor wafer 200 due to the flow path 132 of the plasma from the inlet port 126 over the center of the semiconductor wafer 200 to around the edge of the semiconductor wafer 200 (e.g., inward to outward flow path).

As shown in FIG. 8C, the height of the top surface of the focus ring 122 may be lesser relative to the height of the top surface of the semiconductor wafer 200. The height of the top surface of the focus ring 122 may be lesser relative to the height of the top surface of the semiconductor wafer 200 by a distance 810. This may cause the plasma to be provided at an angle 812 (e.g., an inward angle) to the semiconductor wafer 200. The distance 810 may be increased to increase the inward direction of the plasma, whereas the distance 810 may be decreased to decrease the inward direction of the plasma.

As indicated above, FIGS. 8A-8C are provided as examples. Other examples may differ from what is described with regard to FIGS. 8A-8C.

Figure 9:
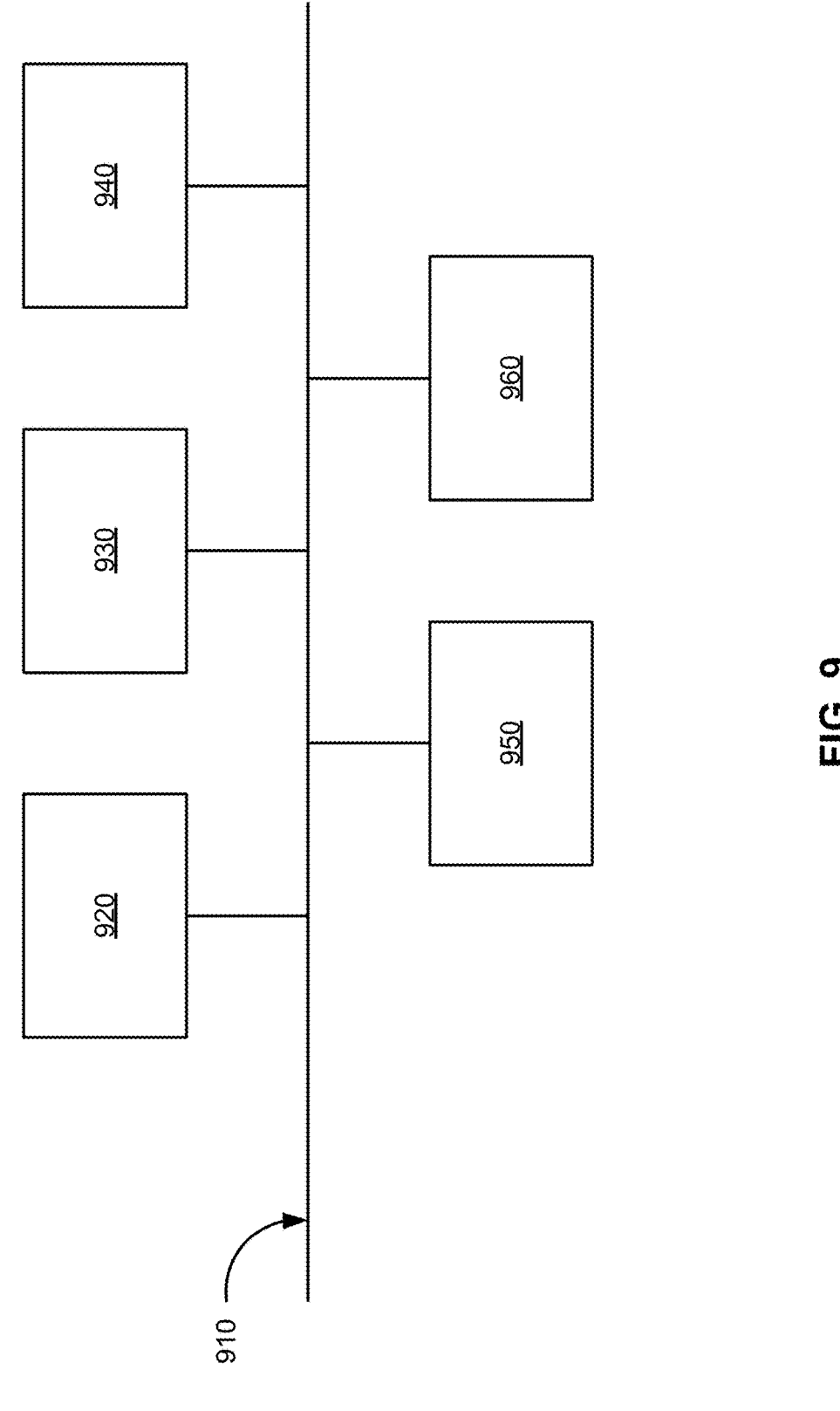
FIG. 9 is a diagram of example components of one or more devices of FIG. 1 described herein.

FIG. 9 is a diagram of example components of a device 900. In some implementations, one or more of the semiconductor processing tools 102-112 and/or the wafer/die transport tool 114 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry may be used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
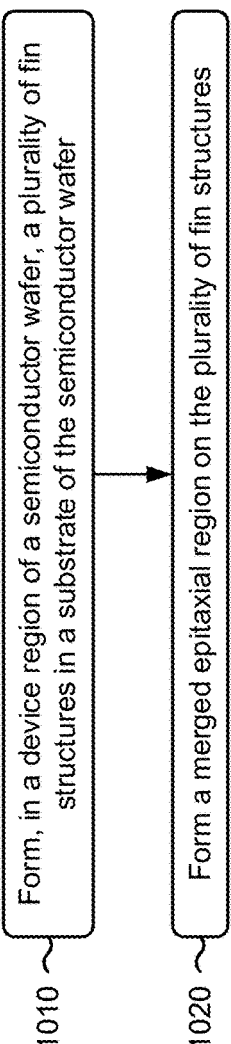

FIG. 10 is a flowchart of an example process 1000 associated with forming a semiconductor device described herein. In some implementations, one or more process blocks of FIG. 10 may be performed by one or more semiconductor processing tools (e.g., one or more of the semiconductor processing tools 102-112). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming, in a device region of a semiconductor wafer, a plurality of fin structures in a substrate of the semiconductor wafer (block 1010). For example, one or more of the semiconductor processing tools 102-112 may form, in a device region (e.g., the device region 202, the device region 500) of the semiconductor wafer 200, a plurality of fin structures (e.g., the fin structures 206a and 206b) in the substrate 204 of the semiconductor wafer 200, as described herein.

As further shown in FIG. 10, process 1000 may include forming a merged epitaxial region on the plurality of fin structures (block 1020). For example, one or more of the semiconductor processing tools 102-112 may form the merged epitaxial region 422 on the plurality of fin structures, as described herein. In some implementations, the merged epitaxial region 422 includes a first epitaxial region (e.g., the epitaxial region 420a) and a second epitaxial region (e.g., the epitaxial region 420b) that are connected in at least a portion of the first epitaxial region and in at least a portion of the second epitaxial region. In some implementations, the first epitaxial region is located closer to an outer edge of the semiconductor wafer 200 relative to the second epitaxial region. In some implementations, a height of a top surface of the first epitaxial region is greater relative to a height of a top surface of the second epitaxial region.

Process 1000 may include additional implementations, such as any single implementation or any combination of implementations described below and/or in connection with one or more other processes described elsewhere herein.

In a first implementation, process 1000 includes forming, in the device region of the semiconductor wafer, a second fin structure in the substrate, and forming a third epitaxial region on the second fin structure, where the third epitaxial region comprises a single epitaxial region, where the third epitaxial region is located closer to a center of the semiconductor wafer relative to the merged epitaxial region, where a first end of the third epitaxial region is lower relative to a second end of the third epitaxial region, and the first end is located closer to the merged epitaxial region relative to the second end. In a second implementation, alone or in combination with the first implementation, forming a hybrid fin structure 208 between the plurality of fin structures and the second fin structure, where the first end of the third epitaxial region is located closer to the hybrid fin structure 208 relative to the second end of the third epitaxial region. In a third implementation, alone or in combination with the first or second implementation, forming the third epitaxial region includes forming the third epitaxial region such that a height of a top surface of the third epitaxial region is greater relative to a height of a top surface of the hybrid fin structure 208. In a fourth implementation, alone or in combination with one or more of the first through third implementations, forming the merged epitaxial region 422 includes forming the merged epitaxial region 422 such that the height of a top surface of the first epitaxial region is greater relative to a height of a top surface of the hybrid fin structure 208, and the height of a top surface of the second epitaxial region is lesser relative to the height of the top surface of the hybrid fin structure 208.

In a fifth implementation, alone or in combination with one or more of the first through fourth implementations, forming the third epitaxial region includes forming the third epitaxial region such that a height of a top surface of the third epitaxial region is greater relative to the height of the top surface of the first epitaxial region. In a sixth implementation, alone or in combination with one or more of the first through fifth implementations, process 1000 includes forming an opening 702 in a dielectric layer (e.g., the ILD layer 604) to the merged epitaxial region 422, and forming a conductive structure 704 on the merged epitaxial region 422 in the opening 702, the conductive structure 704 includes an overhang region 706 on a side of the merged epitaxial region 422 toward the third epitaxial region.

In a seventh implementation, alone or in combination with one or more of the first through sixth implementations, forming the conductive structure 704 includes forming the conductive structure 704 such that the conductive structure laterally extends over the plurality of first fin structures. In an eighth implementation, alone or in combination with one or more of the first through seventh implementations, the hybrid fin structure 208 includes a first hybrid fin structure 208a, and the process 1000 includes forming a second hybrid fin structure 208b adjacent to an opposing side of the plurality of first fin structures 206a and 206b relative to the first hybrid fin structure 208a and forming a third hybrid fin structure 208c adjacent to an opposing side of the second fin structure 206c relative to the first hybrid fin structure 208a, where a height of the second hybrid fin structure 208b and the third hybrid fin structure 208c is greater relative to a height of the first hybrid fin structure 208a.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

FIG. 11 is a flowchart of an example process 1100 associated with forming a semiconductor device described herein. In some implementations, one or more process blocks of FIG. 11 may be performed by one or more semiconductor processing tools (e.g., one or more of the semiconductor processing tools 102-112). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include forming, in a device region of a semiconductor wafer, a plurality of fin structures in a substrate of the semiconductor wafer (block 1110). For example, one or more of the semiconductor processing tools 102-112 may form, in a device region (e.g., the device region 202, the device region 500) of the semiconductor wafer 200, a plurality of fin structures 206 in the substrate 204 of the semiconductor wafer 200, as described herein. In some implementations, the plurality of fin structures 206 include the first fin structure 206a, and the second fin structure 206b that is located adjacent to the first fin structure 206a and located closer to a center of the semiconductor wafer 200 relative to the first fin structure 206a.

As further shown in FIG. 11, process 1100 may include forming a spacer layer on tops and sidewalls of the plurality of fin structures (block 1120). For example, one or more of the semiconductor processing tools 102-112 may form the spacer layer 406 on tops and sidewalls of the plurality of fin structures, as described herein.

As further shown in FIG. 11, process 1100 may include etching the plurality of fin structures (block 1130). For example, one or more of the semiconductor processing tools 102-112 may etch the plurality of fin structures 206, as described herein. In some implementations, etching the plurality of fin structures 206 results in formation of a first fin sidewall spacer (e.g., the fin sidewall spacer 406a) and a second fin sidewall spacer (e.g., the fin sidewall spacer 406b) on opposing sides of the first fin structure 206a.

As further shown in FIG. 11, process 1100 may include forming, after etching the plurality of fin structures, a merged source/drain region on the first fin structure and the second fin structure (block 1140). For example, one or more of the semiconductor processing tools 102-112 may form, after etching the plurality of fin structures 206, a merged source/drain region (e.g., the merged epitaxial region 422) on the first fin structure 206a and on the second fin structure 206b, as described herein. In some implementations, the merged source/drain region is tilted toward the center of the semiconductor wafer as a result of a height of the first fin sidewall spacer being greater relative to a height of the second fin sidewall spacer.

Process 1100 may include additional implementations, such as any single implementation or any combination of implementations described below and/or in connection with one or more other processes described elsewhere herein.

In a first implementation, the plurality of fin structures includes the third fin structure 206c that is located closer to the center of the semiconductor wafer 200 relative to the second fin structure 206b, etching the plurality of fin structures results in formation of a third fin sidewall spacer (e.g., the fin sidewall spacer 406e) and a fourth fin sidewall spacer (e.g., the fin sidewall spacer 406f) on opposing sides of the third fin structure 206c, and the non-merged source/drain region is tilted toward the merged source/drain region as a result of a height of the fourth fin sidewall spacer being greater relative to a height of the third fin sidewall spacer. In a second implementation, alone or in combination with the first implementation, a difference (e.g., the example dimension 416) between the height of the first fin sidewall spacer and the height of the second fin sidewall spacer is in a range of approximately 2 nanometers to approximately 5 nanometers. In a third implementation, alone or in combination with the first and/or second implementation, etching the plurality of fin structures 206 includes providing a plasma in the processing chamber 116 of an etch tool 108 (e.g., a plasma-based etch tool 108), alternating, while providing the plasma to the semiconductor wafer 200 in the processing chamber 116, between a first power setting P1 for the plasma and a second power setting P2 for the plasma, and alternating, while providing the plasma to the semiconductor wafer 200 in the processing chamber 116, between providing a first non-zero bias voltage V1 to the chuck 120 in the processing chamber 116 on which the semiconductor wafer 200 is positioned and providing a second non-zero bias voltage V2 to the chuck 120, where alternating between the first power setting P1 and the second power setting P1 and alternating between providing the first non-zero bias voltage V1 and the second non-zero bias voltage V2 result in the height of the first fin sidewall spacer being greater relative to the height of the second fin sidewall spacer, and result in the height of the fourth fin sidewall spacer being greater relative to the height of the third fin sidewall spacer.

In a fourth implementation, alone or in combination with one or more of the first through third implementations, etching the plurality of fin structures 206 includes providing a plasma in the processing chamber 116 of an etch tool 108 (e.g., a plasma-based etch tool 108), and alternating, while providing the plasma to the semiconductor wafer 200 in the processing chamber 116, between a first combination including a first power setting P1 for the plasma and a first non-zero bias voltage V1 for the chuck 120 in the processing chamber 116, and a second combination including a second power setting P2 for the plasma and a second non-zero bias voltage V2 for the chuck 120. In a fifth implementation, alone or in combination with one or more of the first through fourth implementations, the first power setting P1 is greater relative to the second power setting P2, and the second non-zero bias voltage V2 is greater relative to the first non-zero bias voltage V1.

In a sixth implementation, alone or in combination with one or more of the first through fifth implementations, etching the plurality of fin structures 206 includes providing a plasma in the processing chamber 116 of an etch tool 108 (e.g., a plasma-based etch tool 108), and adjusting a height of the focus ring 122, that surrounds the semiconductor wafer 200 in the processing chamber 116, relative to the semiconductor wafer 200 to cause the plasma to etch the plurality of fins 206 such that the height of the first fin sidewall spacer is greater relative to the height of the second fin sidewall spacer, and such that the height of the fourth fin sidewall spacer is greater relative to the height of the third fin sidewall spacer. In a seventh implementation, alone or in combination with one or more of the first through sixth implementations, adjusting the height of the focus ring 122 includes adjusting the height of the focus ring 122 such that ions 410 in a plasma sheath (e.g., the sheath 124), above the semiconductor wafer 200, bombard the semiconductor wafer 200 at a particular angle (e.g., the angle 808, the angle 812) to etch the plurality of fins 206 such that the height of the first fin sidewall spacer is greater relative to the height of the second fin sidewall spacer, and such that the height of the fourth fin sidewall spacer is greater relative to the height of the third fin sidewall spacer.

In an eight implementation, alone or in combination with one or more of the first through seventh implementations, etching the plurality of fin structures 206 includes forming a first portion 408a of a photoresist layer adjacent to the merged source/drain region between the merged source/drain region and an edge of the semiconductor wafer 200, forming a second portion 408b of the photoresist layer adjacent to the non-merged source/drain region between the non-merged source/drain region and the center of the semiconductor wafer 200, and etching the plurality of fin structures 206 between the first portion 408a of the photoresist layer and the second portion 408b of the photoresist layer.

In a ninth implementation, alone or in combination with one or more of the first through eighth implementations, etching the plurality of fin structures 206 between the first portion 408a of the photoresist layer and the second portion 408b of the photoresist layer includes etching the plurality of fin structures 206 using a plasma, where ions 410 in the plasma passivate the first portion 408a of the photoresist layer, which results in an etch rate for the first fin sidewall spacer that is lesser relative to an etch rate for the second fin sidewall spacer, which results in the height of the first fin sidewall spacer being greater relative to the height of the second fin sidewall spacer, and where the ions 410 in the plasma passivate the second portion 408b of the photoresist layer, which results in an etch rate for the fourth fin sidewall spacer that is lesser relative to an etch rate for the third fin sidewalls spacer, which results in the height of the fourth fin sidewall spacer being greater relative to the height of the third fin sidewall spacer.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
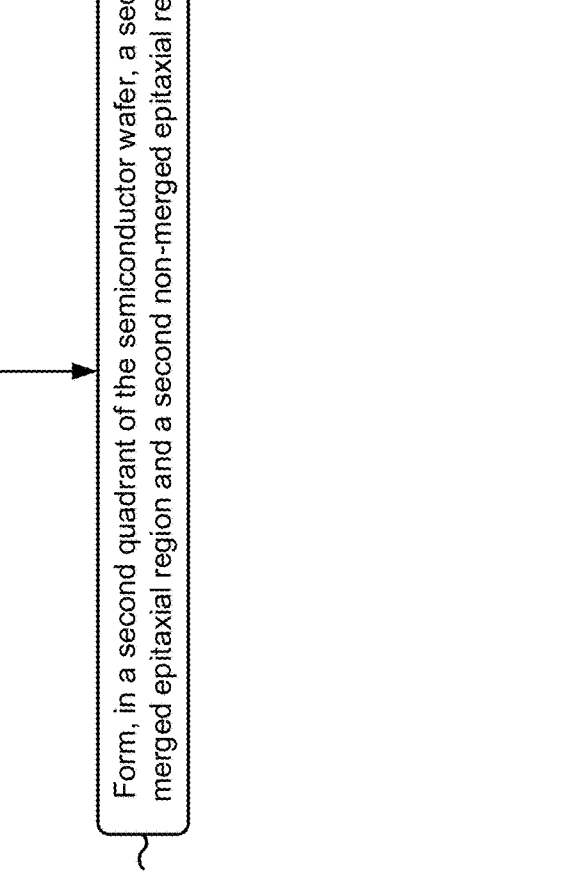

FIG. 12 is a flowchart of an example process 1200 associated with forming a semiconductor device described herein. In some implementations, one or more process blocks of FIG. 12 may be performed by one or more semiconductor processing tools (e.g., one or more of the semiconductor processing tools 102-112). Additionally, or alternatively, one or more process blocks of FIG. 12 may be performed by one or more components of device 900, such as processor 920, memory 930, input component 940, output component 950, and/or communication component 960.

As shown in FIG. 12, process 1200 may include forming, in a first quadrant of a semiconductor wafer, a first merged epitaxial region and a first non-merged epitaxial region (block 1210). For example, one or more of the semiconductor processing tools 102-112 may form, in a first quadrant (e.g., the quadrant 200a) of the semiconductor wafer 200, a first merged epitaxial region 422 and a first non-merged epitaxial region (e.g., a first epitaxial region 420c), as described herein. In some implementations, the first merged epitaxial region 422 is formed closer to an edge of the semiconductor wafer 200 in the first quadrant relative to the first non-merged epitaxial region. In some implementations, the first merged epitaxial region 422 is tilted toward the first non-merged epitaxial region and toward a center of the semiconductor wafer 200. In some implementations, the first non-merged epitaxial region is tilted toward the first merged epitaxial region 422 and toward the edge of the semiconductor wafer 200.

As further shown in FIG. 12, process 1200 may include forming, in a second quadrant of the semiconductor wafer, a second merged epitaxial region and a second non-merged epitaxial region (block 1220). For example, one or more of the semiconductor processing tools 102-112 may form, in a second quadrant (e.g., the quadrant 200d) of the semiconductor wafer 200, a second merged epitaxial region 422 and a second non-merged epitaxial region (e.g., a second epitaxial region 420c), as described herein. In some implementations, the second quadrant is a diagonally opposing quadrant from the first quadrant. In some implementations, the second merged epitaxial region 422 is formed closer to the edge of the semiconductor wafer 200 in the second quadrant relative to the second non-merged epitaxial region. In some implementations, the second merged epitaxial region 422 is tilted toward the second non-merged epitaxial region and toward the center of the semiconductor wafer 200. In some implementations, the second non-merged epitaxial region is tilted toward the second merged epitaxial region 422 and toward the edge of the semiconductor wafer 200.

Process 1200 may include additional implementations, such as any single implementation or any combination of implementations described below and/or in connection with one or more other processes described elsewhere herein.

In a first implementation, the first non-merged epitaxial region (e.g., the first epitaxial region 420c) is tilted away from the second non-merged epitaxial region (e.g., the second epitaxial region 420c), and the second non-merged epitaxial region is tilted away from the first non-merged epitaxial region. In a second implementation, alone or in combination with the first implementation, the first merged epitaxial region 422 is tilted toward the second merged epitaxial region 422, and the second non-merged epitaxial region 422 is tilted toward the first merged epitaxial region 422.

In a third implementation, alone or in combination with one or more of the first and second implementations, the first merged epitaxial region 422 and the first non-merged epitaxial region (e.g., the first epitaxial region 420c) are included in a first ring oscillator device (e.g., in the device region 202) in the first quadrant (e.g., the quadrant 200a) of the semiconductor wafer 200, and the second merged epitaxial region 422 and the second non-merged epitaxial region (e.g., the second epitaxial region 420c) are included in a second ring oscillator device (e.g., in the device region 500) in the second quadrant (e.g., the quadrant 200d) of the semiconductor wafer 200.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

In this way, epitaxial regions may be formed in specific locations on a semiconductor wafer with specific asymmetric properties such as slope or tilt direction, slope or tilt angle, and/or other asymmetric properties. The asymmetric epitaxial regions may be formed using various plasma-based fin structure etching techniques described herein. The specific asymmetric properties may increase metal landing coverage areas in particular locations on the semiconductor wafer (e.g., that are optimized for particular locations on the semiconductor substrate) to reduce the contact resistance between the epitaxial regions and associated conductive structures that are formed to the epitaxial regions. This increases semiconductor device performance, decreases the rate and/or likelihood of defect formation, and/or increases semiconductor device yield, among other examples.

As described in greater detail above, some implementations described herein provide a method. The method includes forming, in a device region of a semiconductor wafer, a plurality of first fin structures in a substrate of the semiconductor wafer. The method includes forming, in the device region of the semiconductor wafer, a second fin structure in the substrate. The method includes forming a merged epitaxial region on the first plurality of fin structures, where the merged epitaxial region comprises a first epitaxial region and a second epitaxial region that are connected in at least a portion of the first epitaxial region and in at least a portion of the second epitaxial region, where the first epitaxial region is located closer to an outer edge of the semiconductor wafer relative to the second epitaxial region, and where a height of a top surface of the first epitaxial region is greater relative to a height of a top surface of the second epitaxial region. The method includes forming a third epitaxial region on the second fin structure, where the third epitaxial region comprises a single epitaxial region, where the third epitaxial region is located closer to a center of the semiconductor wafer relative to the merged epitaxial region, where a first end of the third epitaxial region is lower relative to a second end of the third epitaxial region, and where the first end is located closer to the merged epitaxial region relative to the second end.

As described in greater detail above, some implementations described herein provide a method. The method includes forming, in a device region of a semiconductor wafer, a plurality of fin structures in a substrate of the semiconductor wafer, where the plurality of fin structures comprises: a first fin structure, a second fin structure that is located adjacent to the first fin structure and located closer to a center of the semiconductor wafer relative to the first fin structure, and a third fin structure that is located closer to the center of the semiconductor wafer relative to the second fin structure. The method includes forming a spacer layer on tops and sidewalls of the plurality of fin structures. The method includes etching the plurality of fin structures, where etching the plurality of fin structures results in formation of a first fin sidewall spacer and a second fin sidewall spacer on opposing sides of the first fin structure, and a third fin sidewall spacer and a fourth fin sidewall spacer on opposing sides of the third fin structure. The method includes forming, after etching the plurality of fin structures, a merged source/drain region on the first fin structure and the second fin structure. The method includes forming a non-merged source/drain region on the third fin structure, where the merged source/drain region is tilted toward the non-merged source/drain region as a result of a height of the first fin sidewall spacer being greater relative to a height of the second fin sidewall spacer, and where the non-merged source/drain region is tilted toward the merged source/drain region as a result of a height of the fourth fin sidewall spacer being greater relative to a height of the third fin sidewall spacer.

As described in greater detail above, some implementations described herein provide a method. The method includes forming, in a first quadrant of a semiconductor wafer, a first merged epitaxial region a first non-merged epitaxial region, where the first merged epitaxial region is formed closer to an edge of the semiconductor wafer in the first quadrant relative to the first non-merged epitaxial region, where the first merged epitaxial region is tilted toward the first non-merged epitaxial region and toward a center of the semiconductor wafer, and where the first non-merged epitaxial region is tilted toward the first merged epitaxial region and toward the edge of the semiconductor wafer. The method includes forming, in a second quadrant of the semiconductor wafer, a second merged epitaxial region a second non-merged epitaxial region, where the second quadrant is a diagonally opposing quadrant from the first quadrant, where the second merged epitaxial region is formed closer to the edge of the semiconductor wafer in the second quadrant relative to the second non-merged epitaxial region, where the second merged epitaxial region is tilted toward the second non-merged epitaxial region and toward the center of the semiconductor wafer, and where the second non-merged epitaxial region is tilted toward the second merged epitaxial region and toward the edge of the semiconductor wafer.

As described in greater detail above, some implementations described herein provide a semiconductor device. The semiconductor device includes a merged epitaxial region and a non-merged epitaxial region. The merged epitaxial region is tilted toward the non-merged epitaxial region. The non-merged epitaxial region is tilted toward the merged epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, in a device region of a semiconductor wafer, a plurality of fin structures in a substrate of the semiconductor wafer;
   forming a merged epitaxial region on concave recesses in the plurality of fin structures,
   wherein the merged epitaxial region comprises a first epitaxial region and a second epitaxial region that are connected at a junction of the first epitaxial region and in at least a portion of the second epitaxial region, the junction being a distance away from the concave recesses in the plurality of fin structures;
   forming, in the device region of the semiconductor wafer, a second fin structure, different from the plurality of fin structures, in the substrate; and
   forming a hybrid fin structure between the plurality of fin structures and the second fin structure,
   wherein:
       a height of a top surface of the first epitaxial region is greater relative to a height of a top surface of the hybrid fin structure, and
       a height of a top surface of the second epitaxial region is lesser relative to the height of the top surface of the hybrid fin structure.

2. The method of claim 1, further comprising:
   forming a third epitaxial region on the second fin structure,
   wherein the third epitaxial region comprises a single epitaxial region,
   wherein the third epitaxial region is located closer to a center of the semiconductor wafer relative to the merged epitaxial region,
   wherein a first end of the third epitaxial region is lower relative to a second end of the third epitaxial region, and
   wherein the first end is located closer to the merged epitaxial region relative to the second end.

3. The method of claim 2,
   wherein the first end of the third epitaxial region is located closer to the hybrid fin structure relative to the second end of the third epitaxial region.

4. The method of claim 2, further comprising:
   forming an opening in a dielectric layer to the merged epitaxial region; and
   forming a conductive structure on the merged epitaxial region in the opening,
   wherein the conductive structure comprises an overhang region on a side of the merged epitaxial region toward the third epitaxial region.

5. The method of claim 4,
wherein forming the conductive structure comprises:
    forming the conductive structure such that the conductive structure laterally extends over the plurality of fin structures.

6. The method of claim 2, wherein a width of the merged epitaxial region is greater than a width of the third epitaxial region.

7. The method of claim 1,
wherein the hybrid fin structure comprises a first hybrid fin structure; and
    wherein the method further comprises:
        forming a second hybrid fin structure adjacent to an opposing side of the plurality of fin structures relative to the first hybrid fin structure; and
        forming a third hybrid fin structure adjacent to an opposing side of the second fin structure relative to the first hybrid fin structure,
            wherein a height of the second hybrid fin structure and the third hybrid fin structure is greater relative to a height of the first hybrid fin structure.

8. A method, comprising:
forming, in a device region of a semiconductor wafer, a plurality of fin structures in a substrate of the semiconductor wafer;
forming a merged epitaxial region on a first concave recess, in a first fin structure of the plurality of fin structures, and a second concave recess, in a second fin structure of the plurality of fin structures,
    wherein a depth of the first concave recess in the first fin structure is different from a depth of the second concave recess in the second fin structure, and
    wherein the merged epitaxial region comprises a first epitaxial region and a second epitaxial region that are connected in at least a portion of the first epitaxial region and in at least a portion of the second epitaxial region; and
forming a third epitaxial region on a third fin structure of the plurality of fin structures,
    wherein a height of a top surface of the first epitaxial region or the second epitaxial region is different than a height of a top surface of the third epitaxial region.

9. The method of claim 8,
wherein the third epitaxial region comprises a single epitaxial region.

10. The method of claim 8,
wherein the third epitaxial region is located closer to a center of the semiconductor wafer relative to the merged epitaxial region.

11. The method of claim 8,
wherein a width of the merged epitaxial region is greater than a width of the third epitaxial region.

12. The method of claim 8,
wherein a first end of the third epitaxial region is lower relative to a second end of the third epitaxial region.

13. The method of claim 8, further comprising:
forming a first hybrid fin structure adjacent to the second epitaxial region and between the merged epitaxial region and the third epitaxial region.

14. The method of claim 13, further comprising:
forming a second hybrid fin structure adjacent to the first epitaxial region; and forming a third hybrid fin structure adjacent to the third epitaxial region.

15. A method, comprising:
forming, in a device region of a semiconductor wafer, a plurality of fin structures in a substrate of the semiconductor wafer;
forming a plurality of sidewall spacers on the plurality of fin structures,
    wherein the plurality of sidewall spacers comprises a first sidewall spacer and a second sidewall spacer that are on opposing sides of a first fin structure or a second fin structure and that have different heights; and
forming a merged epitaxial region on a first concave recess, in the first fin structure, and on a second concave recess, in the second fin structure,
    wherein a depth of the first concave recess in the first fin structure is different from a depth of the second concave recess in the second fin structure, and
    wherein the merged epitaxial region comprises a first epitaxial region and a second epitaxial region that are connected in at least a portion of the first epitaxial region and in at least a portion of the second epitaxial region.

16. The method of claim 15, further comprising:
forming a third epitaxial region on a third fin structure of the plurality of fin structures,
    wherein the merged epitaxial region has an asymmetric shape that is different from an asymmetric shape of the third epitaxial region.

17. The method of claim 16,
wherein the third epitaxial region comprises a single epitaxial region and is located closer to a center of the semiconductor wafer relative to the merged epitaxial region, wherein a first end of the third epitaxial region is lower relative to a second end of the third epitaxial region, wherein the first end is located closer to the merged epitaxial region relative to the second end.

18. The method of claim 15, further comprising:
forming a hybrid fin structure between the plurality of fin structures and the second fin structure.

19. The method of claim 18,
wherein the hybrid fin structure comprises a first hybrid fin structure; and
    wherein the method further comprises:
        forming a second hybrid fin structure adjacent to an opposing side of the plurality of fin structures relative to the first hybrid fin structure; and
        forming a third hybrid fin structure adjacent to an opposing side of the second fin structure relative to the first hybrid fin structure,
            wherein a height of the second hybrid fin structure and the third hybrid fin structure is greater relative to a height of the first fin structure.

20. The method of claim 19,
wherein forming the merged epitaxial region comprises:
    forming the merged epitaxial region such that:
        the height of a top surface of the first epitaxial region is greater relative to a height of a top surface of the hybrid fin structure, and
        the height of a top surface of the second epitaxial region is lesser relative to the height of the top surface of the hybrid fin structure.

* * * * *